(12) United States Patent
Lee et al.

(10) Patent No.: US 9,748,257 B2
(45) Date of Patent: Aug. 29, 2017

(54) SEMICONDUCTOR DEVICES HAVING DUMMY PATTERNS AND METHODS OF FABRICATING THE SAME

(71) Applicants: Jaehan Lee, Seoul (KR); Won-Seok Jung, Anyang-si (KR); Kyungjoong Joo, Suwon-si (KR)

(72) Inventors: Jaehan Lee, Seoul (KR); Won-Seok Jung, Anyang-si (KR); Kyungjoong Joo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/962,237

(22) Filed: Dec. 8, 2015

(65) Prior Publication Data

US 2016/0163686 A1 Jun. 9, 2016

(30) Foreign Application Priority Data

Dec. 8, 2014 (KR) ........................ 10-2014-0175184

(51) Int. Cl.

| | | |
|---|---|---|
| *H01L 27/115* | (2017.01) | |
| *H01L 27/11565* | (2017.01) | |
| *H01L 27/11524* | (2017.01) | |
| *H01L 27/11512* | (2017.01) | |
| *H01L 27/11556* | (2017.01) | |
| *H01L 27/1157* | (2017.01) | |
| *H01L 27/11573* | (2017.01) | |
| *H01L 27/11575* | (2017.01) | |
| *H01L 27/11582* | (2017.01) | |

(52) U.S. Cl.
CPC .... *H01L 27/11565* (2013.01); *H01L 27/1157* (2013.01); *H01L 27/11512* (2013.01); *H01L 27/11524* (2013.01); *H01L 27/11556* (2013.01); *H01L 27/11573* (2013.01); *H01L 27/11575* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 8,013,383 B2 | 9/2011 | Kidoh et al. | |
| 8,048,798 B2 | 11/2011 | Kidoh et al. | |
| 8,148,216 B2 | 4/2012 | Arai et al. | |
| 8,188,530 B2 | 5/2012 | Tanaka et al. | |
| 8,278,695 B2 | 10/2012 | Kidoh et al. | |
| 8,318,602 B2 | 11/2012 | Kito et al. | |
| 2012/0168858 A1 | 7/2012 | Hong | |
| 2012/0193705 A1* | 8/2012 | Lim | G11C 5/025 257/330 |
| 2012/0211823 A1 | 8/2012 | Lim et al. | |

* cited by examiner

*Primary Examiner* — Johannes P Mondt
(74) *Attorney, Agent, or Firm* — Myers Bigel, P.A.

(57) ABSTRACT

Provided are semiconductor devices and methods of fabricating the same. The semiconductor devices may include a substrate with a cell region and a peripheral region, a gate stack including gates stacked on the cell region of the substrate. At least one edge portion of the gate stack may have a staircase structure. The semiconductor devices may also include a channel that extend through the gate stack and is enclosed by a memory layer and at least two dummy patterns on the substrate. The at least two dummy patterns may be spaced apart from the gate stack and may be spaced apart from each other.

20 Claims, 75 Drawing Sheets

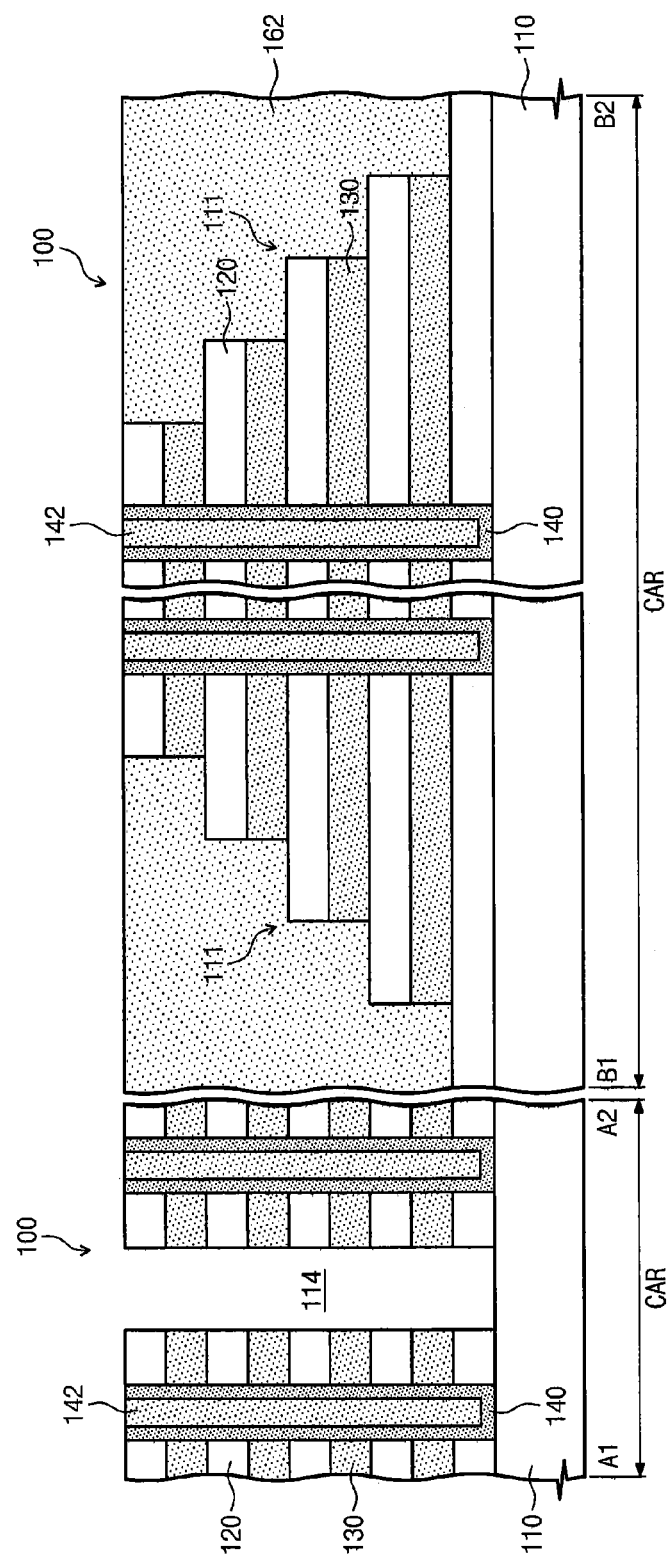

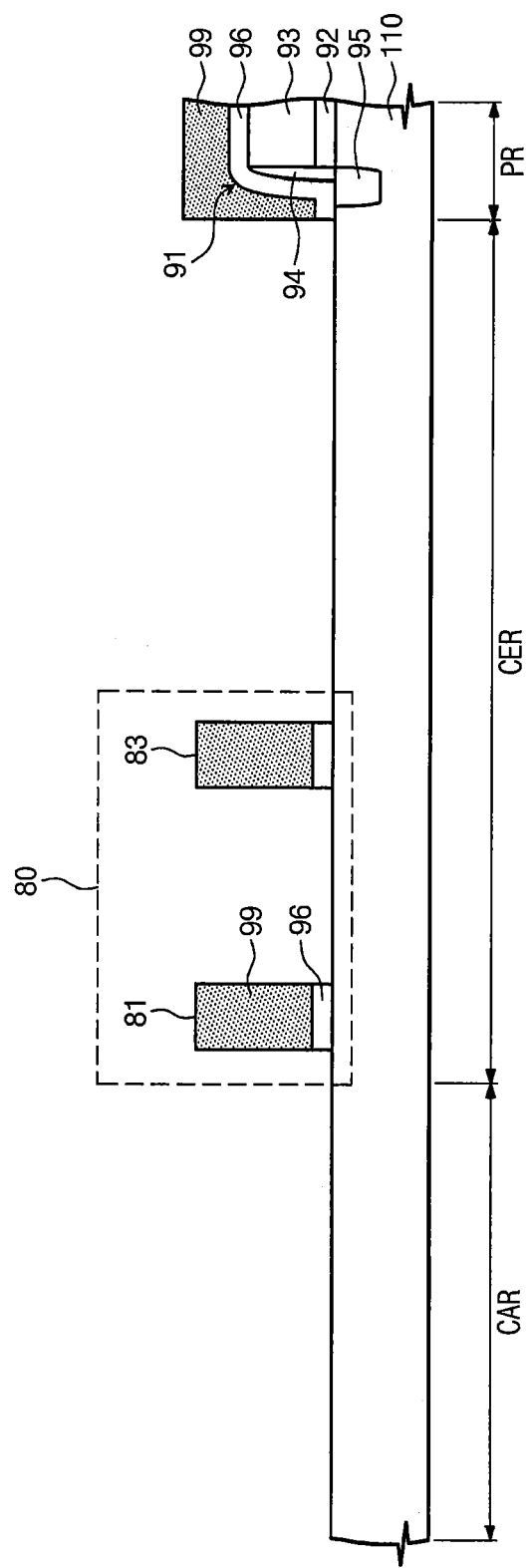

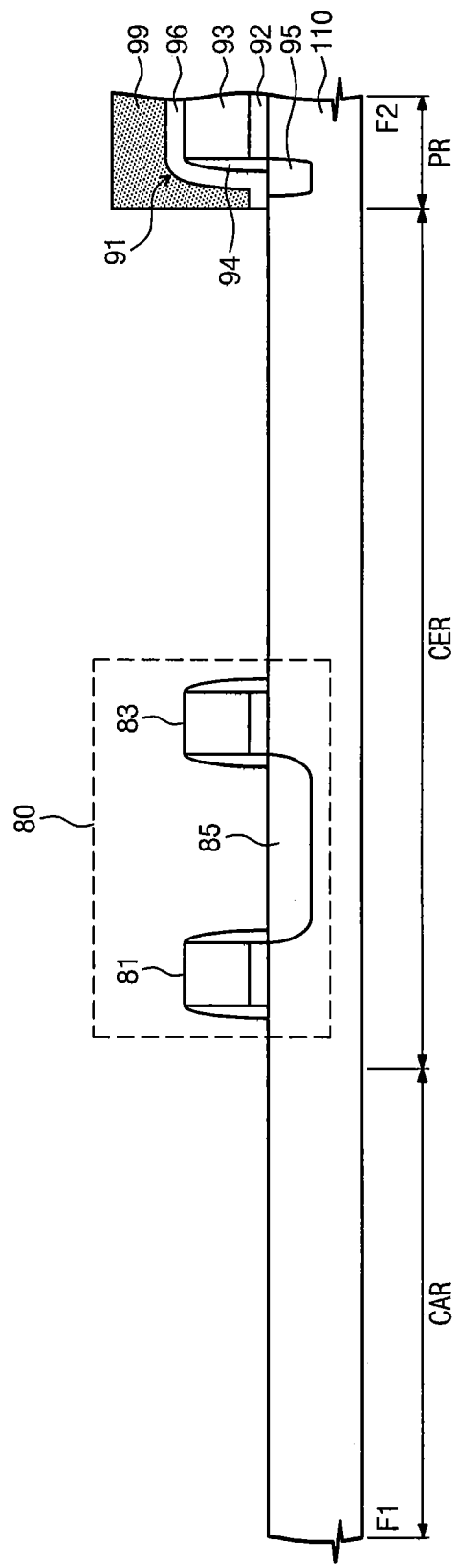

SEMICONDUCTOR DEVICES HAVING DUMMY PATTERNS AND METHODS OF FABRICATING THE SAME

CROSS-REFERENCE TO RELATED APPLICATION

This U.S. non-provisional patent application claims priority under 35 U.S.C. §119 to Korean Patent Application No. 10-2014-0175184, filed Dec. 8, 2014, the contents of which are herein incorporated by reference in their entirety.

FIELD

Example embodiments of the inventive concept relate to semiconductor devices, and in particular, to semiconductor devices having dummy patterns and methods of fabricating the same.

BACKGROUND

In a vertical-type semiconductor device (for example, including "U"-shaped channel patterns), word-line pads are formed in a staircase structure, allowing metal contacts to be connected thereon. A process of forming the staircase word-line pad structure suffers from a process failure (e.g., large variation in size of the word line pads). It is necessary to develop a new process for forming the staircase structure.

SUMMARY

Example embodiments of the inventive concept provide a semiconductor device, in which a dummy pattern is provided to allow for real-time monitoring of a size or width of a word line pad, and a method of fabricating the same.

According to some aspects of the inventive concept, a semiconductor device includes at least two dummy patterns provided on a cell end region, and the dummy patterns are used to monitor a width of a word line pad in a process of fabricating the semiconductor device.

According to other aspects of the inventive concept, at least two dummy patterns may be used to define a reference line or reference stripe, which can be used to monitor a critical dimension of the word line pad in a real time manner.

According to still other aspects of the inventive concept, a critical dimension of the word line pad is monitored in real time before and after an etching process.

According to example embodiments of the inventive concept, a semiconductor device may include a substrate with a cell region and a peripheral region, a gate stack including gates stacked on the cell region of the substrate, at least one edge portion of the gate stack having a staircase structure, a channel penetrating the gate stack and being enclosed by a memory layer, and at least two dummy patterns spaced apart from the gate stack and from each other, on the substrate.

In example embodiments, the cell region may include a cell array region, on which the gate stack is provided, and a cell end region between the cell array region and the peripheral region. The at least two dummy patterns may be provided on the cell end region.

In example embodiments, the peripheral region may include at least one transistor provided on the substrate and an insulating layer locally covering the at least one transistor.

In example embodiments, the at least two dummy patterns may have substantially the same structure as the transistor.

In example embodiments, the at least two dummy patterns may be formed of substantially the same material as the insulating layer.

In example embodiments, the at least two dummy patterns may include a first key pattern including at least two first dummy patterns spaced apart from the staircase edge portion of the gate stack and from each other by a first space, and a second key pattern including at least two second dummy patterns spaced farther apart from the staircase edge portion of the gate stack than the first key pattern and spaced apart from each other by a second space, which is equal to or different from the first space.

In example embodiments, the second space may be smaller than the first space.

According to example embodiments of the inventive concept, a semiconductor device may include a substrate with a cell array region and a peripheral region, a gate stack provided on the cell array region of the substrate to include a plurality of word lines, which are arranged along a channel extending between at least two selection lines separated from each other, at least one edge portion of the gate stack having a staircase structure, a bit line provided on the gate stack and electrically connected to the channel, at least one transistor provided on the peripheral region of the substrate and covered with an insulating layer, and at least one pair of first dummy patterns provided between the gate stack and the transistor and spaced apart from each other on the substrate.

In example embodiments, the substrate may further include a cell end region occupying a portion of the cell array region and being connected to the peripheral region, and the at least one pair of first dummy patterns may be provided on the cell end region.

In example embodiments, the device may further include at least one pair of second dummy patterns provided on the substrate and spaced apart from each other, and a first space between the first dummy patterns may be equal to or different from a second space between the second dummy patterns.

In example embodiments, the pair of first dummy patterns may be disposed adjacent to the gate stack, the pair of second dummy patterns may be disposed adjacent to the transistor, and the second space may be smaller than the first space.

In example embodiments, at least one of the first dummy patterns may include a gate insulating layer on the substrate, a gate on the gate insulating layer, and a spacer on a side surface of the gate.

In example embodiments, at least one of the first dummy patterns may include an insulating material, which is vertically provided on the substrate and is of the same material as the insulating layer.

According to example embodiments of the inventive concept, a semiconductor device may include a gate stack and a peripheral transistor on a substrate, and a first dummy pattern, on the substrate, disposed between the gate stack and the peripheral transistor, the first dummy pattern is spaced apart from the gate stack and the peripheral transistor, and the gate stack includes a staircase structure at one sidewall thereof adjacent to the first dummy pattern.

In example embodiments, the substrate may include a cell region on which the gate stack is provided, a peripheral region on which the peripheral transistor is provided, and a cell end region, between the cell region and the peripheral region, on which the first dummy pattern is provided, the staircase structure of the gate stack has a downhill slope along a first direction toward the cell end region from the cell region.

In example embodiments, the first dummy pattern may extend along a second direction, the second direction crossing the first direction.

In example embodiments, the cell region may include at least one bit line electrically connected to the gate stack, the at least one bit line extending along the second direction.

In example embodiments, the first dummy pattern may include at least two dummy transistors extending parallel to each other along the second direction.

In example embodiments, the first dummy pattern may include at least two insulating blocks extending parallel to each other along the second direction.

In example embodiments, the semiconductor further comprising a second dummy pattern disposed between the first dummy pattern and the peripheral transistor, the first dummy pattern includes at least two first key patterns spaced apart from each other by a first spacing, and the second dummy pattern includes at least two second key pattern spaced apart from each other by a second spacing narrower than the first spacing.

According to example embodiments of the inventive concept, a method of fabricating a semiconductor device may include forming at least one pair of dummy patterns and at least one peripheral transistor on a substrate, the at least one peripheral transistor being covered with an insulating layer, alternatingly stacking first mold layers and second mold layers on the substrate to form a stack covering the at least one pair of dummy patterns and the insulating layer, forming a channel on the substrate to penetrate the stack, and patterning the stack to form at least one staircase edge portion.

In example embodiments, the forming of the at least one pair of dummy patterns and the peripheral transistor may include providing the substrate with a cell array region, a peripheral region, and a cell end region between the cell array region and the peripheral region, forming at least one pair of dummy transistors on the cell end region of the substrate and the peripheral transistor on the peripheral region of the substrate, depositing an insulating material on the substrate to cover the at least one pair of dummy transistors and the peripheral transistor, and removing a portion of the insulating material covering the cell array region and the cell end region of the substrate.

In example embodiments, the forming of the at least one pair of dummy patterns and the peripheral transistor may include providing the substrate with a cell array region, a peripheral region, and a cell end region between the cell array region and the peripheral region, forming the peripheral transistor on the peripheral region of the substrate, depositing an insulating material on the substrate to cover the peripheral transistor, removing a portion of the insulating material covering the cell array region of the substrate, and removing another portion of the insulating material covering the cell end region of the substrate.

In example embodiments, the forming of the at least one pair of dummy patterns may include providing the substrate with a cell array region, a peripheral region, and a cell end region between the cell array region and the peripheral region, forming a pair of first dummy patterns spaced apart from each other by a first space, on the cell end region of the substrate, and forming a pair of second dummy patterns spaced apart from each other by a second space, on the cell end region of the substrate. The peripheral region may be closer to the pair of second dummy patterns than the pair of first dummy patterns.

In example embodiments, the second space may be smaller than the first space.

In example embodiments, the forming of the stack may include alternatingly stacking first mold insulating layers and second mold insulating layers on the substrate to form a mold stack, the first and second mold insulating layers having an etch selectivity with respect to each other, and the mold stack may be formed to have a valley recessed toward the substrate, on the at least one pair of dummy patterns.

In example embodiments, the forming of the stack may include alternatingly stacking mold insulating layers and mold conductive layers on the substrate to form a gate stack, and the gate stack may be formed to have a valley recessed toward the substrate, on the at least one pair of dummy patterns.

BRIEF DESCRIPTION OF THE DRAWINGS

Example embodiments will be more clearly understood from the following description taken in conjunction with the accompanying drawings. The accompanying drawings represent non-limiting, example embodiments as described herein.

FIGS. 2A, 3A, 4A, 5A, 6A and 7A are sectional views taken along the lines A1-A2 and B1-B2 of FIG. 1A to illustrate a method of fabricating a semiconductor device according to example embodiments of the inventive concept.

FIGS. 11A through 11C are sectional views illustrating a staircase patterning process according to example embodiments of the inventive concept.

FIGS. 13B, 14B, 15B, 16B and 17B are sectional views taken along the line F1-F2 of FIG. 1B to illustrate a method of fabricating a semiconductor device according to example embodiments of the inventive concept.

Figure 1A:
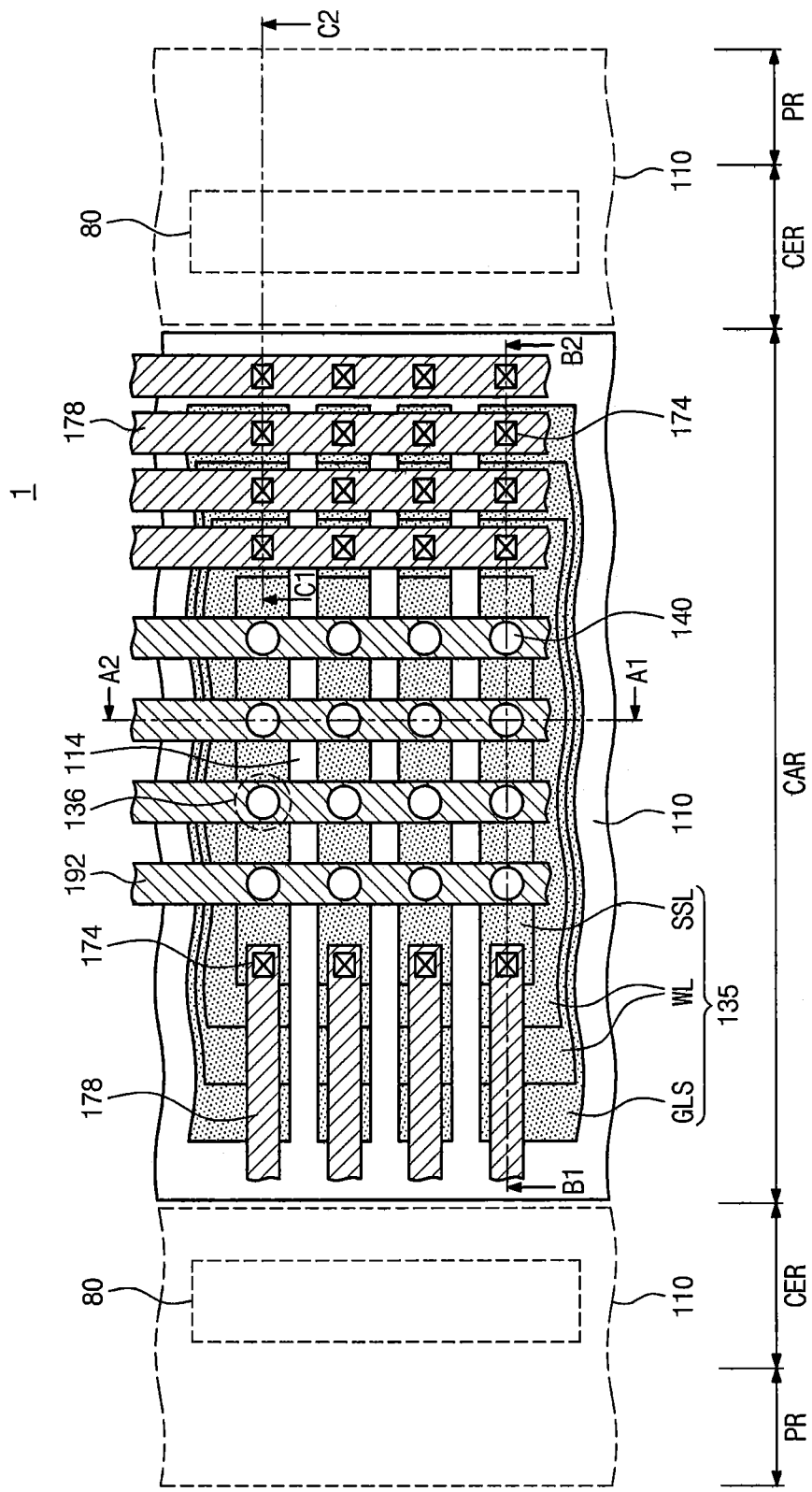
FIG. 1A is a plan view illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Semiconductor Device: Example Embodiments

FIG. 1A is a plan view illustrating a semiconductor device according to example embodiments of the inventive concept.

Referring to FIG. 1A, a semiconductor device 1 may include a plurality of vertical channels 140 vertically stood on a substrate 110, a plurality of gates 135 stacked along the vertical channels 140, and bit lines 192 electrically connected to the vertical channels 140. The semiconductor device 1 may be a semiconductor memory device (for example, a NAND FLASH memory device or a resistance memory device) further including a memory layer 150 provided between the vertical channel 140 and the gates 135, as shown in FIG. 7A.

The gates 135 may include a ground selection line GSL adjacent to the substrate 110, a string selection line SSL adjacent to the bit line 192, and word lines WL between the ground selection line GSL and the string selection line SSL. The ground selection line GSL, the word lines WL, and the string selection line SSL, which are vertically stacked along each of the vertical channels 140, may constitute a memory cell string 136.

The gates 135 and the substrate 110 may be electrically connected to metal lines 178 via first contact plugs 174. Each of the vertical channels 140 may include a bottom portion electrically connected to the substrate 110 and a top portion electrically connected to the bit line 192 via a second contact plug 176 (e.g., of FIG. 7A).

Figure 7A:
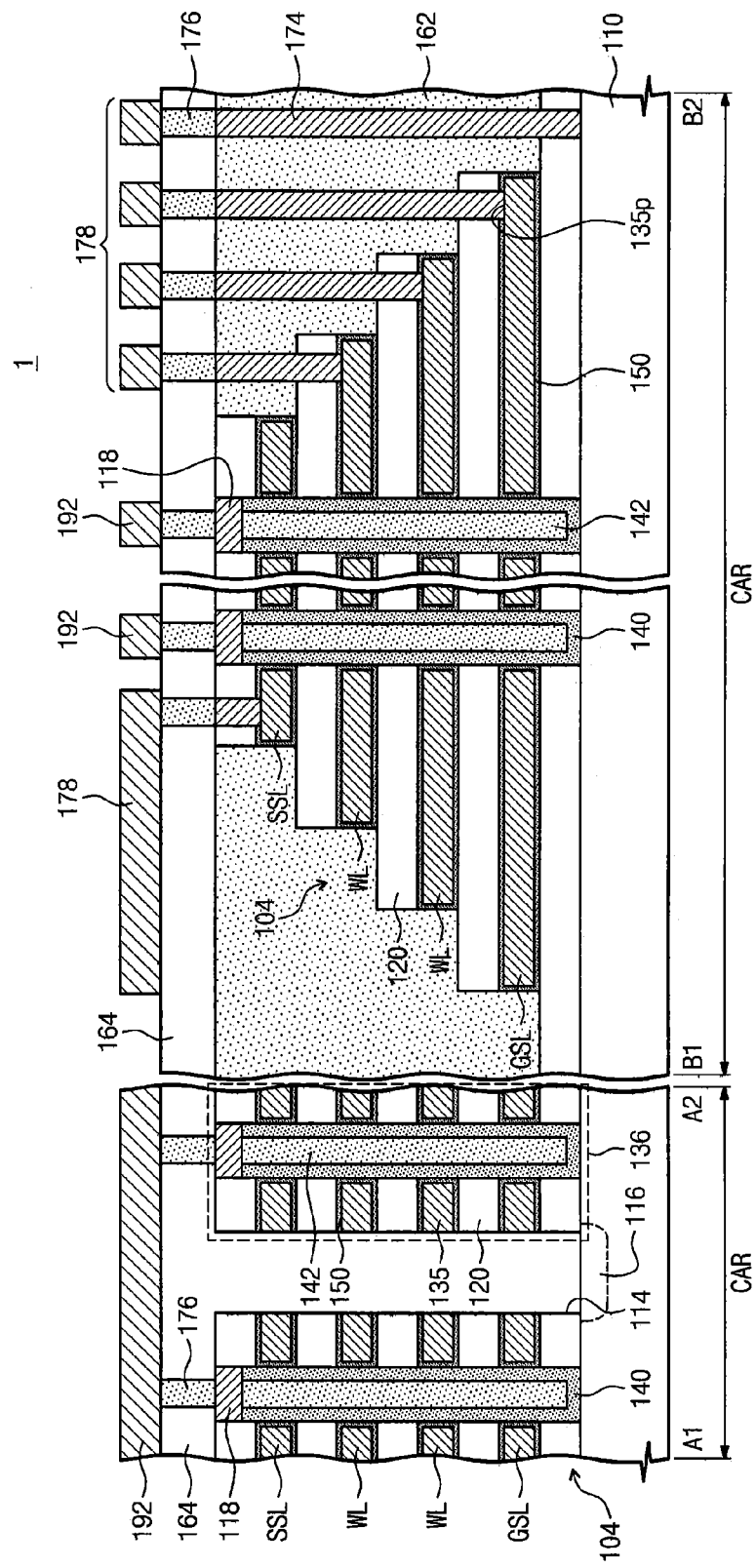

In the present embodiment, as shown in FIG. 7A, the gates 135 may be stacked to have a truncated pyramid shape, whose two or four side surfaces are formed to have a staircase structure 111, and thus, the gates 135 may have pads 135p in contact with the first contact plugs 174. The string selection line SSL may be extended to be parallel to a traverse direction, which is at an angle to an extending or longitudinal direction of the bit line 192, and may have a line shape. The word lines WL and the ground selection line GSL may extend in the same direction (e.g., traverse direction) as the extending direction of the string selection line SSL and may be a line or plate shape, in which a word line cut 114 exposing the substrate 110 is provided. The line-shaped word lines WL may be electrically connected to each other via the metal line 178. Similarly, the line-shaped ground selection lines GSL may be electrically connected to each other via the metal line 178.

The semiconductor device 1 may include a cell array region CAR provided with memory cells, a peripheral region PR provided with peripheral circuits, and a cell end region CER, which is a portion of the cell array region CAR adjacent to the peripheral region PR, and on which a key pattern 80 is provided. The key pattern 80 may not be used as a part of an electric circuit, and as will be described with reference to FIGS. 10A through 10G, it may be used to monitor a patterning process for forming the staircase structure 111 in real time.

As an example, the cell end region CER may be provided at left- and right-hand sides of the cell array region CAR. The key pattern 80 may extend parallel to the extending direction (e.g., longitudinal direction) of the bit line 192. An extension length of the key pattern 80 may be variously changed. For example, the key pattern 80 may have a length, which is equal or similar to or shorter than a distance between the left- and right-hand sides of the ground selection line GSL.

As another example, the cell end region CER may be provided at front and rear sides of the cell array region CAR, and the key pattern 80 may extend in the traverse direction, which is at an angle to the extending or longitudinal direction of the bit line 192. The key pattern 80 may have a length, which is equal or similar to or shorter than a distance between the front and rear sides of the ground selection line GSL.

The description that follows will refer to the former example of the present embodiment in which the cell end region CER is provided at the left- and right-hand sides of the cell array region CAR and the key pattern 80 extends parallel to the extending direction (e.g., longitudinal direction) of the bit line 192, and this description may be applied to the example of the latter in the same or similar manner.

Semiconductor Device: Example Embodiments

Figure 1B:
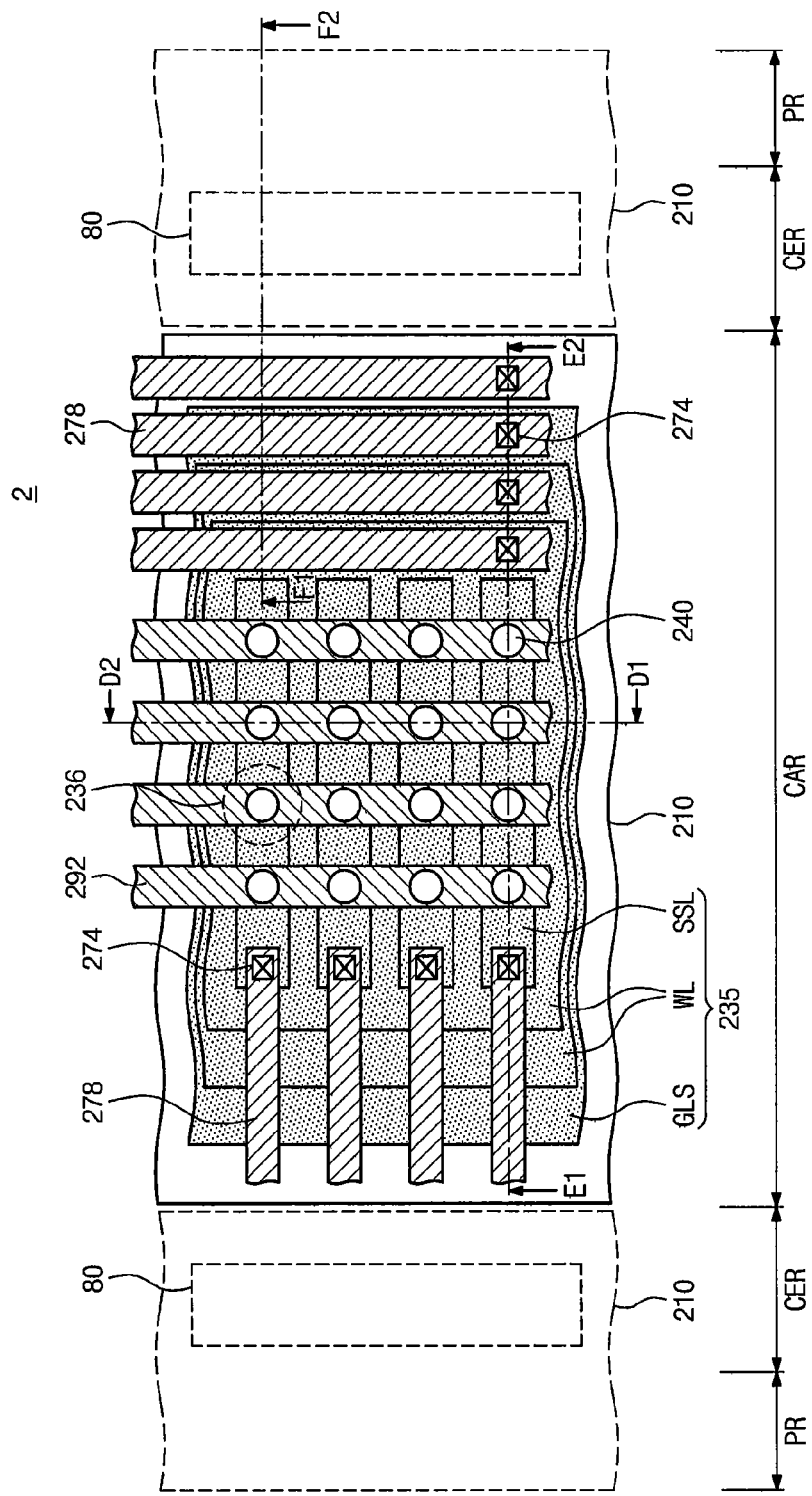
FIG. 1B is a plan view illustrating a semiconductor device according to example embodiments of the inventive concept.

FIG. 1B is a plan view illustrating a semiconductor device according to example embodiments of the inventive concept.

Referring to FIG. 1B, a semiconductor device 2 may include a plurality of vertical channels 240 vertically extending from a substrate 210, a plurality of gates 235 stacked along the vertical channels 240, and bit lines 292 electrically connected to the vertical channels 240. The semiconductor device 2 may be a semiconductor memory device (for example, a NAND FLASH memory device) further including a memory layer 250 extending along the vertical channel 240, as shown in FIG. 17A.

The gates 235 may include a ground selection line GSL adjacent to the substrate 110, a string selection line SSL adjacent to the bit line 292, and word lines WL between the ground selection line GSL and the string selection line SSL. The ground selection line GSL, the word lines WL, and the string selection line SSL, which are vertically stacked along each of the vertical channels 240, may constitute a memory cell string 236.

The gates 235 and the substrate 210 may be electrically connected to metal lines 278 via first contact plugs 274. Each of the vertical channels 240 may include a bottom portion electrically connected to the substrate 210 and a top portion electrically connected to the bit line 292 via the second contact plug 276 (e.g., of FIG. 17A).

Figure 17A:
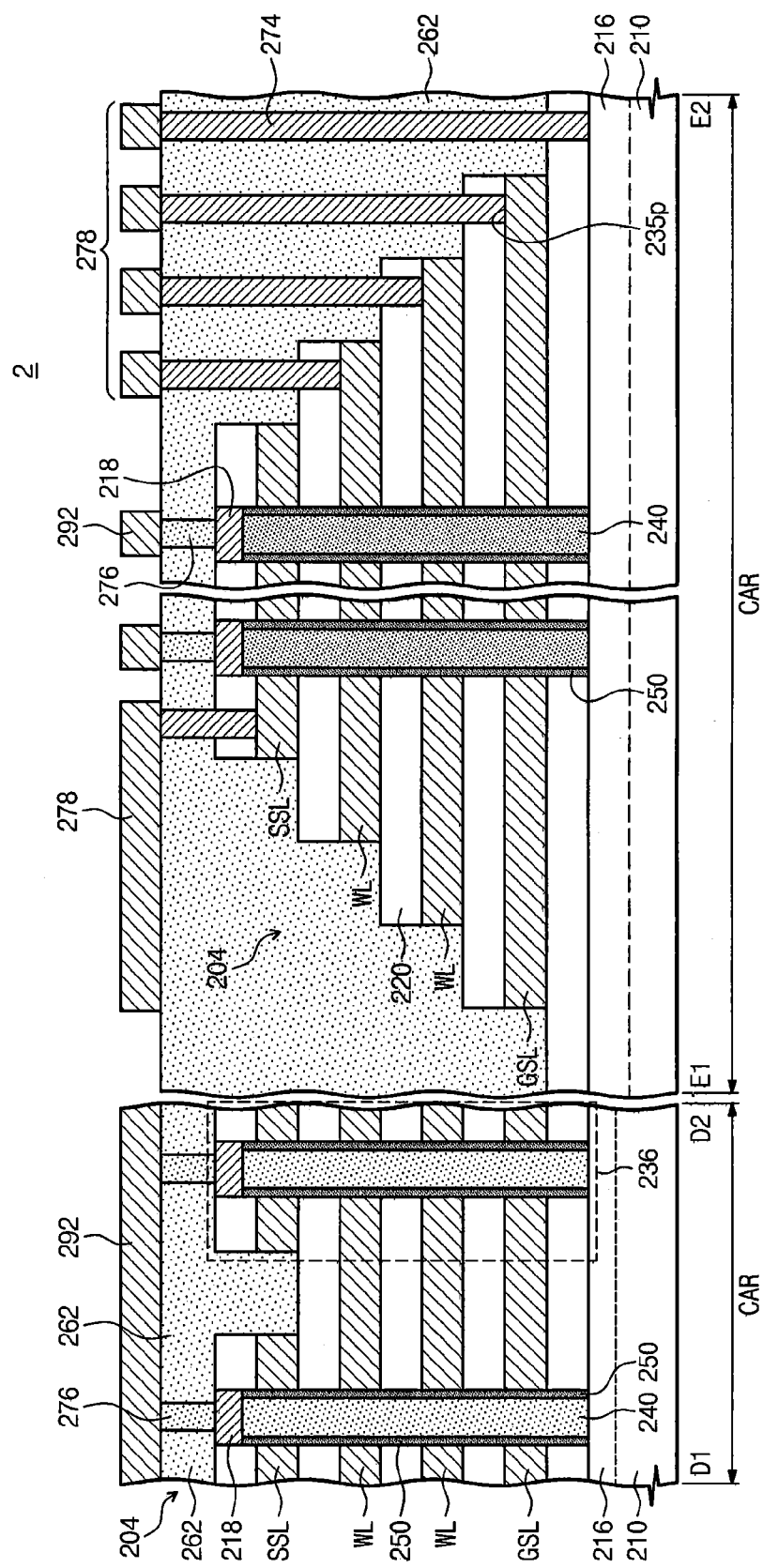

In the present embodiment, as shown in FIG. 17A, the gates 235 may be stacked to have a truncated pyramid shape, whose two or four side surfaces are formed to have a staircase structure 211, and thus, the gates 235 may have pads 235p in contact with the first contact plugs 274. The string selection line SSL may be extended to be parallel to a traverse direction, which is at an angle to an extending or longitudinal direction of the bit line 292, and may have a line shape. The word lines WL and the ground selection line GSL may be provided to have a plate shape.

The semiconductor device 2 may include a cell array region CAR provided with memory cells, a peripheral region PR provided with peripheral circuits, and a cell end region CER, which is a portion of the cell array region CAR adjacent to the peripheral region PR, and on which a key pattern 80 is provided. The key pattern 80 may not be used as a part of an electric circuit, and it may be used to monitor a patterning process for forming the staircase structure 211 of FIG. 15C in real time. The cell end region CER may be provided at left- and right-hand sides or front- and rear-hand sides of the cell array region CAR, and the key pattern 80 may extend in the same direction (e.g., a longitudinal direction) as the bit line 292 or in the traverse direction at an angle to the bit line 292.

Semiconductor Device: Example Embodiments

Figure 1C:
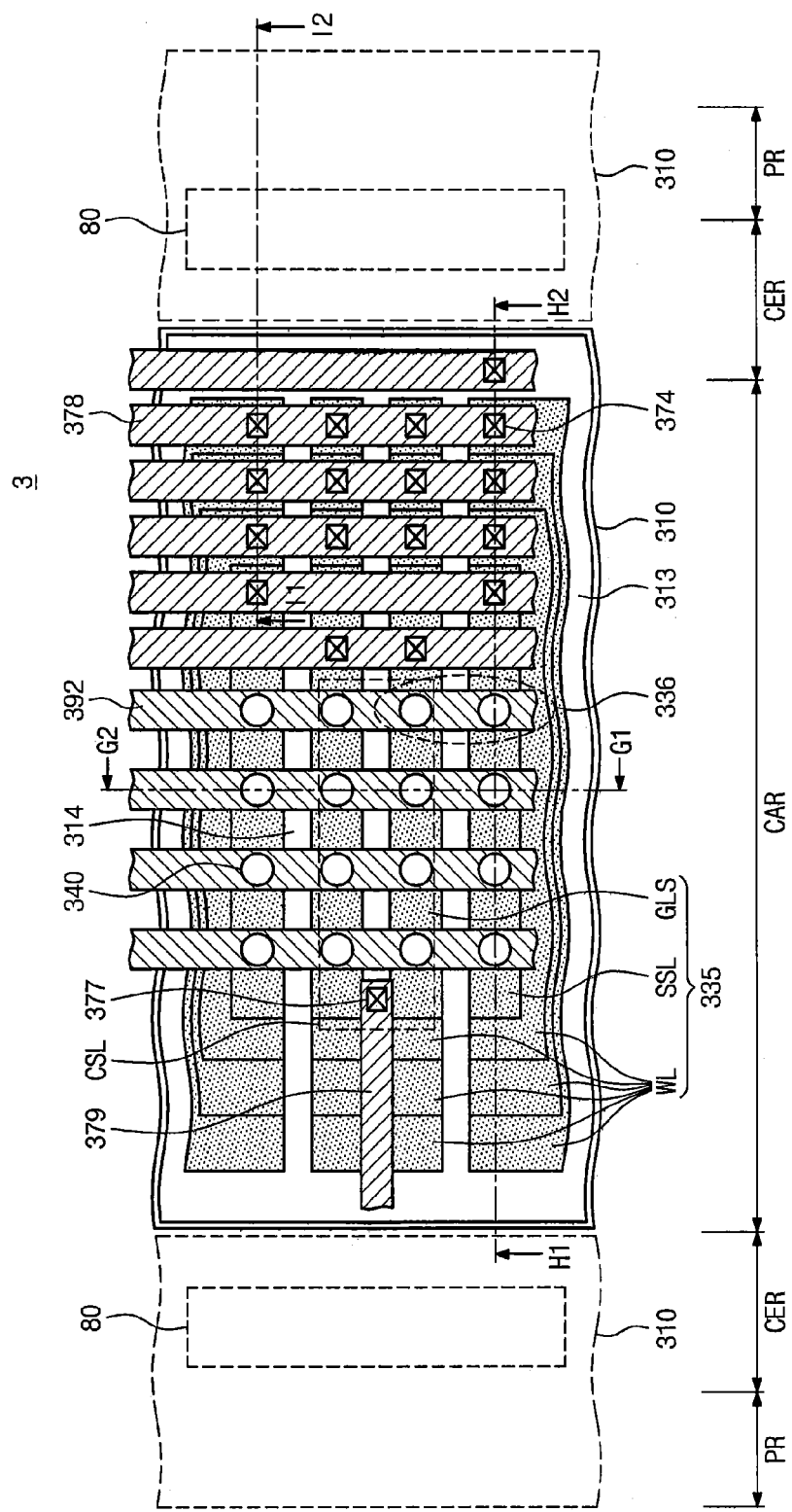
FIG. 1C is a plan view illustrating a semiconductor device according to example embodiments of the inventive concept.

FIG. 1C is a plan view illustrating a semiconductor device according to example embodiments of the inventive concept.

Referring to FIG. 1C, a semiconductor device 3 may include a plurality of "U"- to pipe-shaped channels 340 vertically extending from a substrate 310, a plurality of gates 335 stacked along the channels 340, and bit lines 392 electrically connected to the channels 340. The semiconductor device 3 may further include a back gate 313 provided on the substrate 310. The semiconductor device 3 may be a semiconductor memory device (for example, a NAND FLASH memory device) further including a "U"-shaped memory layer 350 extending along the channel 340, as shown in FIG. 24A.

The gates 335 may include ground and string selection lines GSL and SSL adjacent to the bit lines 392 and the word lines WL between the ground and string selection lines GSL and SSL. The gates 335 and the back gate 313 may be electrically connected to metal lines 378 via first contact plugs 374. The ground selection line GSL, the word lines WL, and the string selection line SSL, which are arranged along the "U"-shaped channel 340, may constitute a memory cell string 336.

A common source line CSL may be provided between the bit line 392 and the ground selection line GSL and may be electrically connected to the channel 340. The common source line CSL may be electrically connected to a metal line 379 via a contact plug 377. Each of the "U"-shaped channels 340 may include two opposite ends electrically connected to the bit line 392 and the common source line CSL, respectively. The common source line CSL may be connected in common to a pair of the "U"-shaped channels 240, which are adjacent to each other on line G1-G2.

Figure 24A:
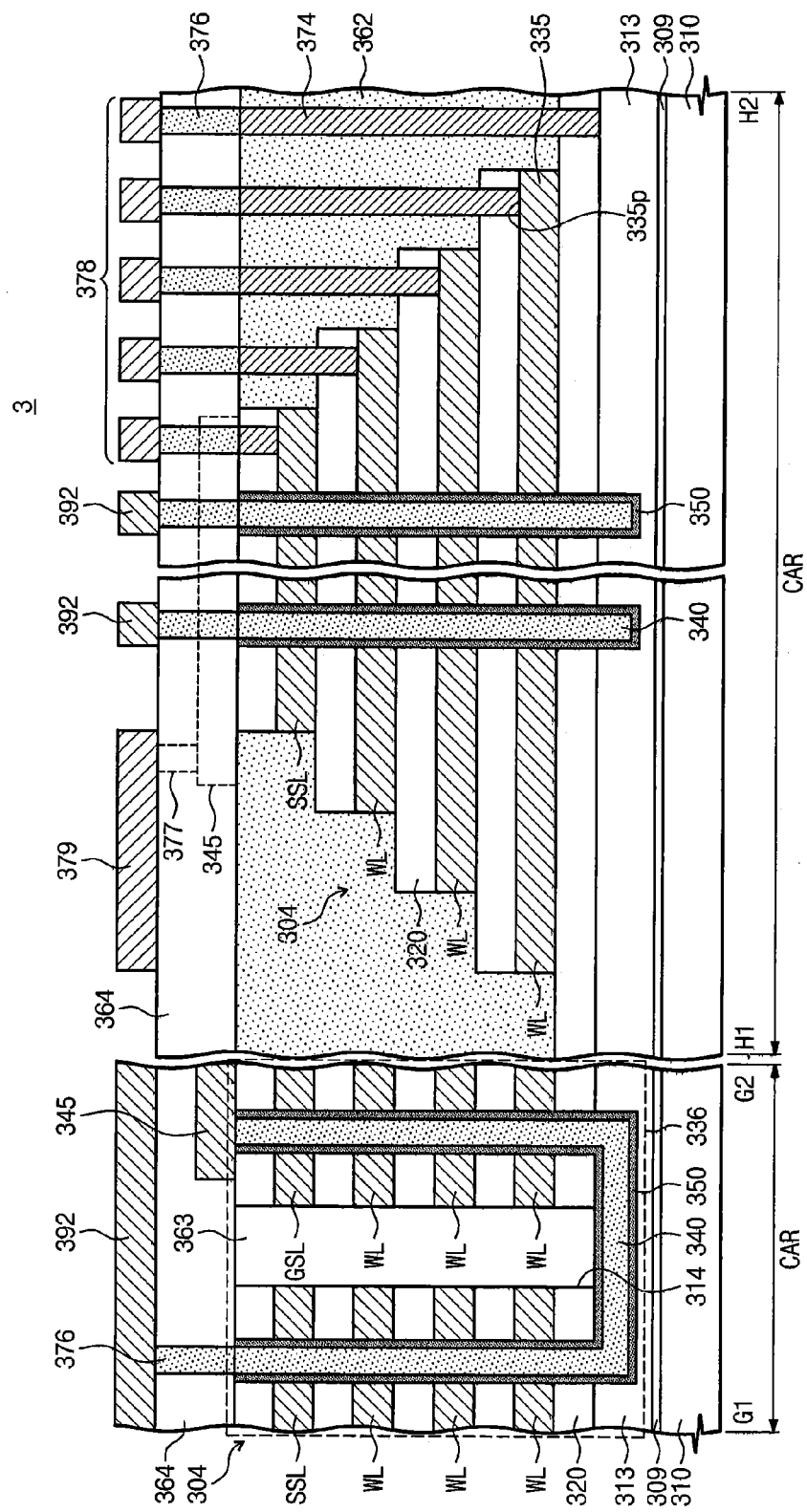

In the present embodiment, as shown in FIG. 24A, the gates 335 may be stacked to have a truncated pyramid shape, whose two or four side surfaces are formed to have a staircase structure 311, and thus, the gates 335 may have pads 335p in contact with the first contact plugs 374. The gates 335 may be extended along a traverse direction, which is at an angle to an extending or longitudinal direction of the bit line 392, and may have a line shape. Adjacent ones of the gates 335 may be spaced apart from each other with a word line cut 314 interposed therebetween.

The semiconductor device 3 may include a cell array region CAR provided with memory cells, a peripheral region PR provided with peripheral circuits, and a cell end region CER, which is a portion of the cell array region CAR adjacent to the peripheral region PR, and on which a key pattern 80 is provided. The key pattern 80 may not be used as a part of an electric circuit, and it may be used to monitor a patterning process for forming the staircase structure 311 of FIG. 24B in real time. The cell end region CER may be provided at left- and right-hand sides or front- and rear-hand sides of the cell array region CAR, and the key pattern 80 may extend in the same direction (e.g., a longitudinal direction) as the bit line 392 or in the traverse direction at an angle to the bit line 392.

Fabrication Process: Example Embodiments

FIGS. 2A, 3A, 4A, 5A, 6A and 7A are sectional views taken along the lines A1-A2 and B1-B2 of FIG. 1A to illustrate a method of fabricating a semiconductor device, according to example embodiments of the inventive concept. FIGS. 2B, 3B, 4B, 5B, 6B and 7B are sectional views taken along the line C1-C2 of FIG. 1A to illustrate a method of fabricating a semiconductor device, according to example embodiments of the inventive concept.

Figure 2A:
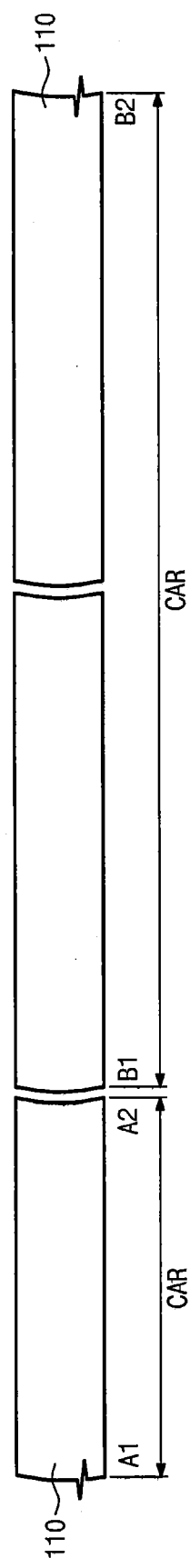
Figure 2B:
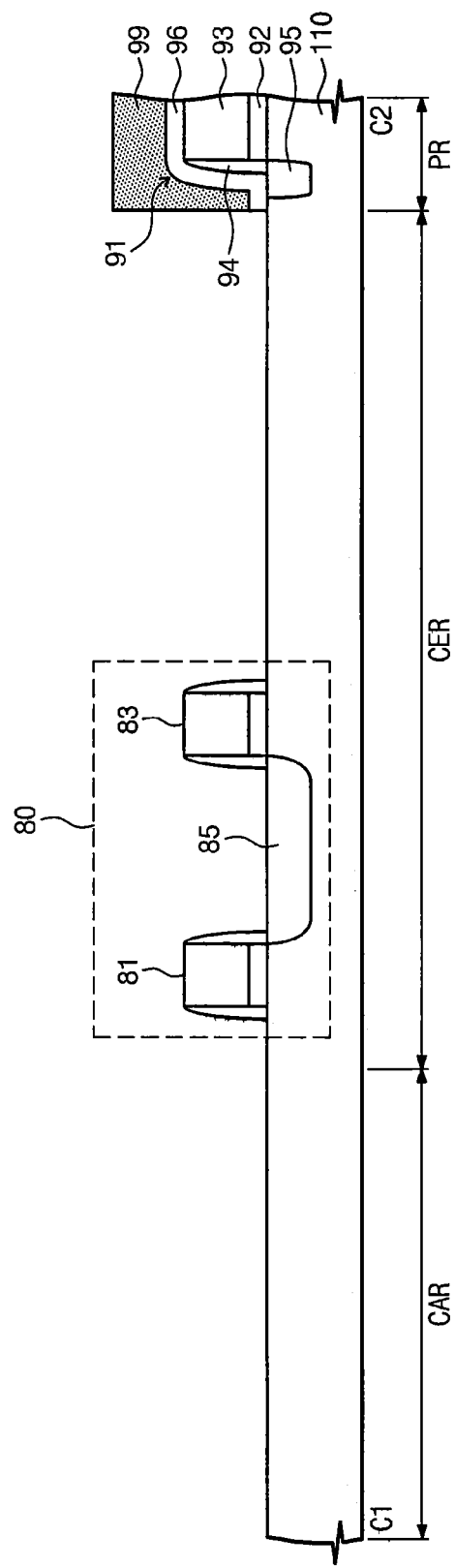
FIGS. 2B, 3B, 4B, 5B, 6B and 7B are sectional views taken along the line C1-C2 of FIG. 1A to illustrate a method of fabricating a semiconductor device according to example embodiments of the inventive concept.

Referring to FIGS. 2A and 2B, a key pattern 80 and at least one peripheral transistor 91 may be formed on a substrate 110. The substrate 110 may be a semiconductor substrate, for example, a doped single crystalline silicon wafer of a first conductivity type (e.g., p-type). The substrate 110 may include a cell array region CAR, on which memory cells are provided, a peripheral region PR, on which peripheral circuits are provided, and a cell end region CER, which is a portion of the cell array region CAR adjacent to the peripheral region PR, and on which the key pattern 80 is provided.

The peripheral transistor 91 may be a structure including a gate insulating layer 92, a gate 93, and a spacer 94. The peripheral transistor 91 may constitute the peripheral circuit. The key pattern 80 may include at least one pair of dummy patterns 81 and 83 and a trench insulating layer 85 between the dummy patterns 81 and 83. The trench insulating layer 85 may be recessed. For example, the trench insulating layer 85 may have a top surface positioned at a lower level than that of the substrate 110. Each of the dummy patterns 81 and 83 may be formed at the same time as the peripheral transistor 91 to have the same or similar structure as the peripheral transistor 91. The trench insulating layer 85 may be formed at the same time as a device isolation layer 95, which may be formed on the peripheral region PR.

After the formation of the dummy patterns 81 and 83 and the peripheral transistor 91, an insulating layer 99 may be formed on the substrate 110 to cover the peripheral transistor 91. For example, an insulating material (e.g., a silicon oxide layer) may be deposited on the substrate 110, and a cell open photolithography process and an etching process may be performed to form the insulating layer 99 locally covering the peripheral transistor 91. An etch stop layer 96 may be further formed to locally cover the peripheral transistor 91, before the formation of the insulating layer 99, and here, the etch stop layer 96 may be formed of an insulating material (e.g., a silicon nitride layer). As another example, an etch stop layer may be further formed to cover the dummy patterns 81 and 83, when the etch stop layer 96 is formed.

The key pattern 80 may be electrically disconnected from the peripheral circuit and/or a memory cell circuit. The key pattern 80 may be used to perform a real-time monitoring in a staircase patterning process, as will be described with reference to FIGS. 10A through 10G.

Figure 3A:
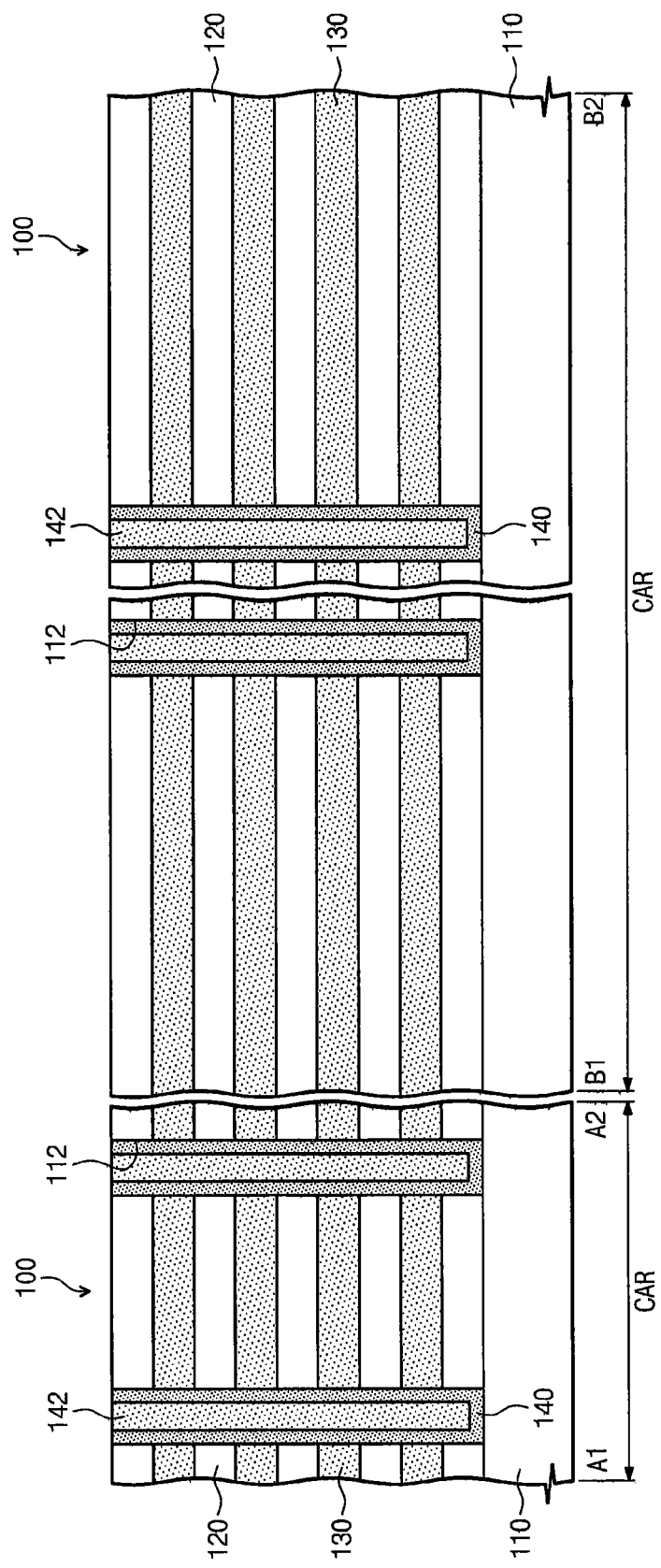
Figure 3B:
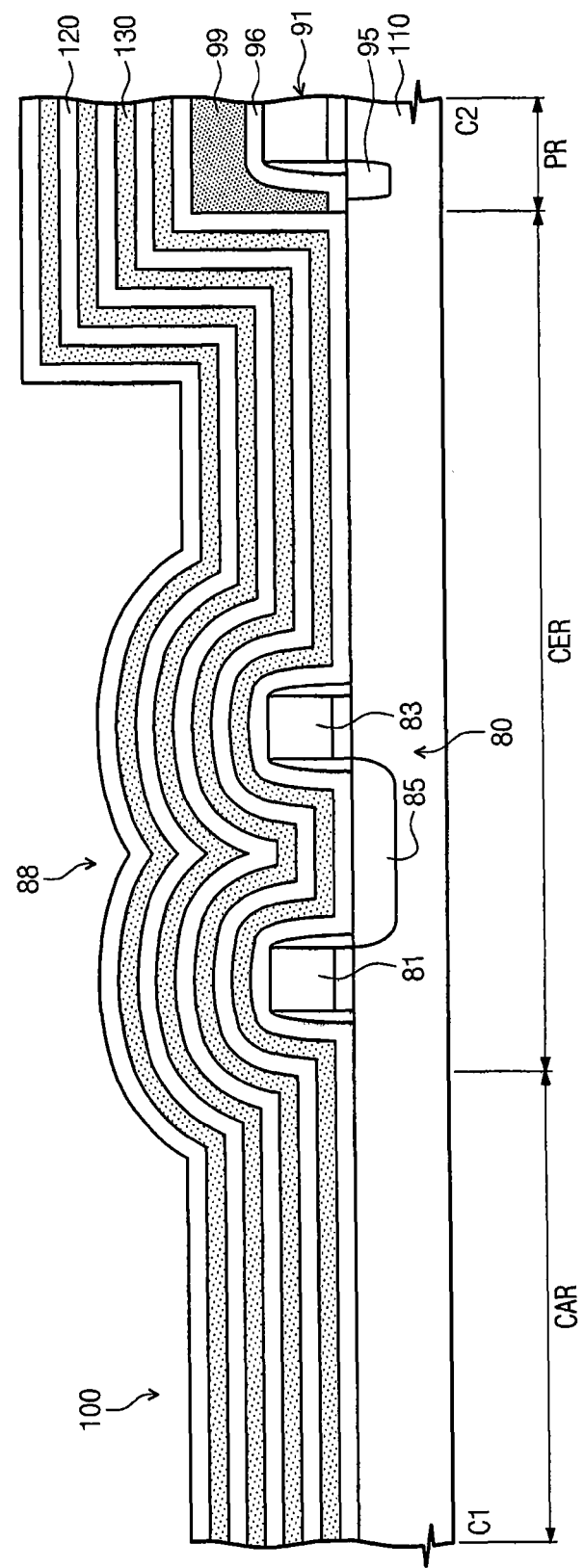

Referring to FIGS. 3A and 3B, a mold stack 100 may be formed on the substrate 110, and a vertical channel 140 may be formed to penetrate the mold stack 100 and be electrically connected to the substrate 110. The mold stack 100 may be formed on the whole region of the substrate 110 (for example, the cell array region CAR, the cell end region CER, and the peripheral region PR). The vertical channel 140 may be formed on the cell array region CAR. The mold stack 100 may be formed by alternatingly stacking a plurality of mold insulating layers 120 and a plurality of mold sacrificial layers 130. The mold insulating layers 120 and the mold sacrificial layers 130 may be formed to contain insulating materials different from each other and thereby have different etch rates from each other, when the mold sacrificial layers 130 are removed. For example, the mold insulating layers 120 may include a silicon oxide layer, whereas the mold sacrificial layers 130 may include a silicon nitride layer.

A vertical hole 112 may be formed to penetrate the mold stack 100 and expose the substrate 110, and the vertical channel 140 may be formed to fill the vertical hole 112. The vertical hole 112 may be formed by etching the mold stack 100 (for example, using a dry etching process) and may be shaped like an open pillar exposing the substrate 110. The vertical channel 140 may be formed by depositing the same or similar material (e.g., silicon) as the substrate 110. As an example, the vertical channel 140 may be shaped like a cylinder, whose bottom has a closed shape and is in contact with the substrate 110 and whose top has an open shape. An inner insulating layer 142 may be formed to fill a remaining empty space of the vertical hole 112 provided with the vertical channel 140. As another example, the vertical channel 140 may be formed to wholly fill the vertical hole 112, and thus, it may be shaped like a solid pillar.

As shown in FIG. 3B, the mold stack 100 formed on the cell end region CER may be formed to have a pair of knolls and a recessed valley 88 therebetween, on the key pattern 80. The valley 88 may extend in a direction (for example, parallel to the line A1-A2 of FIG. 1A).

Figure 4B:
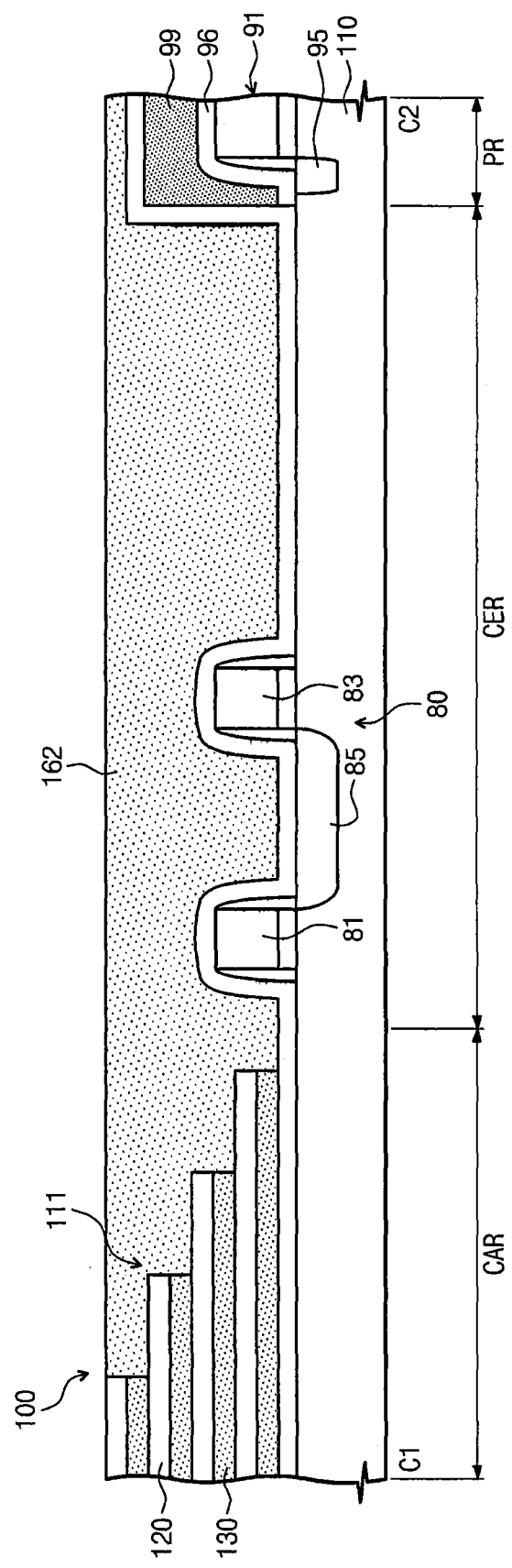

Referring to FIGS. 4A and 4B, the mold stack 100 may be patterned to form a word line cut 114 on the cell array region CAR. For example, the mold insulating layers 120 and the mold sacrificial layers 130 between the vertical channels 140 may be selectively etched (for example, using a dry etching process) to form the word line cut 114 exposing the substrate 110 or the lowermost one of the insulating layers 120. The word line cut 114 may be shaped like a trench extending parallel to the line B1-B2 of FIG. 1A.

A staircase structure 111 may be formed on the cell array region CAR, before or after the formation of the word line cut 114. The staircase structure 111 may have a truncated pyramid shape; for example, the mold insulating layers 120 and/or the mold sacrificial layers 130 may have a length discretely decreasing in a direction away from the substrate 110, when viewed in a vertical section crossing the line B1-B2. Side surfaces of the mold insulating layers 120 and/or the mold sacrificial layers 130 exposed by the word line cut 114 may be substantially vertical to a top surface of the substrate 110. A process of forming the staircase structure 111 will be described in more detail with reference to FIGS. 10A through 10G.

After the formation of the staircase structure 111, an insulating material (e.g., a silicon oxide layer) may be deposited to form a capping insulating layer 162 covering the substrate 110. The capping insulating layer 162 may be formed to cover the staircase structure 111, the key pattern 80, and the insulating layer 99 on the peripheral transistor 91. The word line cut 114 may be formed after or before the formation of the capping insulating layer 162. As another example, the vertical channel 140 may be formed after the formation of the staircase structure 111.

When measured in the direction B1-B2, the length of the word line cut 114 may be the same as or greater than that of the lowermost ones of the mold insulating layers 120 and/or the mold sacrificial layers 130. Accordingly, the mold insulating layers 120 and the mold sacrificial layers 130 may be divided into a plurality of portions, which are separated from each other in the direction A1-A2, and each of which is shaped like a line extending parallel to the direction B1-B2.

As another example, when measured in the direction B1-B2, the length of the word line cut 114 may be the same as or greater than that of the uppermost ones of the mold insulating layers 120 and/or the mold sacrificial layers 130 but may be smaller than those of the others of the mold insulating layers 120 and/or the mold sacrificial layers 130. Accordingly, the uppermost ones of the mold insulating layers 120 and the mold sacrificial layers 130 may include a plurality of portions, which are separated from each other by the word line cut 114 in the direction A1-A2, and each of which is shaped like a line extending parallel to the direction B1-B2, whereas the others of the mold insulating layers 120 and the mold sacrificial layers 130 may be shaped like a plate pierced by the word line cut 114.

Figure 5A:
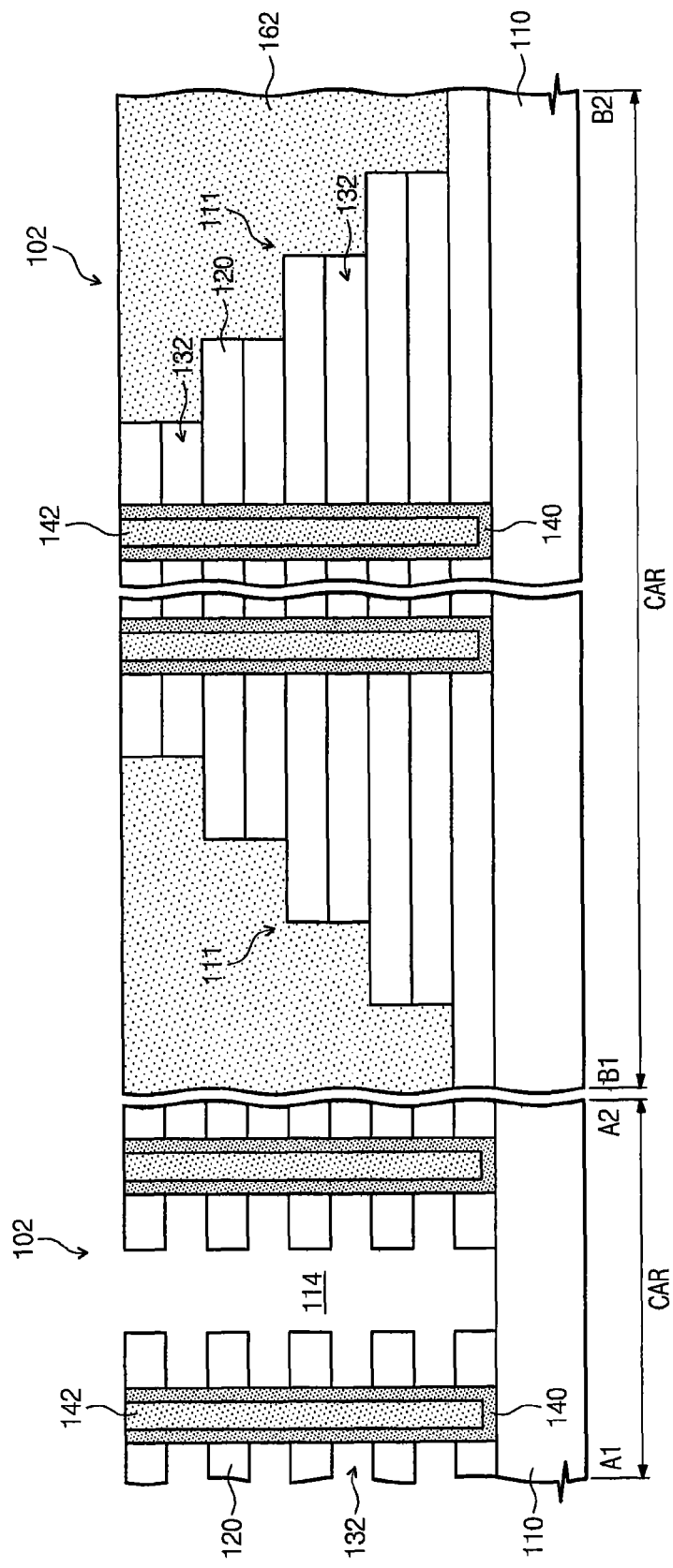
Figure 5B:
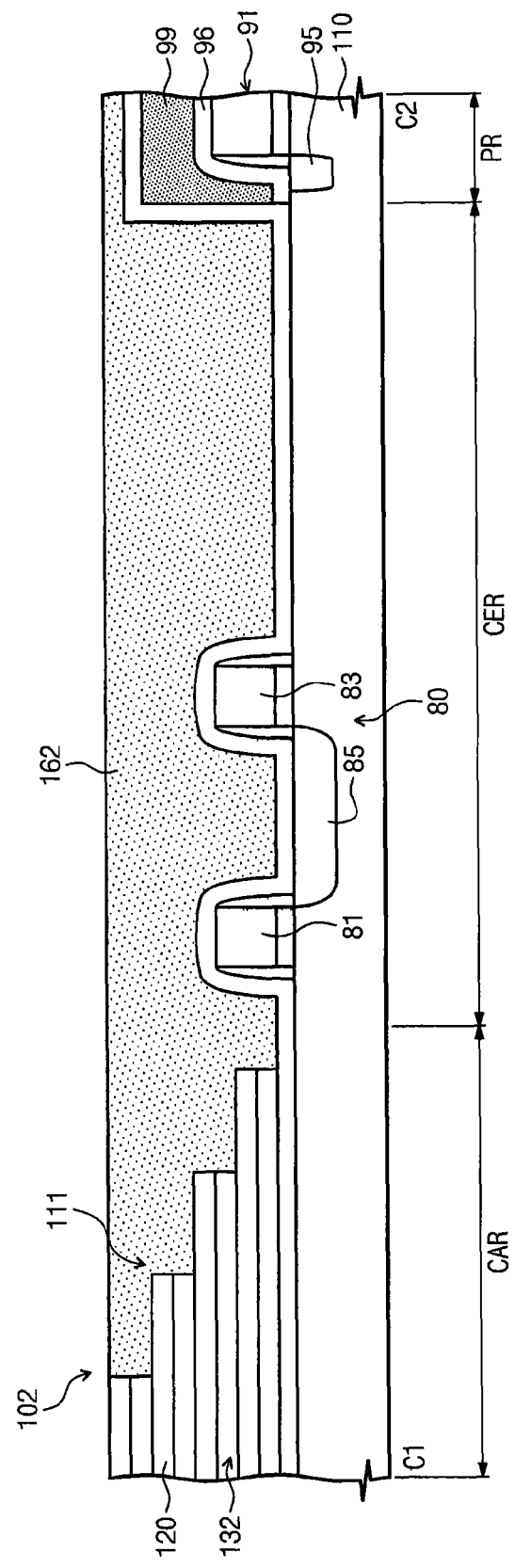

Referring to FIGS. 5A and 5B, the mold sacrificial layers 130 may be selectively removed to form a mold wing 102. In the case where the mold sacrificial layers 130 are of a silicon nitride layer, by supplying an etchant (e.g., phosphoric acid; $H_3PO_4$) through the word line cut 114, it is possible to selectively remove the mold sacrificial layers 130 and thereby form recess regions 132. As a result of this etching process, the mold insulating layers 120 may be vertically separated from each other along the vertical channel 140, thereby forming the mold wing 102.

Figure 6A:
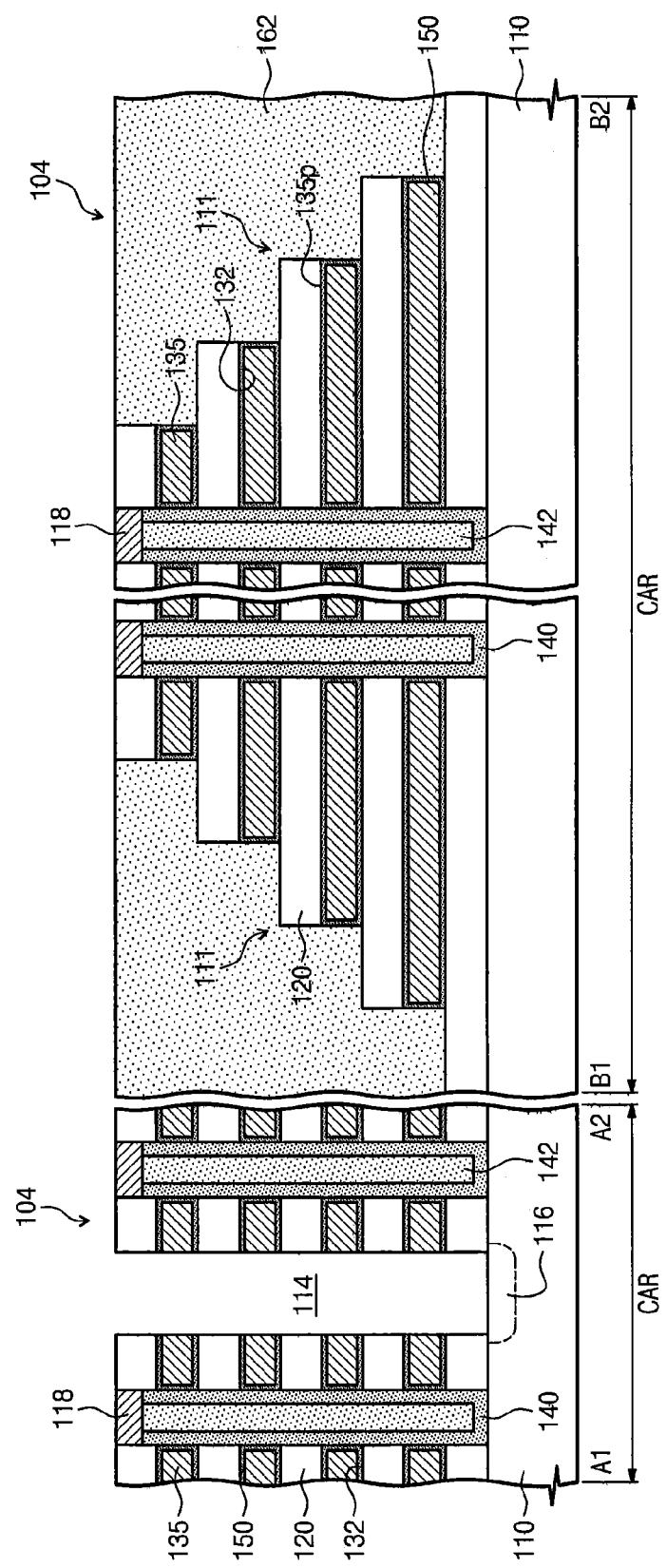
Figure 6B:
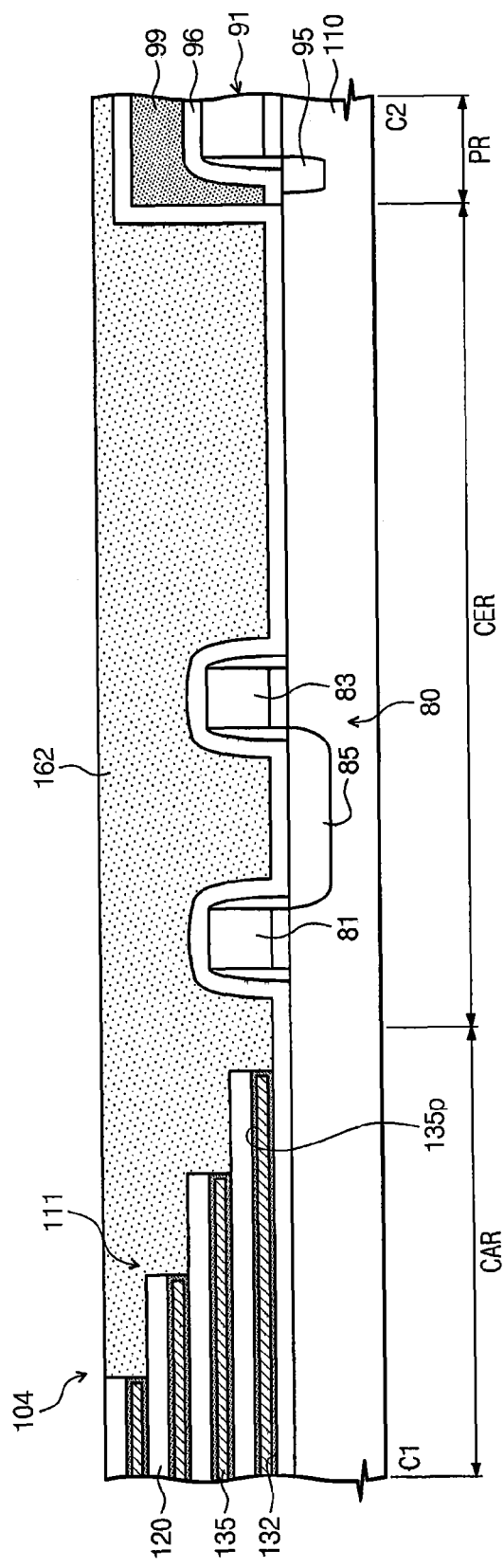

Referring to FIGS. 6A and 6B, a gate stack 104 may be formed by filling the recess regions 132 with a memory layer 150 and gates 135. The gate 135 may be formed to enclose the memory layer 150. The memory layer 150 may include a charge-trap insulating material or a variable resistance element. As an example, the memory layer 150 may include a tunnel insulating layer (e.g., SiO$_2$) adjacent to the mold insulating layer 120, a blocking insulating layer (e.g., SiO$_2$, Al$_2$O$_3$, SiO$_2$/Al$_2$O$_3$) adjacent to the gate 135, and a trap insulating layer (e.g., SiN) interposed therebetween. As another example, the memory layer 150 may be formed of or include a transition metal oxide. The gate 135 may be formed of or include a conductive material (e.g., tungsten, metal nitride, or metal silicides).

Impurities may be injected into the substrate 110 exposed by the word line cut 114 to form a common source 116 of a second conductivity type (e.g., n-type). The common source 116 may be shaped like a line extending in the direction B1-B2. A drain 118 of the second conductivity type may be formed in or on a top portion of the vertical channel 140. To form the drain 118, the top portion of the vertical channel 140 may be recessed and then be filled with a semiconductor layer. Alternatively, the drain 118 may be formed by injecting impurities into the top portion of the vertical channel 140. In some embodiments, the process of forming the drain 118 may be performed before the formation of the word line cut 114 (for example, after the vertical channel 140 of FIG. 3A).

Since the gates 135 are formed in the recess regions 132, the gates 135 may have the staircase structure 111, like the mold sacrificial layers 130. In other words, the gates 135 may be formed to have a truncated pyramid structure, whose horizontal length decreases in the direction away from the substrate 110, when viewed in a section crossing the line B1-B2. Thus, each of the gates 135 may have a portion (i.e., a pad 135$p$) that is uncovered by another thereon.

Figure 7B:
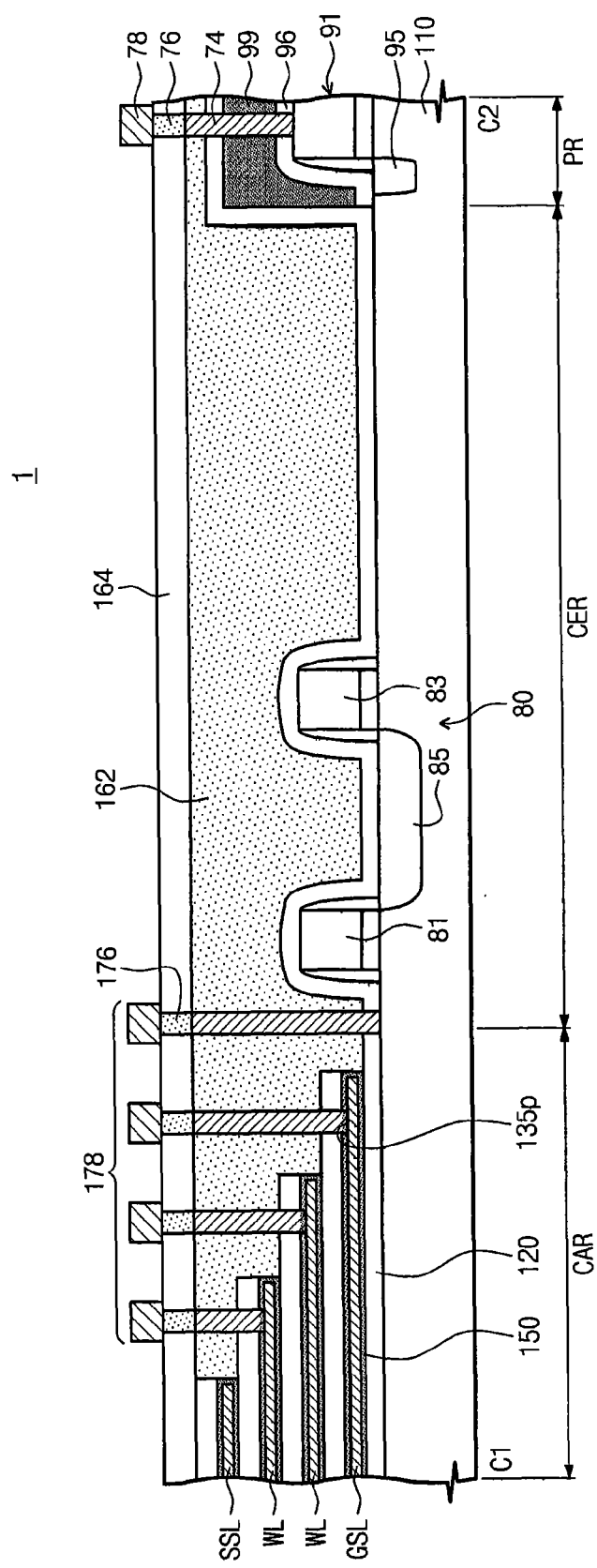

Referring to FIGS. 7A and 7B, on the cell array region CAR, bit lines 192 may be formed to be electrically connected to the vertical channels 140, and metal lines 178 may be formed to be electrically connected to the gates 135 and the substrate 110. On the peripheral region PR, metal lines 78 may be electrically connected to the peripheral transistor 91.

On the cell array region CAR, first contact plugs 174 may be electrically connected to the gates 135 and the substrate 110 through the capping insulating layer 162 and the mold insulating layers 120, and on the peripheral region PR, a lower contact plug 74 may be electrically connected to the peripheral transistor 91.

An interlayer insulating layer 164 may be formed on the substrate 110 to cover the gate stack 104 and fill the word line cut 114. On the cell array region CAR, second contact plugs 176 may be electrically connected to the drains 118 and the first contact plugs 174 through the interlayer insulating layer 164, and the bit line 192 and the metal lines 178 may be formed on the interlayer insulating layer 164 and may be electrically connected to the second contact plugs 176.

On the peripheral region PR, an upper contact plug 76 may be connected to the lower contact plug 74 through the interlayer insulating layer 164, and the metal line 78 may be formed on the interlayer insulating layer 164 and may be connected to the upper contact plug 76.

As another example, the formation of the interlayer insulating layer 164 and the second contact plugs 176 and upper contact plug 76 may be omitted.

In the present embodiment, the uppermost one of the gates 135 may serve as a string selection line SSL, the lowermost one of the gates 135 may serve as a ground selection line GSL, and the others therebetween may serve as word lines WL. The first contact plugs 174 may be in contact with the pads 135$p$ of the gates 135 and the common source 116. The ground selection line GSL, the word lines WL, and the string selection line SSL, which are vertically stacked along each of the vertical channels 140, may constitute a memory cell string 136.

The semiconductor device 1 may be fabricated through the above series of processes. As an example, if the memory layer 150 includes the tunnel insulating layer, the trap insulating layer, and the blocking insulating layer, the semiconductor device 1 may be a NAND FLASH memory device. As another example, if the memory layer 150 includes a transition metal oxide layer, the semiconductor device 1 may be a resistance memory device (e.g., Resistive Random-Access Memory RRAM).

In the present embodiment, the semiconductor device 1 may include the cell array region CAR, on which memory cells with the word lines WL are provided, the cell end region CER, on which the key pattern 80 is provided, and the peripheral region PR, on which peripheral circuits including the peripheral transistors 91 are provided. The memory layer 150 and the vertical channel 140 may have various shapes, as will be described below.

[Examples of Memory Layer and Vertical Channel]

Figure 8A:
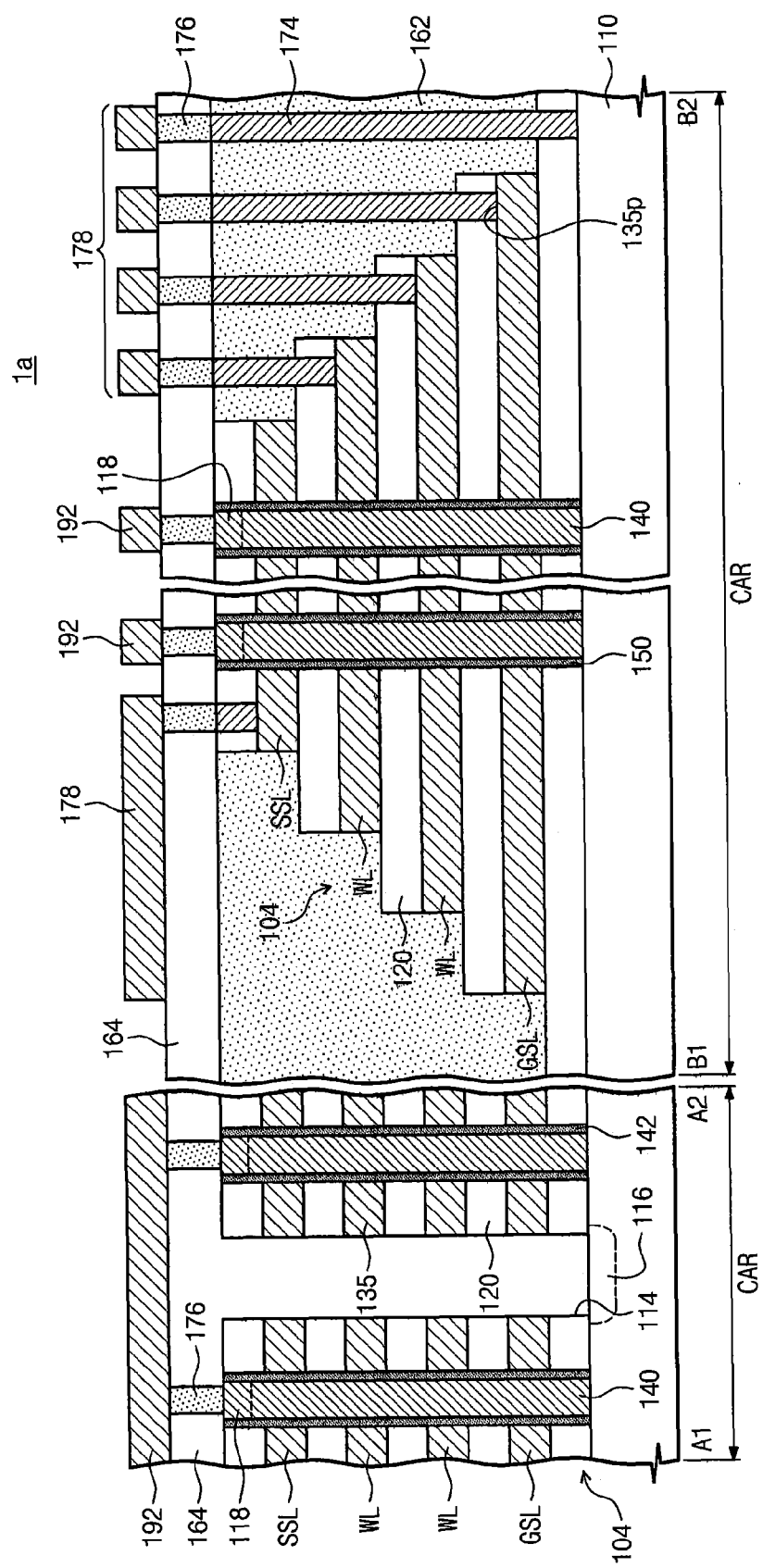
FIGS. 8A and 8B are sectional views illustrating examples of modifications of FIGS. 7A and 7B.
Figure 8B:
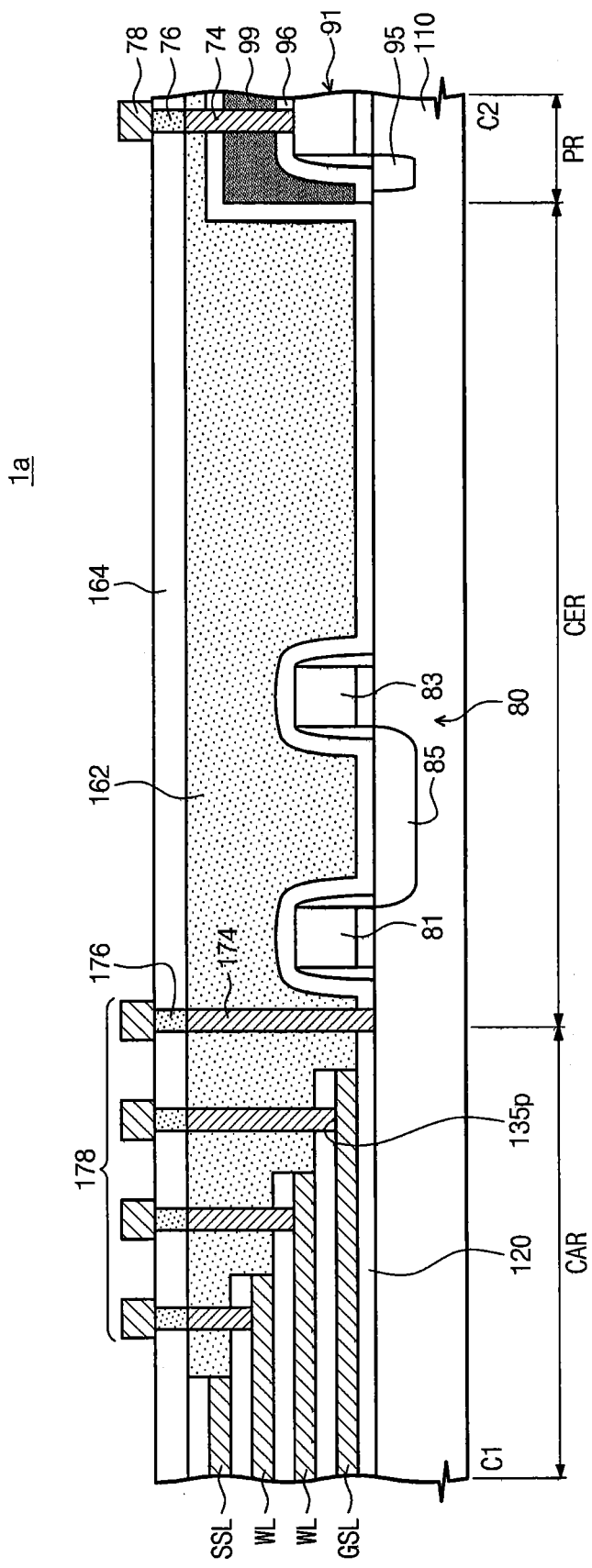
Figure 9A:
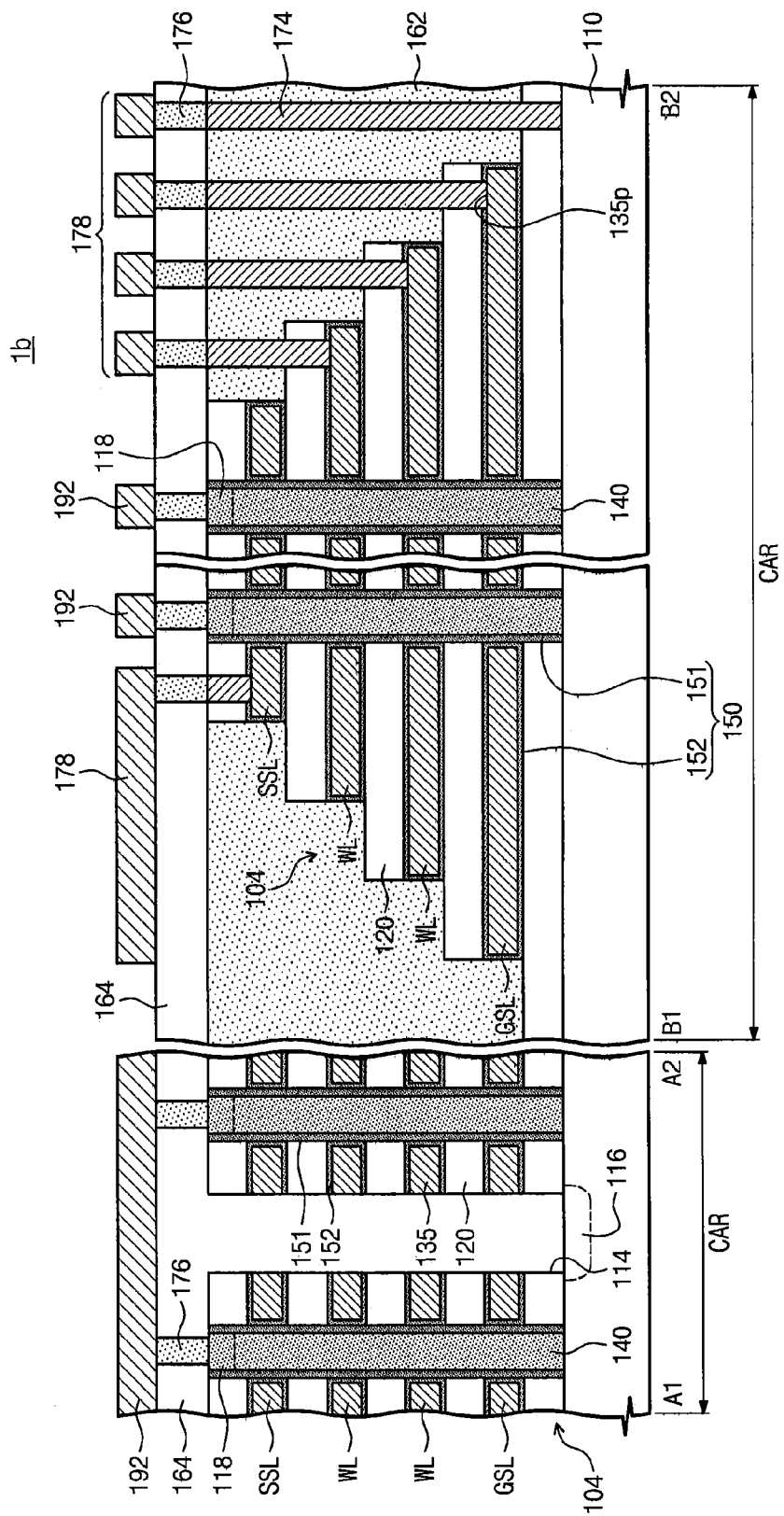
FIGS. 9A and 9B are sectional views illustrating examples of modifications of FIGS. 7A and 7B.
Figure 9B:
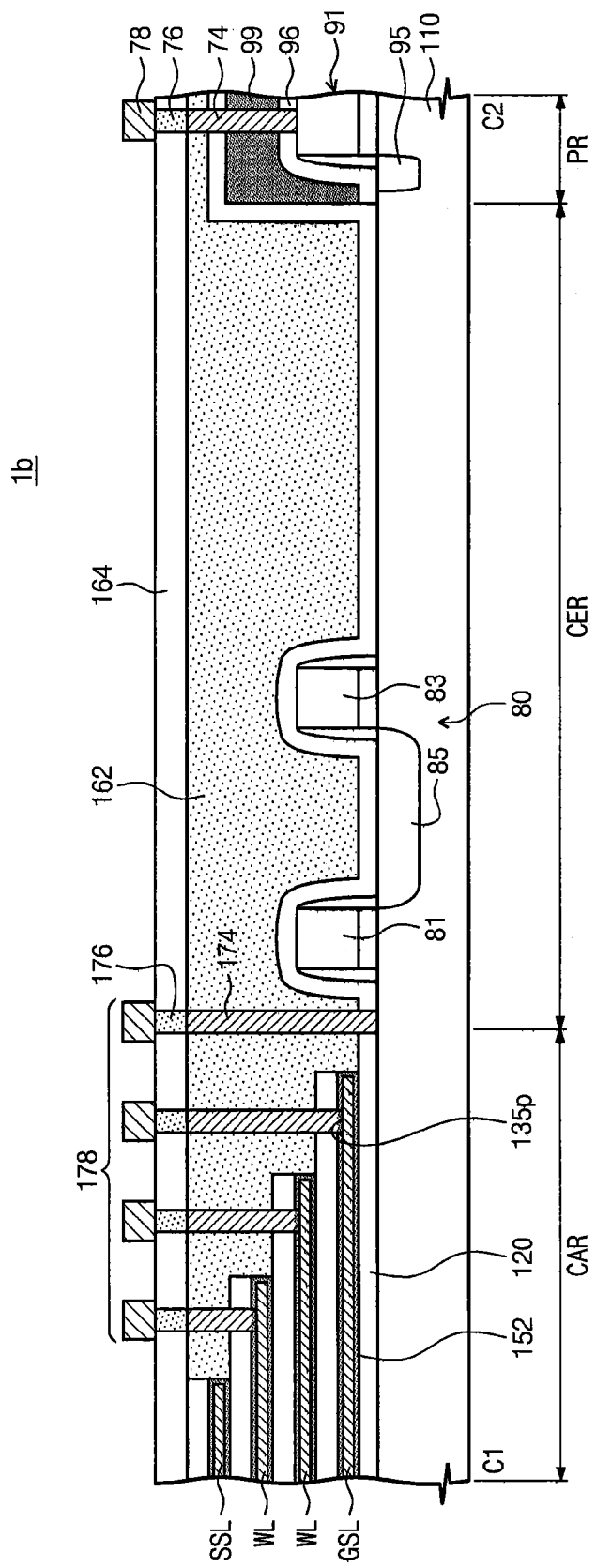

FIGS. 8A and 8B are sectional views illustrating some examples of modifications of FIGS. 7A and 7B. FIGS. 9A and 9B are sectional views illustrating examples of modifications of FIGS. 7A and 7B.

As shown in FIGS. 8A and 8B, a semiconductor device 1$a$ may include a memory layer 150 vertically extending along a pillar-shaped vertical channel 140. A drain 118 may be formed by injecting impurities into a top portion of the vertical channel 140.

As shown in FIGS. 9A and 9B, a semiconductor device 1$b$ may include a memory layer 150 including a first memory layer 151 vertically extending along a pillar-shaped vertical channel 140 and a second memory layer 152 enclosing a gate 135.

[Examples of Staircase Patterning Process]

FIGS. 10A through 10G are sectional views illustrating a staircase patterning process according to example embodiments of inventive concept.

Figure 10A:
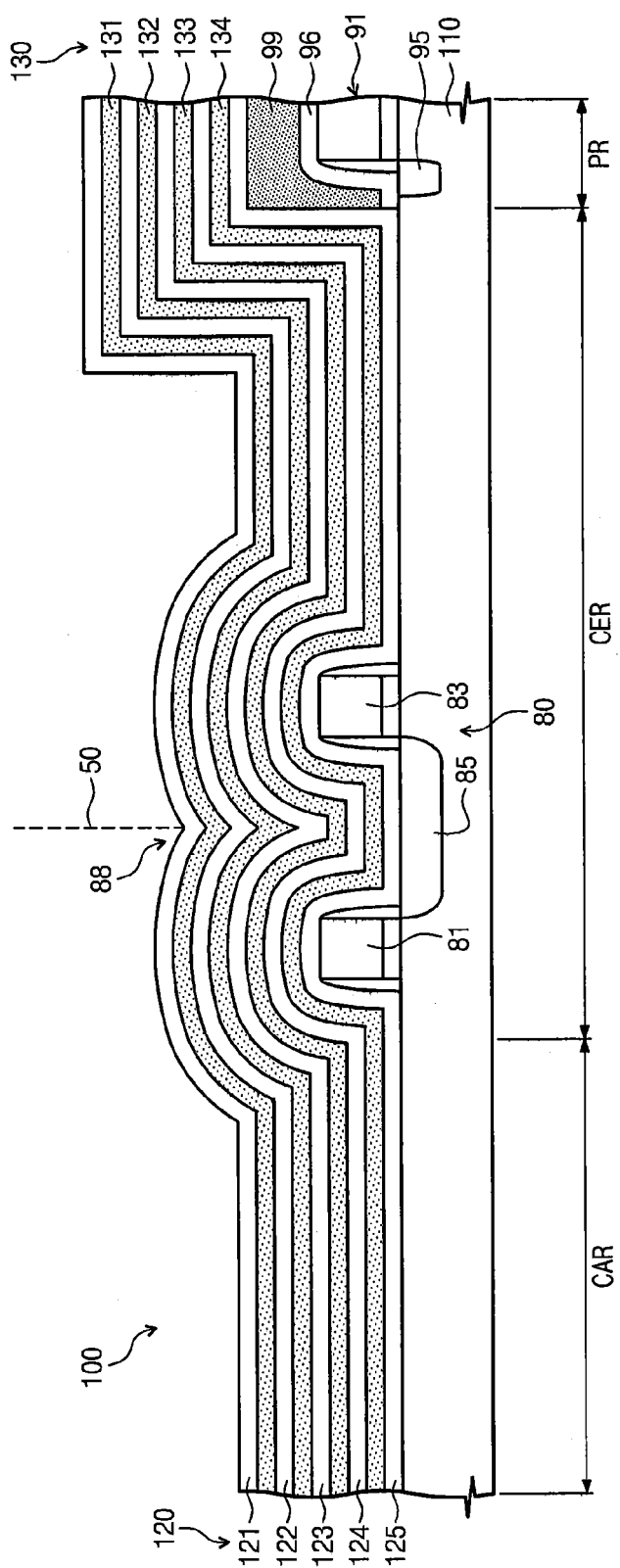
FIGS. 10A through 10G are sectional views illustrating a staircase patterning process according to example embodiments of the inventive concept.

Referring to FIG. 10A, a mold stack 100 formed on a cell end region CER may be formed to have a pair of knolls and a recessed valley 88 therebetween, on the key pattern 80. The valley 88 may serve as a reference 50, which can be perceived by a system (e.g., an in-line SEM) for measuring a critical dimension (CD) of patterns. The reference 50 may be shaped like a line extending in a direction (e.g., parallel to the line A1-A2 of FIG. 1A), when viewed in a plan view. The reference 50 may cross a region (e.g., a center) between the dummy patterns 81 and 83. Hereinafter, for convenience in description, the mold insulating layers 120 may be supposed to have first to fifth mold insulating layers 121-125, and the mold sacrificial layers 130 may be supposed to have first to fourth mold sacrificial layers 131-134.

Figure 10B:
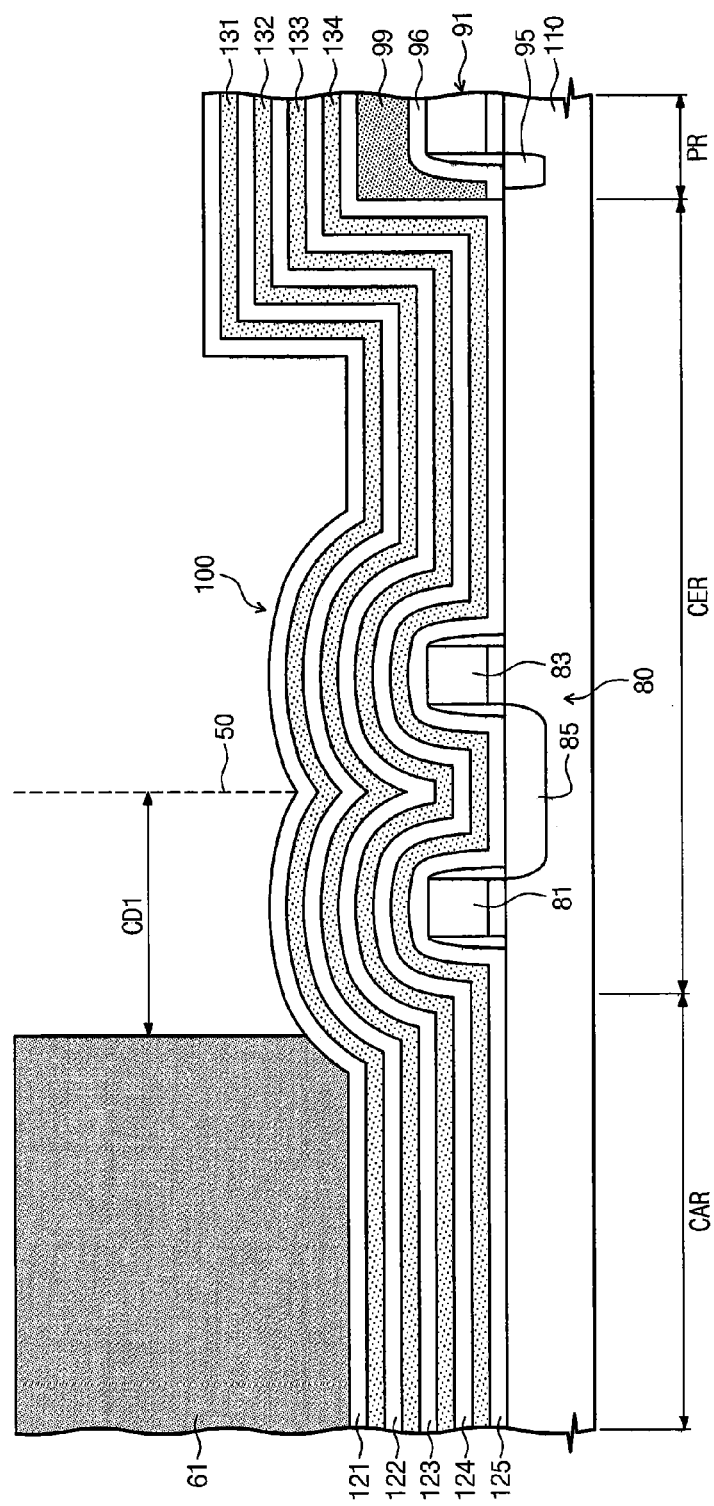

Referring to FIG. 10B, a first mask layer 61 may be formed on the first mold insulating layer 121 using a photolithography process. A first critical dimension CD1 between the first mask layer 61 and the reference 50 may be measured by, for example, an in-line SEM. In the present embodiment, since the reference 50 can be detected by the in-line SEM, the alignment of the first mask layer 61 may be monitored in real time before an etching process.

Figure 10C:
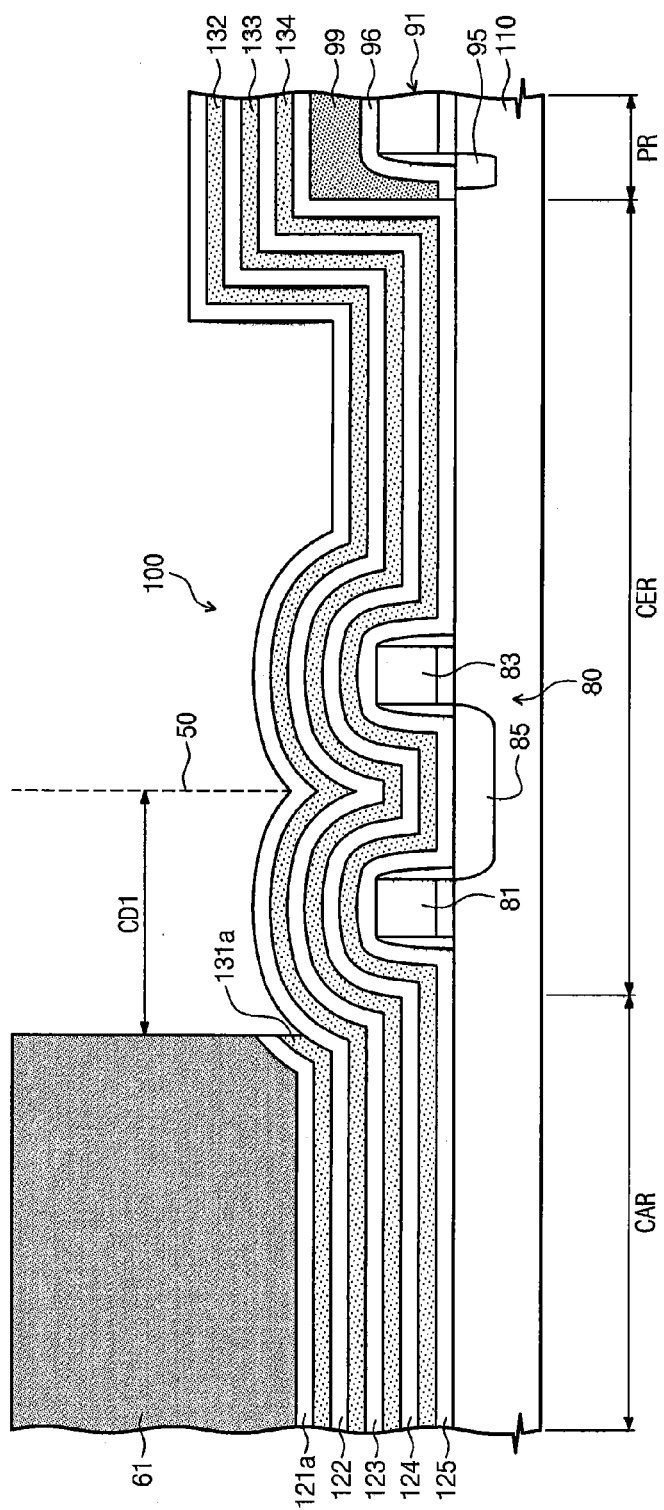

Referring to FIG. 10C, a first patterning step may be performed on the mold stack 100, and here, the first patterning step may include an etching process (e.g., a dry etching process), in which the first mask layer 61 is used as an etch mask. Accordingly, a first mold insulating layer 121$a$ and a first mold sacrificial layer 131$a$, which have been patterned once, may be formed. The first mask layer 61 may remain or be removed, after the first patterning step. After the first patterning step, the first critical dimension CD1 from the first mold insulating layer 121a and the first mold sacrificial layer 131a to the reference 50 may be inspected to know whether the first patterning step is performed normally. The first critical dimension CD1 may be monitored by for example the in-line SEM, in real time, after the etching process.

In the present embodiment, the first critical dimension CD1 may be monitored in a real time manner, directly after each of the photolithography and etching processes. The reference 50 may be defined by the uppermost layer of the mold stack 100, even when the first mold insulating layer 121 and the first mold sacrificial layer 131 have been patterned. In other words, the presence of the reference 50 can be still perceived by the in-line SEM, without deterioration in distinctness of its image, and this makes it possible to reduce or minimize an error or failure in measuring the critical dimension.

Figure 10D:
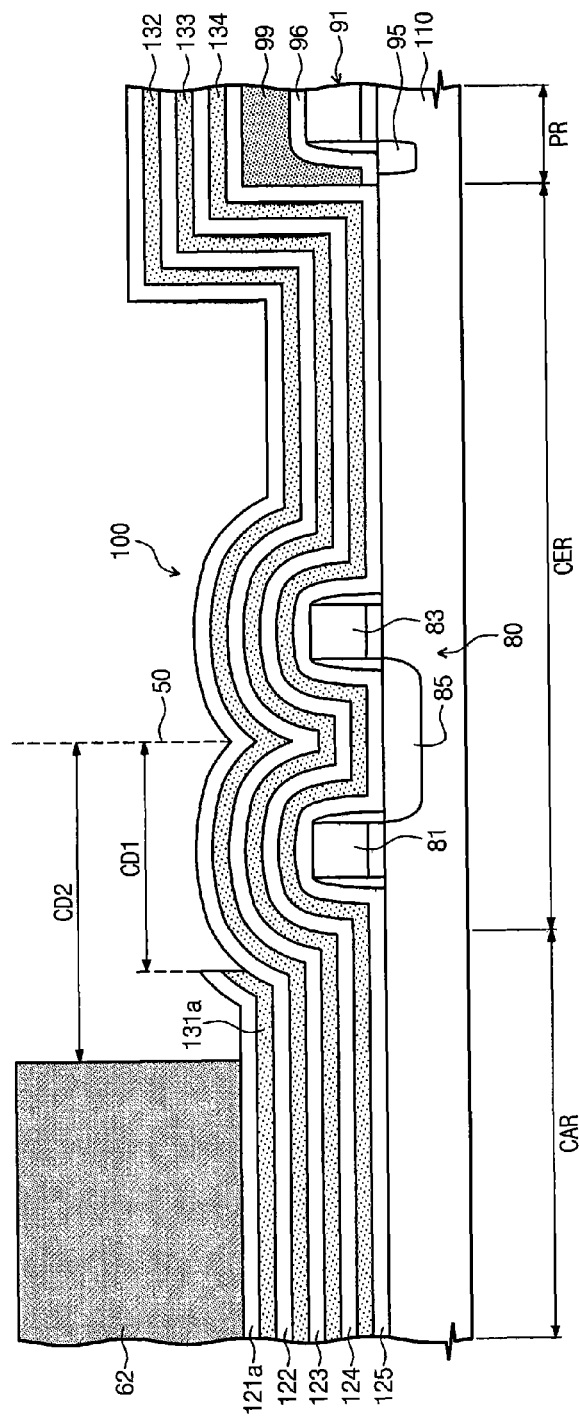

Referring to FIG. 10D, the first mask layer 61 may be trimmed to form a second mask layer 62 with a reduced width. Alternatively, the first mask layer 61 may be removed, and then, the second mask layer 62 may be formed by a photolithography process. A second critical dimension CD2 between the second mask layer 62 and the reference 50 may be monitored in real time by the in-line SEM. Here, a critical dimension of the pad 135p of FIG. 6B may be given by a difference between the first and second critical dimensions CD1 and CD2. In some embodiments, the first critical dimension CD1 may be measured again before or after the measuring of the second critical dimension CD2.

Figure 10E:
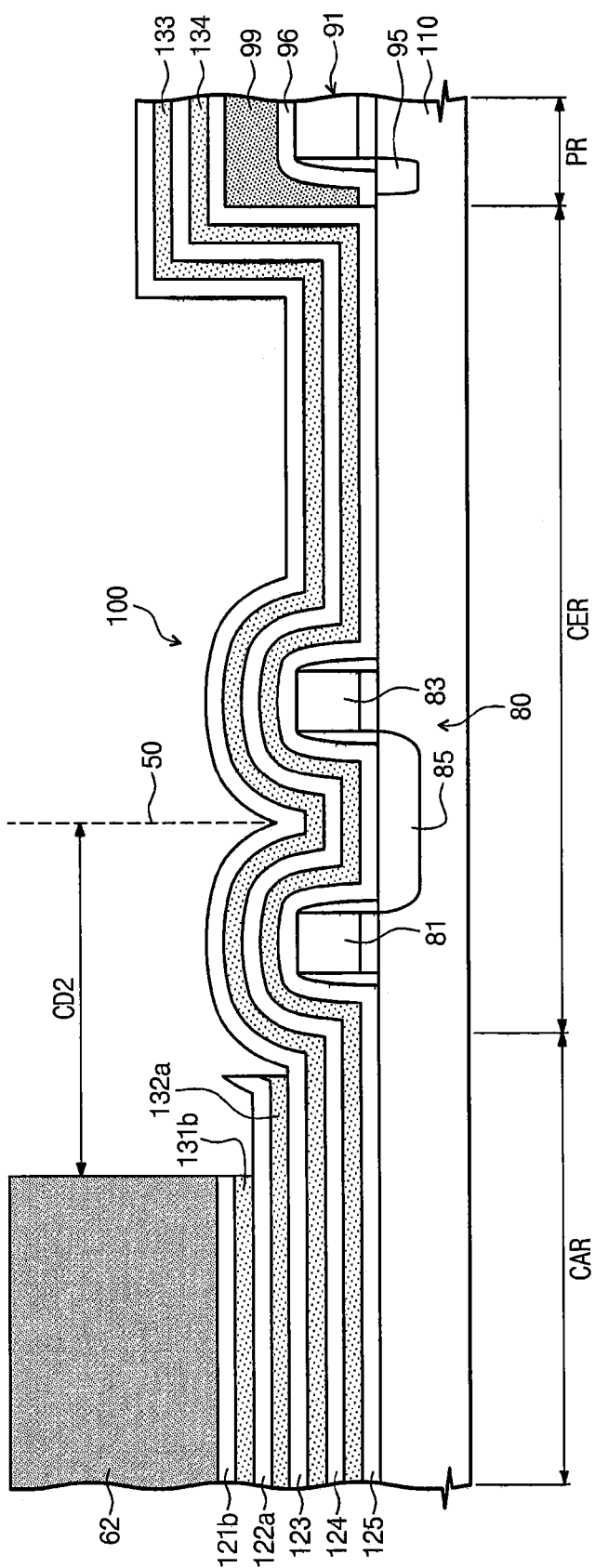

Referring to FIG. 10E, a second patterning step may be performed on the mold stack 100, and here, the second patterning step may include an etching process, in which the second mask layer 62 is used as an etch mask. Accordingly, a first mold insulating layer 121b and a first mold sacrificial layer 131b, which have been patterned twice, may be formed, and at the same time, a second mold insulating layer 122a and a second sacrificial insulating layer 132a, which have been patterned once, may be formed. The first mold insulating layer 121a and the first mold sacrificial layer 131a, which have been patterned once, may serve as an etch mask in a process of etching the second mold insulating layer 122 and the second mold sacrificial layer 132. After the second patterning step, the second critical dimension CD2 from the first mold insulating layer 121b and the first mold sacrificial layer 131b to the reference 50 may be monitored in real time.

Figure 10F:
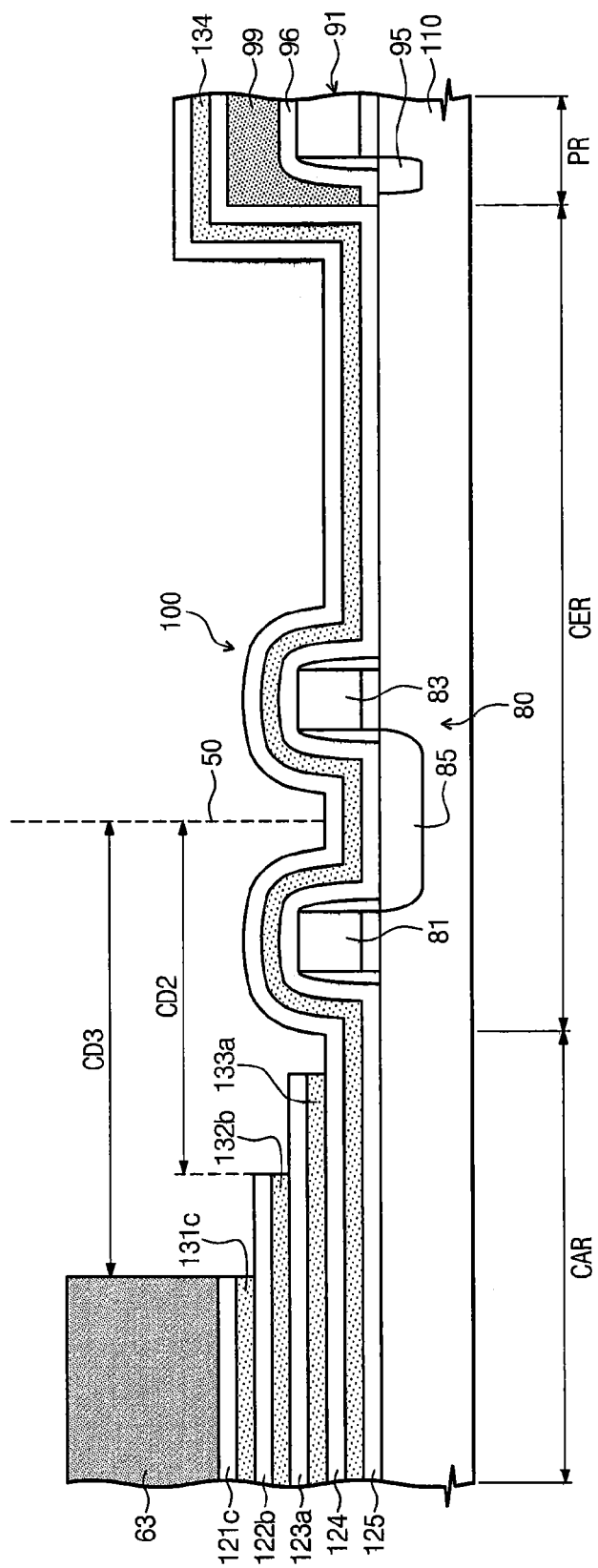

Referring to FIG. 10F, the second mask layer 62 may be trimmed to form a third mask layer 63 with a reduced width, and then, a third patterning step including an etching process using the third mask layer 63 as an etch mask may be performed on the mold stack 100. Alternatively, the second mask layer 62 may be removed, and then, a photolithography process may be performed to form the third mask layer 63. As a result of the third patterning step, a first mold insulating layer 121c and a first mold sacrificial layer 131c, which have been patterned three time, may be formed, a second mold insulating layer 122b and a second mold sacrificial layer 132b, which have been patterned twice, may be formed, and a third mold insulating layer 123a and a third mold sacrificial layer 133a, which have been patterned once, may be formed. During the third patterning step, not only the first mold insulating layer 121b and the first mold sacrificial layer 131b but also the second mold insulating layer 122a and the second sacrificial insulating layer 132a may be used as an etch mask.

Before the etching process of the third patterning step, a third critical dimension CD3 between the third mask layer 63 and the reference 50 may be monitored in real time using, for example, the in-line SEM. In addition, after the etching process of the third patterning step, the third critical dimension CD3 from the first mold insulating layer 121c and the first mold sacrificial layer 131c to the reference 50 may be monitored in real time using, for example, the in-line SEM. Here, the critical dimension of the pad 135p of FIG. 6B may be given by a difference between the second and third critical dimensions CD2 and CD3. In some embodiments, the second critical dimension CD2 may be re-measured, before and after the measurement of the third critical dimension CD3.

In the case where a portion of the mold stack 100 between the dummy patterns 81 and 83 is removed, the valley 88 of FIG. 10A may have a faint shape. In this case, the reference 50 may be provided in the form of stripe or plate between the dummy patterns 81 and 83, when viewed in a plan view.

Figure 10G:
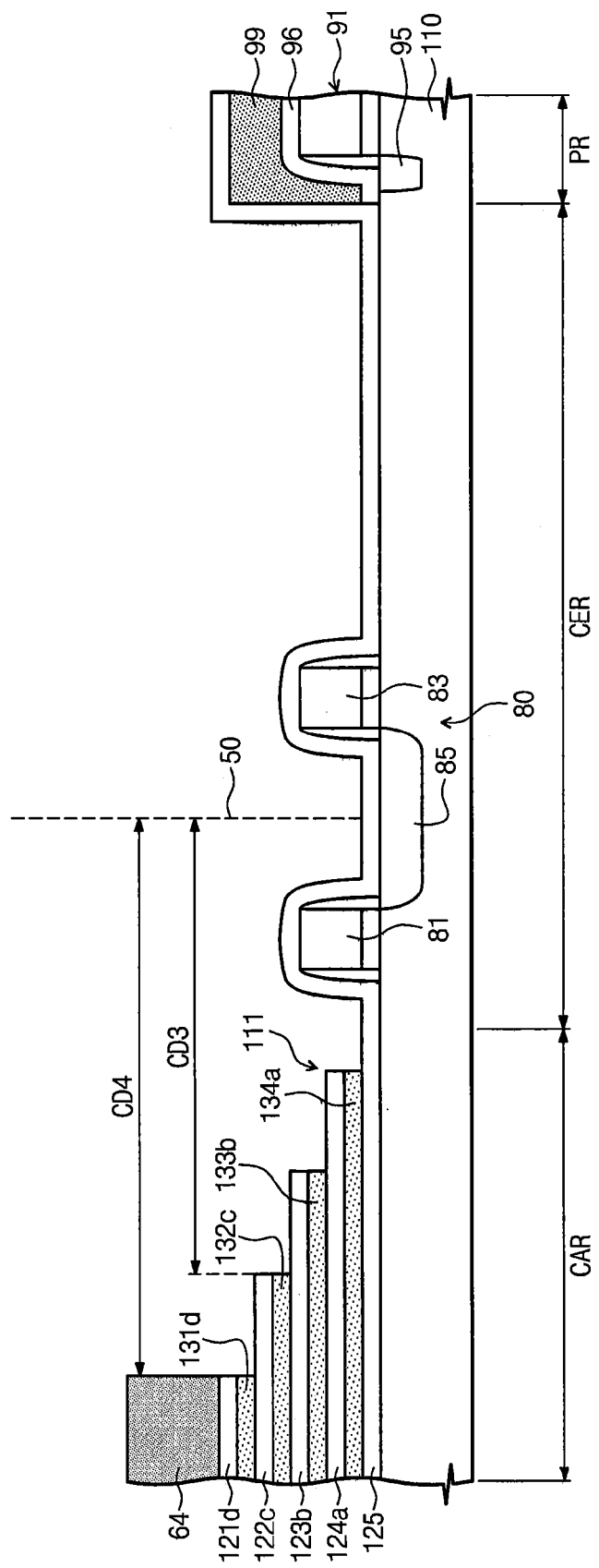

Referring to FIG. 10G, the third mask layer 63 may be trimmed to form a fourth mask layer 64 with a reduced width, and then, a fourth patterning step including an etching process using the fourth mask layer 64 as an etch mask may be performed on the mold stack 100 of FIG. 10F. In some embodiments, the third mask layer 63 may be removed, and then, a photolithography process may be performed to form the fourth mask layer 64. As a result of the fourth patterning step, a first mold insulating layer 121d and a first mold sacrificial layer 131d, which have been patterned four times, may be formed, a second mold insulating layer 122c and a second mold sacrificial layer 132c, which have been patterned thrice, may be formed, a third mold insulating layer 123b and a third mold sacrificial layer 133b, which have been patterned twice, may be formed, and a fourth mold insulating layer 124a and a fourth mold sacrificial layer 134a, which have been patterned once, may be formed. During the fourth patterning step, the first, second, and third mold insulating layer 121c, 122b, and 123a and the first, second, and third mold sacrificial layers 131c, 132b, and 133a may be used as an etch mask. A staircase structure 111 may be formed on a substrate 110 by the staircase patterning process.

Before the etching process of the fourth patterning step, a fourth critical dimension CD4 between the fourth mask layer 64 and the reference 50 may be monitored in real time using, for example, the in-line SEM. In addition, after the etching process of the fourth patterning step, the fourth critical dimension CD4 from the first mold insulating layer 121d and the first mold sacrificial layer 131d to the reference 50 may be monitored in real time using, for example, the in-line SEM. Here, the critical dimension of the pad 135p of FIG. 6B may be given by a difference between the third and fourth critical dimensions CD3 and CD4. In some embodiments, the third critical dimension CD3 may be re-measured, before and after the measurement of the fourth critical dimension CD4. The reference 50 may be provided in the form of stripe or plate between the dummy patterns 81 and 83, when viewed in a plan view.

[Examples of Staircase Patterning Process]

Figure 11B:
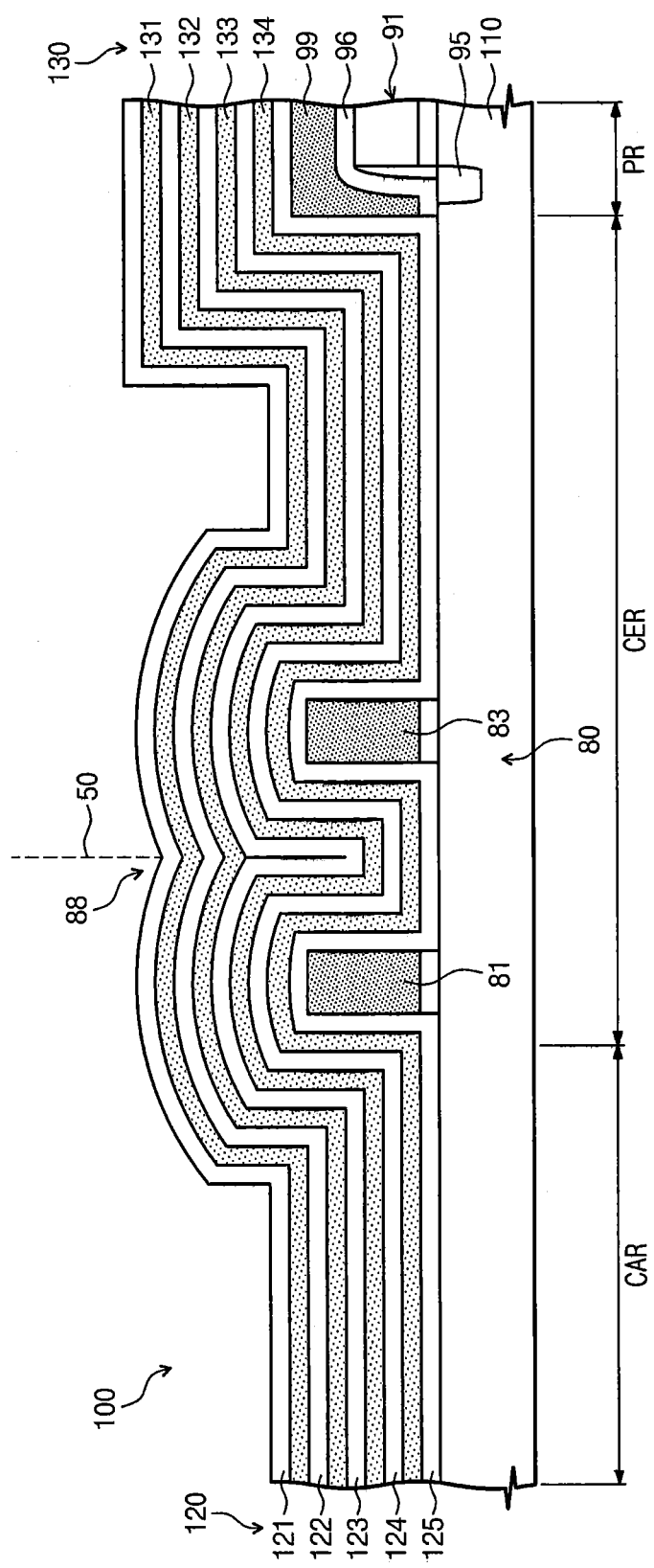
Figure 11C:
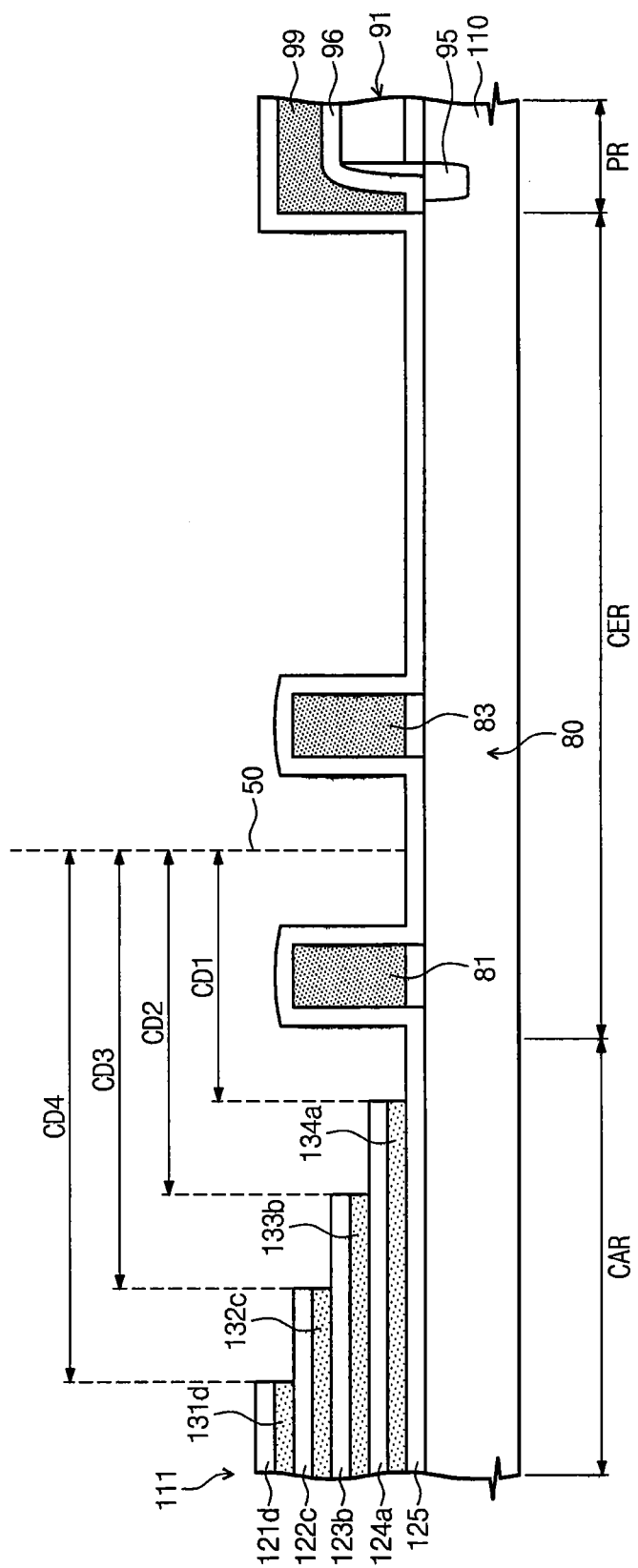
Figure 11D:
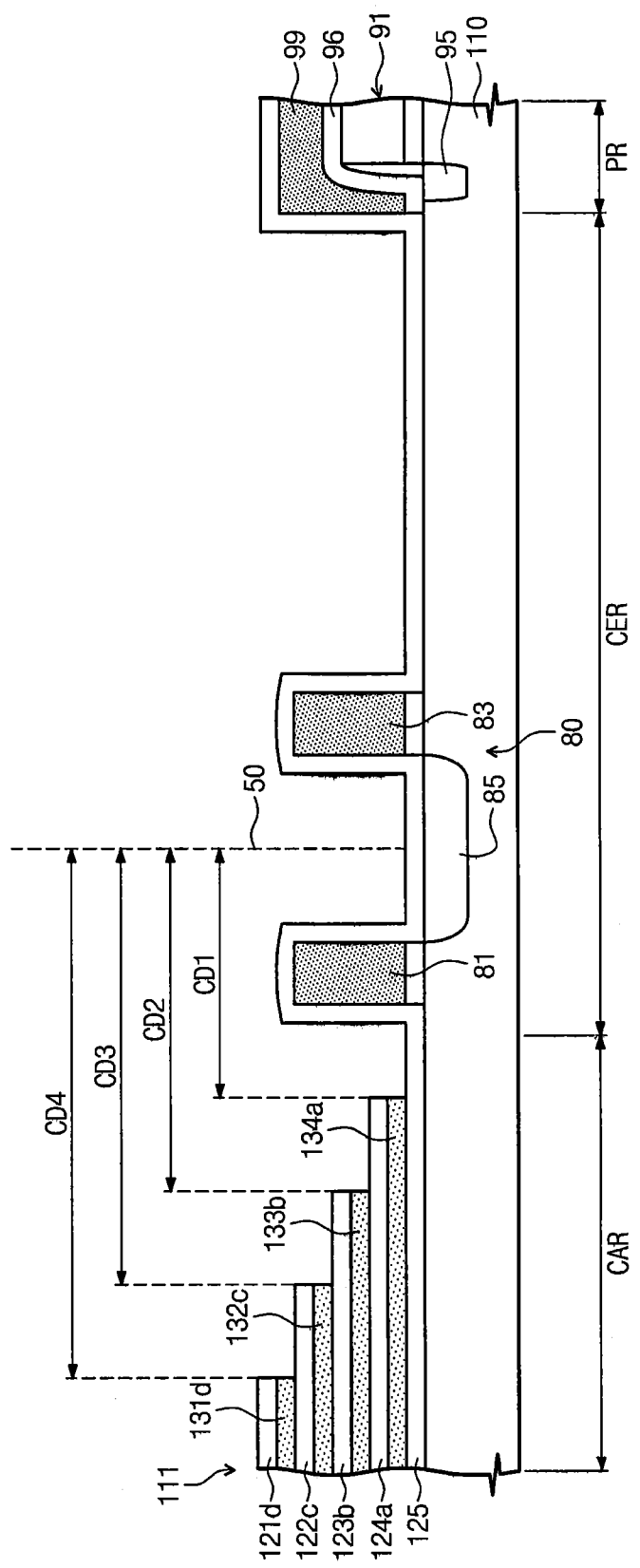
FIG. 11D is a sectional view illustrating an example modified from FIG. 11C.

FIGS. 11A through 11C are sectional views illustrating a staircase patterning process according to example embodiments of the inventive concept. FIG. 11D is a sectional view illustrating an example modified from FIG. 11C. For the sake of brevity, the elements and features of this example that are similar to those previously shown and described with reference to FIGS. 10A through 10G will not be described in much further detail.

Referring to FIG. 11A, a key pattern 80 may be formed as insulating blocks and formed from an insulating layer 99. For example, a peripheral transistor 91 may be formed on the substrate 110, an insulating material (e.g., a silicon oxide layer) may be deposited thereon, and then, a cell open photolithography process and an etching process may be performed to form the insulating layer 99 locally covering the peripheral transistor 91. The cell open photolithography and the etching process may be performed to remove the insulating material from the cell array region CAR and the cell end region CER but remain a portion of the insulating material on the cell end region CER, and in this case, the remaining portions of the insulating layer 99 may include a pair of dummy patterns 81 and 83.

An etch stop layer 96 may be further formed to locally cover the peripheral transistor 91, before the formation of the insulating layer 99, and here, the etch stop layer 96 may be formed of an insulating material (e.g., a silicon nitride layer). In this case, the key pattern 80 may further include portions of the etch stop layer 96, which are respectively provided below the dummy patterns 81 and 83.

Referring to FIG. 11B, a plurality of mold insulating layers 120 and a plurality of mold sacrificial layers 130 may be alternatingly stacked to form a mold stack 100. On the cell end region CER, the mold stack 100 may be formed to have a pair of knolls and a recessed valley 88 therebetween, on the key pattern 80, and here, the valley 88 may serve as a reference 50. The reference 50 may be positioned at a center of the pair of dummy patterns 81 and 83.

Referring to FIG. 11C, a staircase patterning process may be performed in the same or similar manner as that described with reference to FIGS. 10B through 10G to form a staircase structure 111 on the substrate 110. During the staircase patterning process, the first to fourth critical dimensions CD1-CD4 may be monitored in real time before and/or after each etching process. As another example, as shown in FIG. 11D, the key pattern 80 may further include a trench insulating layer 85 between the dummy patterns 81 and 83.

[Examples of Staircase Patterning Process]

FIGS. 12A through 12F are sectional views illustrating a staircase patterning process according to example embodiments of the inventive concept. FIG. 12G is a sectional view illustrating an example modified from FIG. 12A. For the sake of brevity, the elements and features of this example that are similar to those previously shown and described with reference to FIGS. 10A through 10G will not be described in much further detail.

Figure 12A:
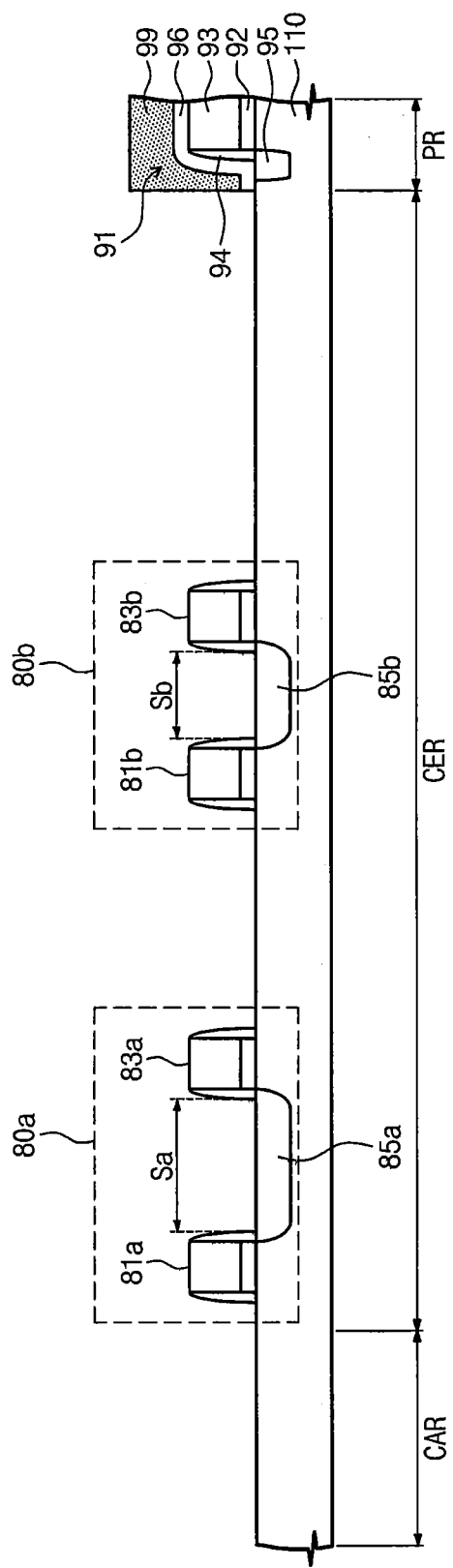
FIGS. 12A through 12F are sectional views illustrating a staircase patterning process according to example embodiments of the inventive concept.

Referring to FIG. 12A, at least two key patterns 80a and 80b may be formed on a cell end region CER of a substrate 110. A first key pattern 80a may include a pair of first dummy patterns 81a and 83a, which are provided to have the same or similar structure as that of the peripheral transistor 91, and a first trench insulating layer 85a. A second key pattern 80b may include a pair of second dummy patterns 81b and 83b, which are provided to have the same or similar structure as that of the peripheral transistor 91, and a second trench insulating layer 85b. The first key pattern 80a may be provided more adjacent to the cell array region CAR, compared with the second key pattern 80b.

A first space Sa between the first dummy patterns 81a and 83a may be equal to or different from a second space Sb between the second dummy patterns 81b and 83b. Hereinafter, for the sake of brevity, the description that follows will refer to an example of the present embodiment in which the second space Sb is smaller than the first space Sa. In other words, the second key pattern 80b may be provided to have a smaller space than that of the first key pattern 80a.

Figure 12B:
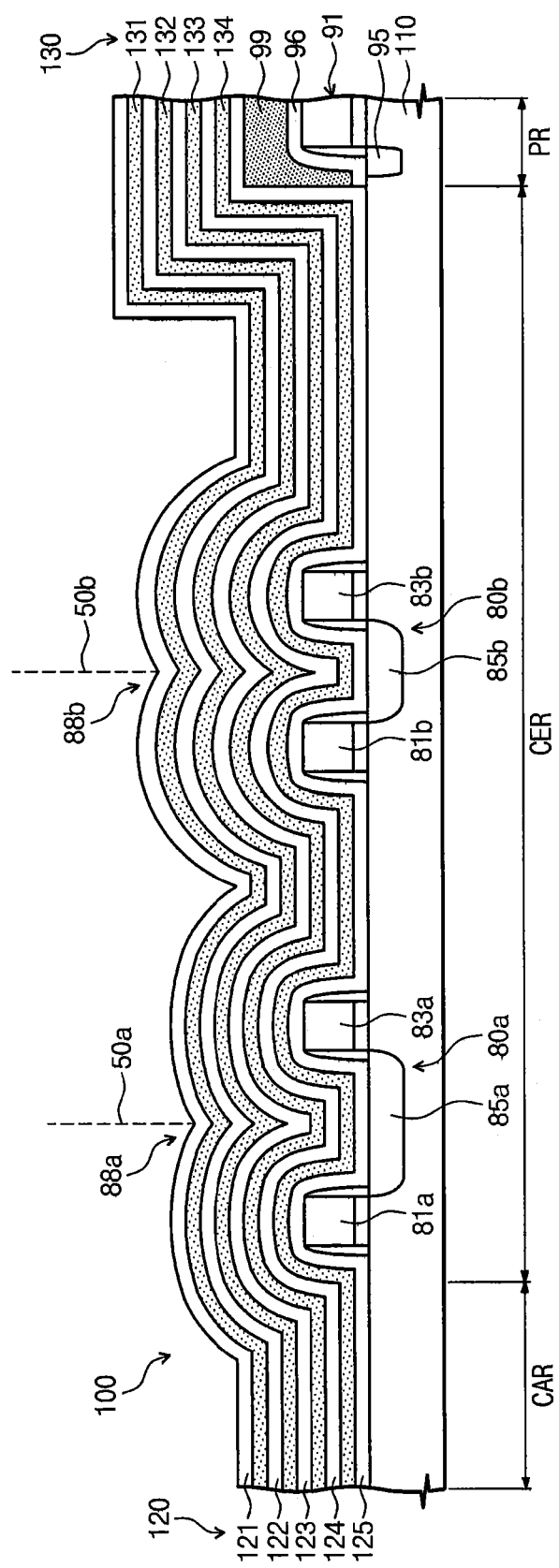

Referring to FIG. 12B, a plurality of mold insulating layers 120 and a plurality of mold sacrificial layers 130 may be alternatingly stacked to form a mold stack 100. The mold stack 100 provided on the cell end region CER may be formed to have a pair of knolls and a first valley 88a therebetween, on the first key pattern 80a, and similarly, a pair of knolls and a second valley 88b therebetween, on the second key pattern 80b. The first valley 88a may serve as a first reference 50a, and the second valley 88b may serve as a second reference 50b.

The first reference 50a may be closer to the cell array region CAR than the second reference 50b does. In the case where the second space Sb is smaller than the first space Sa, the second valley 88b may be formed to have a sharper profile, compared to that of the first valley 88a. This configuration allows the second reference 50b to be more clearly perceived by the inspection system (e.g., the in-line SEM), compared with the first reference 50a.

Figure 12C:
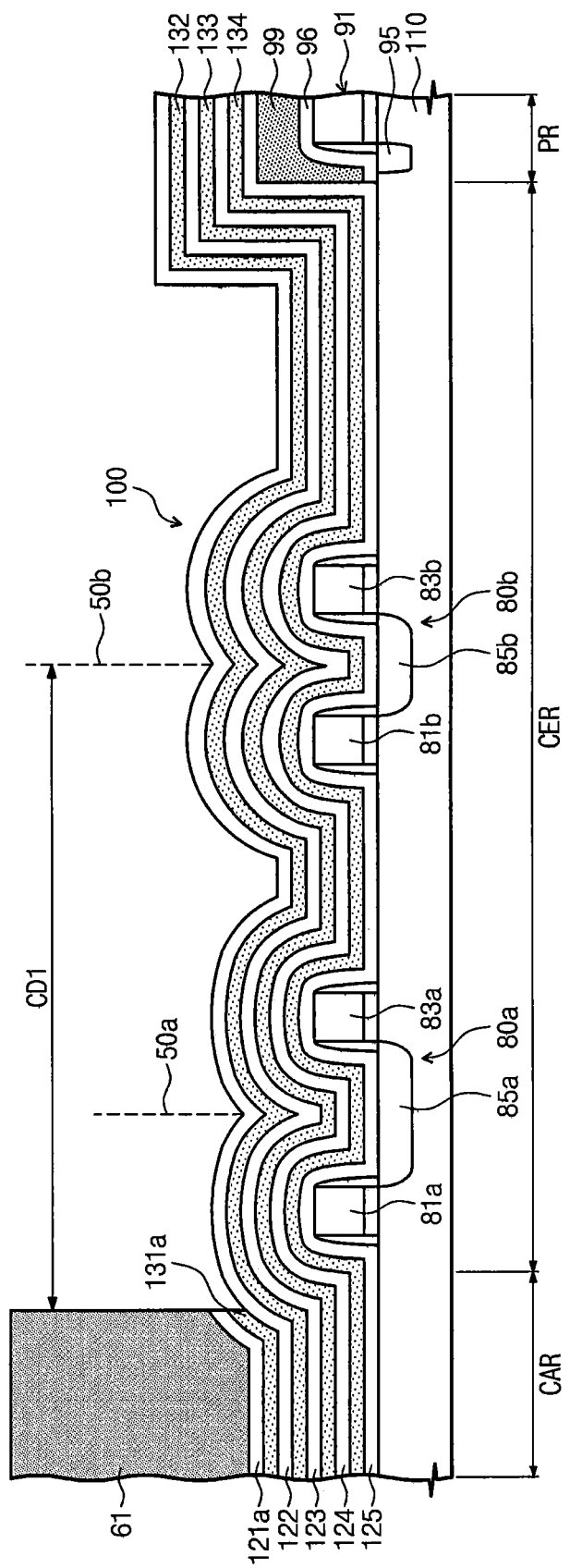

Referring to FIG. 12C, a first mask layer 61 may be formed, and before performing a first patterning step on the mold stack 100, a first critical dimension CD1 between the first mask layer 61 and the second reference 50b may be monitored in a real time manner. In the present embodiment, the real-time monitoring of the first critical dimension CD1 may be performed, based on the second reference 50b, whose profile is sharper than that of the first reference 50a. This makes it possible to perform CD measurement with improved precision and reliability.

After the monitoring of the first critical dimension CD1, a first patterning step including an etching process using the first mask layer 61 as an etch mask may be performed on the mold stack 100 to form a first mold insulating layer 121a and a first mold sacrificial layer 131a, which have been patterned once. After the etching process, the first critical dimension CD1 from the first mold insulating layer 121a and the first mold sacrificial layer 131a to the second reference 50b may be monitored in a real time manner.

Figure 12D:
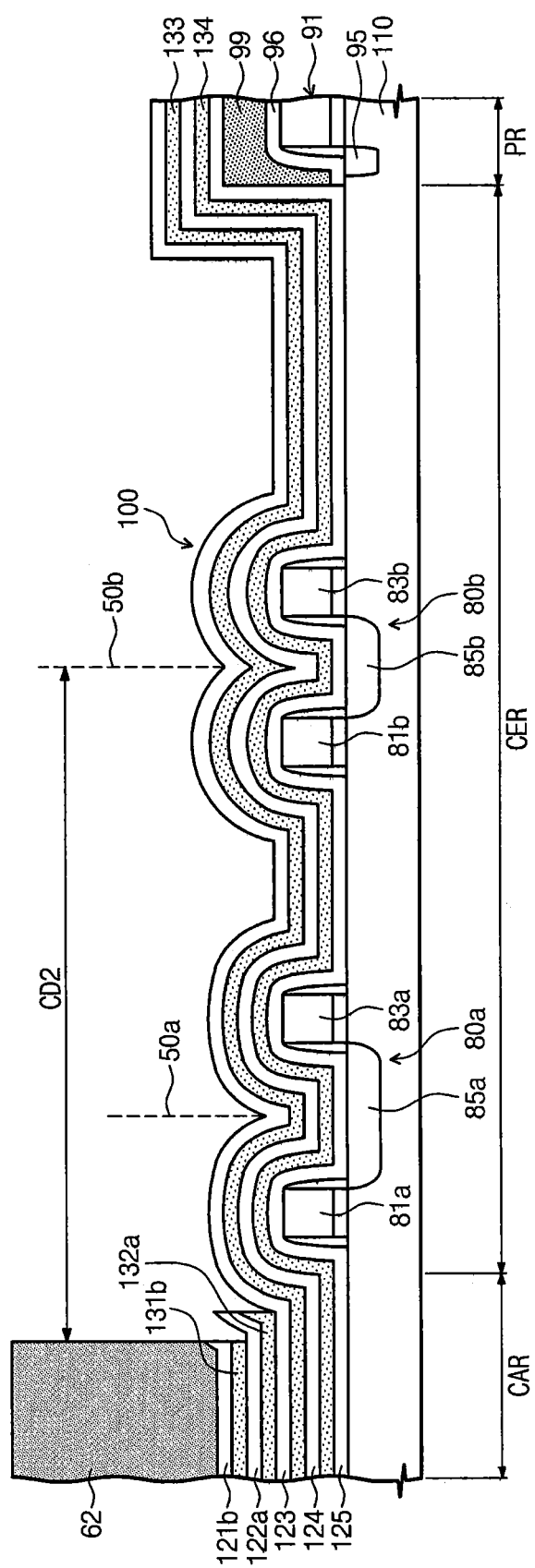

Referring to FIG. 12D, a second mask layer 62 with a reduced width may be formed by a trimming of the first mask layer 61 or a photolithography process, and then, a second critical dimension CD2 between the second mask layer 62 and the second reference 50b may be monitored in a real time manner, before performing a second patterning step on the mold stack 100. Thereafter, a second patterning step including an etching process using the second mask layer 62 as an etch mask may be performed on the mold stack 100 to form a first mold insulating layer 121b and a first mold sacrificial layer 131b, which have been patterned twice, and a second mold insulating layer 122a and a second mold sacrificial layer 132a, which have been patterned once. After the etching process, the second critical dimension CD2 from the first mold insulating layer 121b and the first mold sacrificial layer 131b to the second reference 50b may be monitored in a real time manner.

Figure 12E:
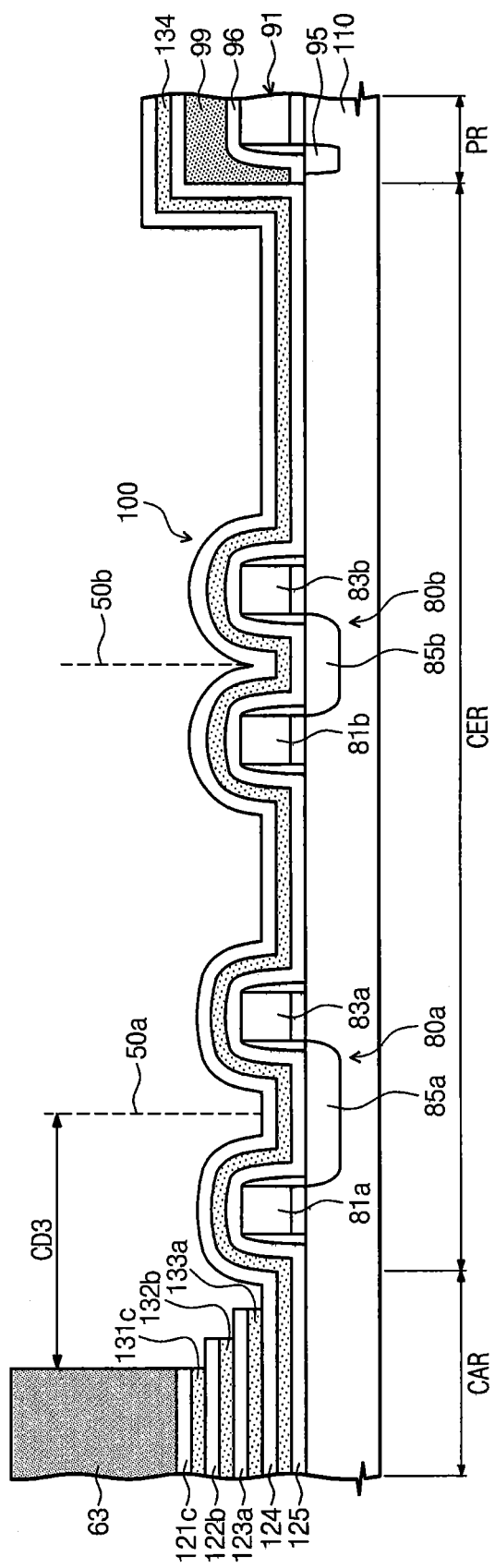

Referring to FIG. 12E, a third mask layer 63 with a reduced width may be formed by a trimming of the second mask layer 62 or a photolithography process, and then, a third critical dimension CD3 may be monitored in a real time manner, before performing a third patterning step on the mold stack 100. In example embodiments, the real-time monitoring of the third critical dimension CD3 may be performed based on the first reference 50a. For example, in the case where a patterning process is repeatedly performed on the mold stack 100, a distance between the third mask layer 63 and the second reference 50b may be increased, and this may lead to deterioration in precision or reliability on a measured value of the third critical dimension CD3. According to example embodiments of the inventive concept, to avoid this difficulty, the first reference 50a adjacent to the cell array region CAR may be used to monitor the third critical dimension CD3 in a real time manner.

Thereafter, a third patterning step including an etching process using the third mask layer 63 as an etch mask may be performed on the mold stack 100 to form a first mold insulating layer 121c and a first mold sacrificial layer 131c, which have been patterned three times, a second mold insulating layer 122b and a second mold sacrificial layer 132b, which have been patterned twice, and a third mold insulating layer 123a and a third mold sacrificial layer 133a, which have been patterned once. After the etching process, the third critical dimension CD3 from the first mold insulating layer 121c and the first mold sacrificial layer 131c to the first reference 50a may be monitored in a real time manner.

Figure 12F:
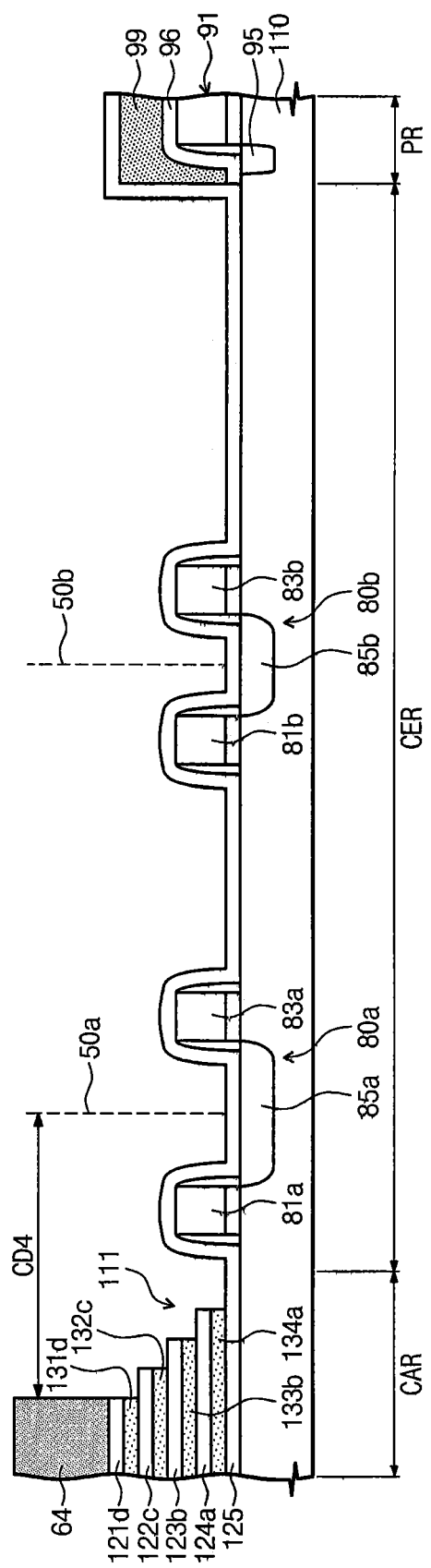
Figure 12G:
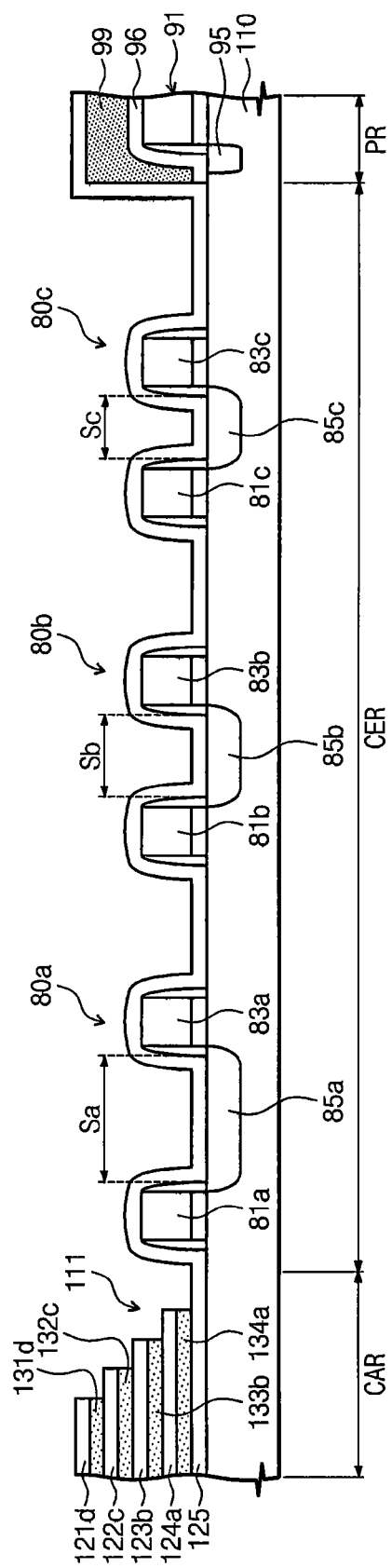
FIG. 12G is a sectional view illustrating an example modified from FIG. 12A.

Referring to FIG. 12F, a fourth mask layer 64 with a reduced width may be formed by a trimming of the third mask layer 63 or a photolithography process, and then, a fourth critical dimension CD4 between the fourth mask layer 64 and the first reference 50a may be monitored in a real time manner, before the fourth patterning step on the mold stack 100. Thereafter, a fourth patterning step including an etching process using the fourth mask layer 64 as an etch mask may be performed on the mold stack 100 to form a first mold insulating layer 121d and a first mold sacrificial layer 131d, which have been patterned four times, a second mold insulating layer 122c and a second mold sacrificial layer 132c, which have been patterned three times, a third mold insulating layer 123b and a third mold sacrificial layer 133b, which have been patterned two times, and a fourth mold insulating layer 124a and a fourth mold sacrificial layer 134a, which have been patterned once. A staircase structure 111 may be formed on the substrate 110 by the staircase patterning process. After the etching process of the fourth patterning step, the fourth critical dimension CD4 from the first mold insulating layer 121d and the first mold sacrificial layer 131d to the first reference 50a may be monitored in a real time manner.

As another example, as shown in FIG. 12G, a third key pattern 80c, in addition to the first and second key patterns 80a and 80b, may be further formed on the cell end region CER of the substrate 110. The third key pattern 80c may include a pair of third dummy patterns 81c and 83c, which are provided to have the same or similar structure as that of the peripheral transistor 91, and a third trench insulating layer 85c. The first key pattern 80a may be closer to the cell array region CAR than the second key pattern 80b does, and the second key pattern 80b may be closer to the cell array region CAR than the third key pattern 80c does.

The third space Sb between the third dummy patterns 81c and 83c may be equal to or similar to the first space Sa and/or the second space Sb. Hereinafter, for the sake of brevity, the description that follows will refer to an example of the present embodiment in which the second space Sb is smaller than the first space Sa, and the third space Sc is smaller than the second space Sb.

A staircase structure 111 may be formed on the substrate 110 using the same or similar process to that described with reference to FIGS. 12B through 12F. For example, in initial, intermediate, and final stages of the staircase patterning process, the third key pattern 85c, the second key pattern 85b, and the first key pattern 80a may be sequentially used as a reference for monitoring a critical dimension in a real time manner.

Fabrication Process: Example Embodiments

FIGS. 13A, 14A, 15A, 16A and 17A are sectional views taken along the lines D1-D2 and E1-E2 of FIG. 1B to illustrate a method of fabricating a semiconductor device, according to example embodiments of the inventive concept. FIGS. 13B, 14B, 15B, 16B and 17B are sectional views taken along the line F1-F2 of FIG. 1B to illustrate a method of fabricating a semiconductor device, according to example embodiments of the inventive concept.

Figure 13A:
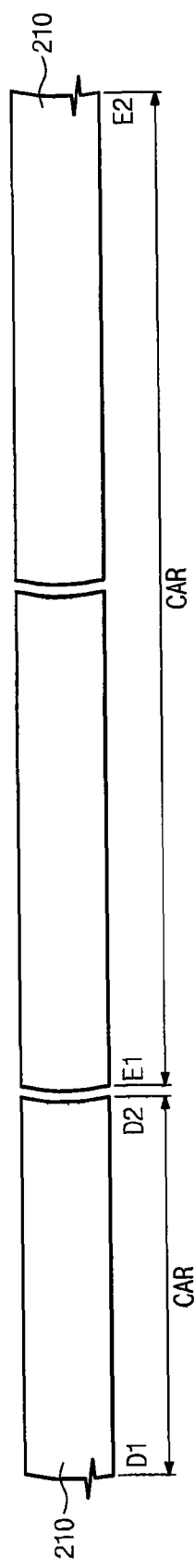
FIGS. 13A, 14A, 15A, 16A and 17A are sectional views taken along the lines D1-D2 and E1-E2 of FIG. 1B to illustrate a method of fabricating a semiconductor device according to example embodiments of the inventive concept.

Referring to FIGS. 13A and 13B, a key pattern 80, at least one peripheral transistor 91, and an insulating layer 99 locally covering the peripheral transistor 91 may be formed on a substrate 210. The insulating layer 99 may be formed by depositing an insulating material and performing a cell open photolithography and etching process thereon. An etch stop layer 96 may be additionally formed to locally cover the peripheral transistor 91, before the formation of the insulating layer 99. The substrate 210 may be a semiconductor substrate, for example, a doped single crystalline silicon wafer of a first conductivity type (e.g., p-type) and may include a cell array region CAR provided with memory cells, a peripheral region PR provided with a peripheral circuit including the peripheral transistor 91, and a cell end region CER, which is a portion of the cell array region CAR adjacent to the peripheral region PR, and on which the key pattern 80 is provided.

The peripheral transistor 91 may be a structure including a gate insulating layer 92, a gate 93, and a spacer 94. The key pattern 80 may include at least one pair of dummy patterns 81 and 83, which are provided to have the same or similar structure as the peripheral transistor 91, and a trench insulating layer 85 between the dummy patterns 81 and 83. The trench insulating layer 85 may be formed at the same time as a device isolation layer 95, which may be formed on the peripheral region PR.

Figure 14A:
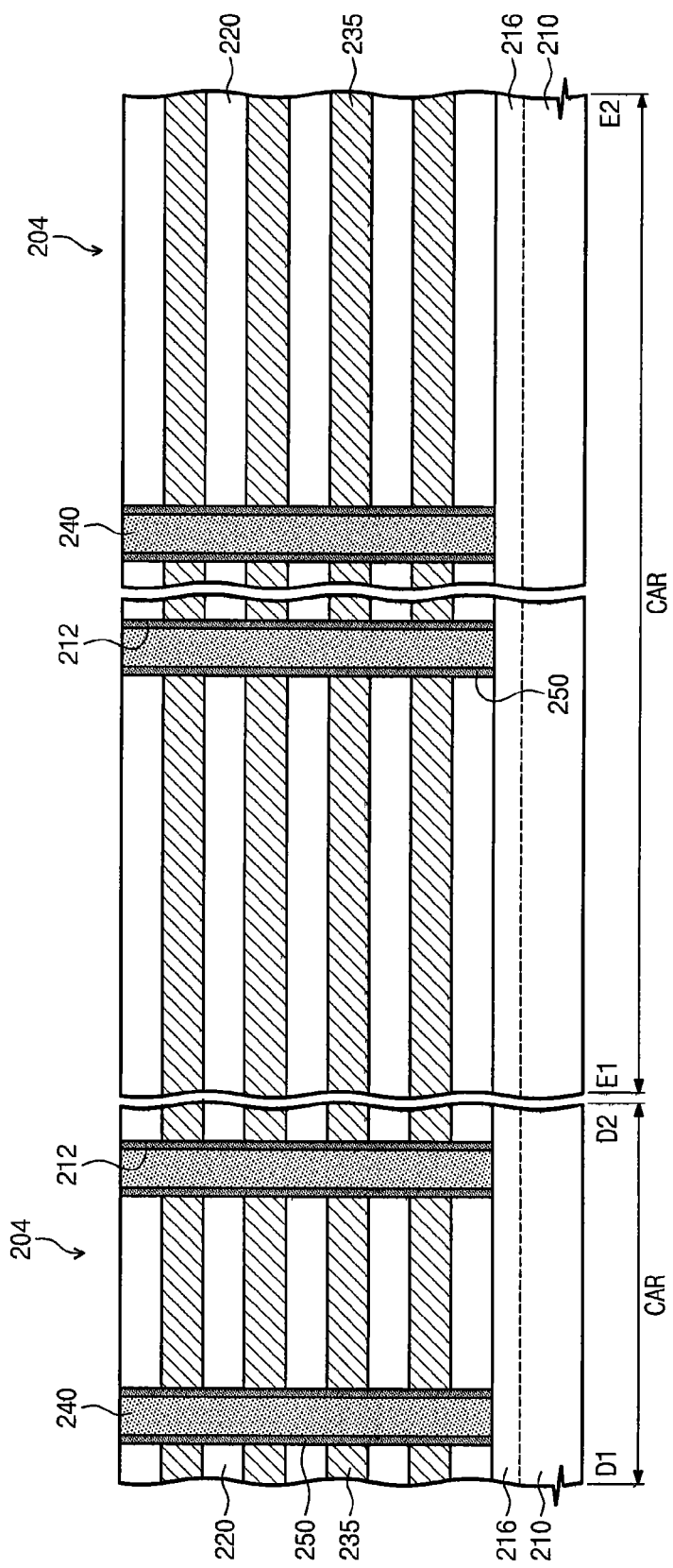
Figure 14B:
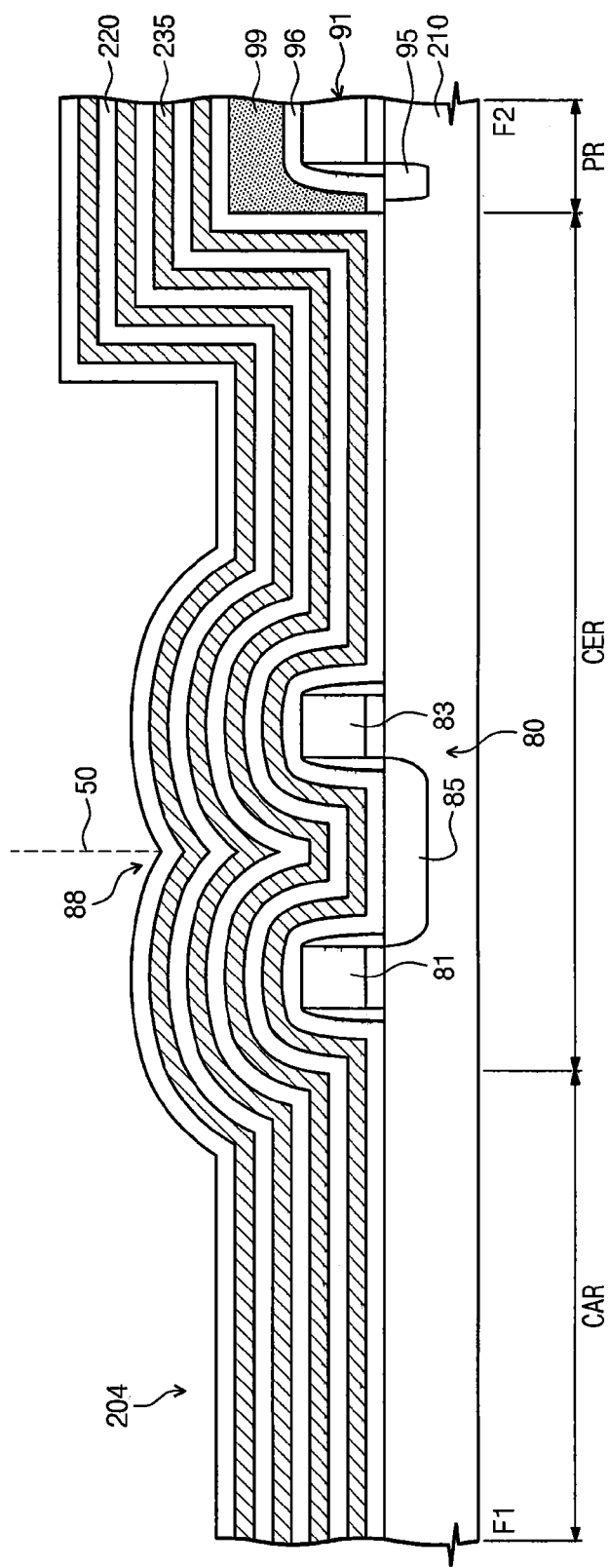

Referring to FIGS. 14A and 14B, a gate stack 204 may be formed on the substrate 210, and a memory layer 250 and a vertical channel 240 may be formed to penetrate the gate stack 204. As an example, mold insulating layers 220 and gates 235 may be alternatingly stacked to form the gate stack 204. The gate stack 204 may be formed on the entire top surface of the substrate 210 (for example, on the cell array region CAR, the cell end region CER, and the peripheral region PR). The vertical channel 240 may be formed on the cell array region CAR. The mold insulating layers 220 may include an insulating material (e.g., silicon oxide or silicon nitride), and the gates 235 may include a conductive material (e.g., silicon or metals).

The gate stack 204 may be etched (for example, using a dry etching process) to form a vertical hole 212 penetrating the gate stack 204, the memory layer 250 may be formed to vertically extend along an inner surface of the vertical hole 212, and then, the vertical channel 240 may be formed to be enclosed by the memory layer 250. The memory layer 250 may include a tunnel insulating layer, a trap insulating layer, and a blocking insulating layer or include a transition metal oxide layer. The vertical channel 240 may be formed to have a pillar shape. As another example, the vertical channel 240 may be formed to have a cylindrical shape, as shown in FIG. 3A. Before the formation of the gate stack 204, a common source 216 of a second conductivity type (e.g., n-type) may be formed by injecting impurities into the substrate 210. The vertical channel 240 may be electrically connected to the common source 216.

On the cell end region CER, the gate stack 204 may be formed to have a pair of knolls and a recessed valley 88 on the key pattern 80, as shown in FIG. 14B, and here, the valley 88 may be provided between the knolls to serve as a reference 50. The valley 88 may extend in a direction (for example, parallel to the line D1-D2 of FIG. 1B.

Figure 15A:
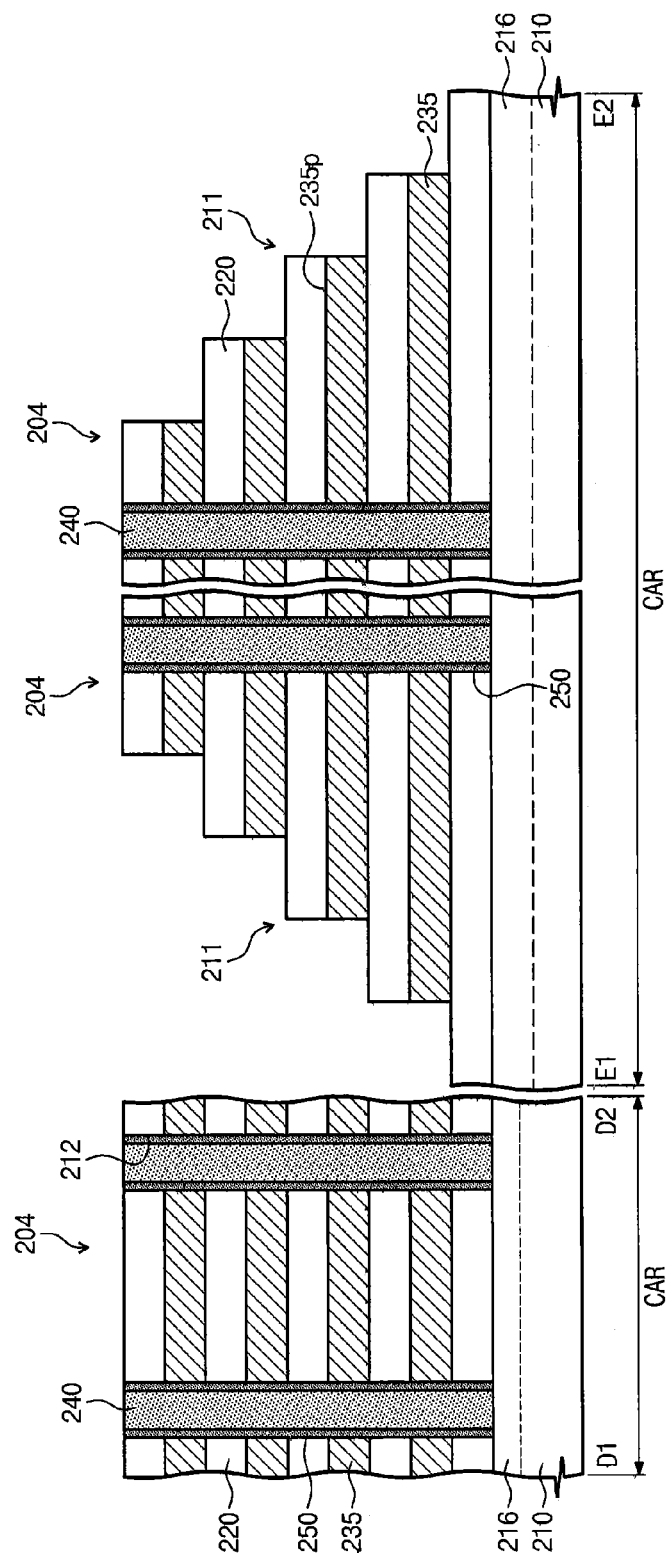
Figure 15B:
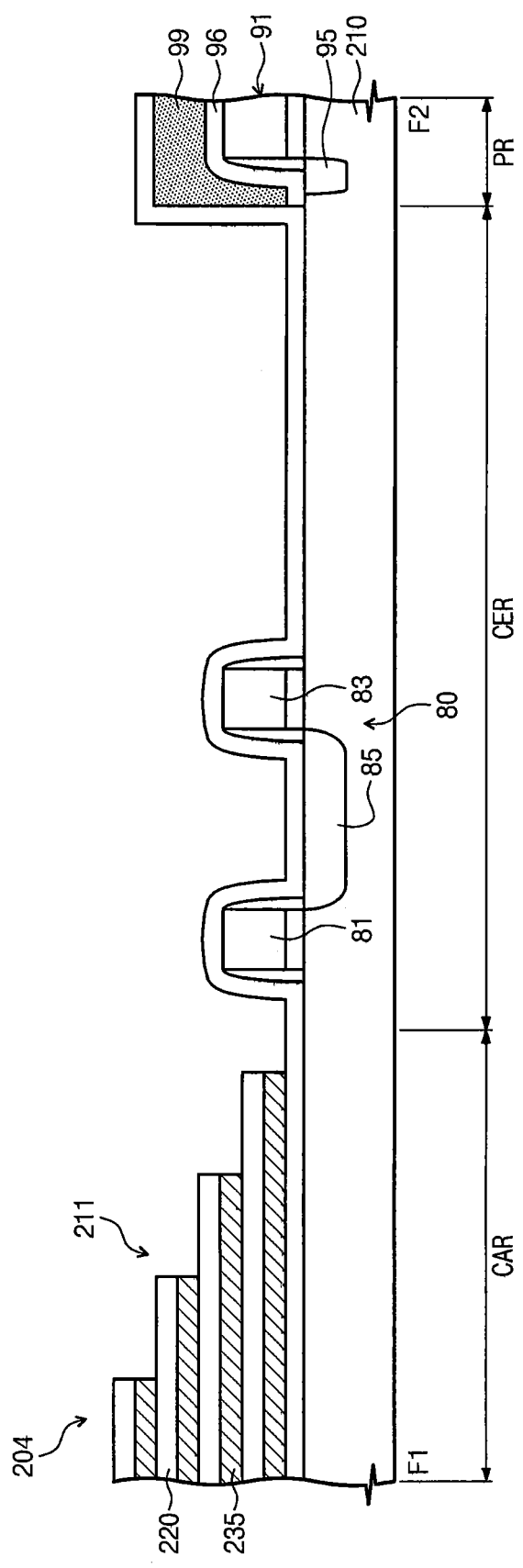

Referring to FIGS. 15A and 15B, the gate stack 204 may be patterned to form a staircase structure 211 on the cell array region CAR. The mold insulating layers 220 and/or the gates 235 may have a length discretely decreasing in a direction away from the substrate 210, when viewed in both of vertical sections crossing the lines D1-D2 and E1-E2. Thus, each of the gates 235 may have a portion (i.e., a pad 235p) that is uncovered by another thereon. The staircase structure 211 may be formed using one (e.g., disclosed described with reference to FIGS. 10A through 10G) of the staircase patterning processes disclosed in the present application. As another example, the staircase structure 211 may be formed after the formation of the vertical channel 240.

Figure 16A:
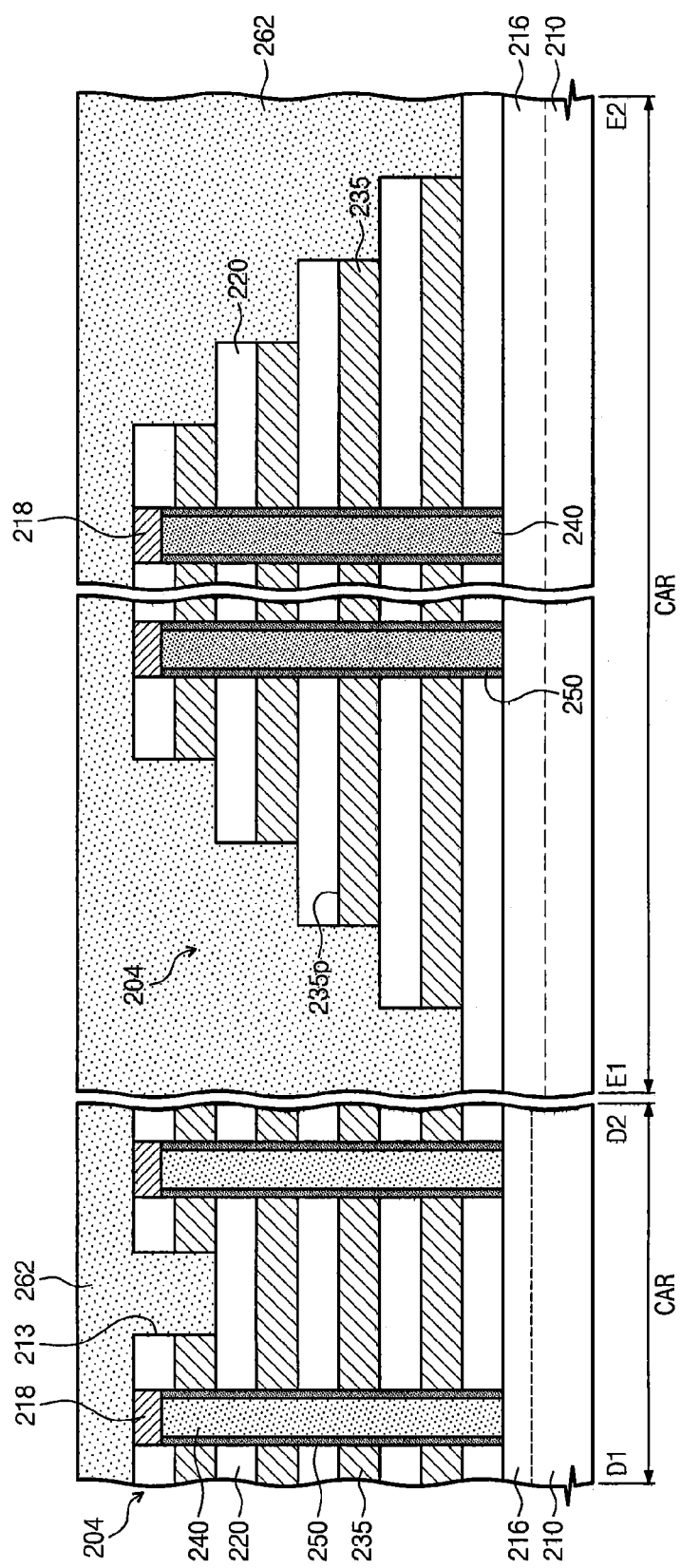
Figure 16B:
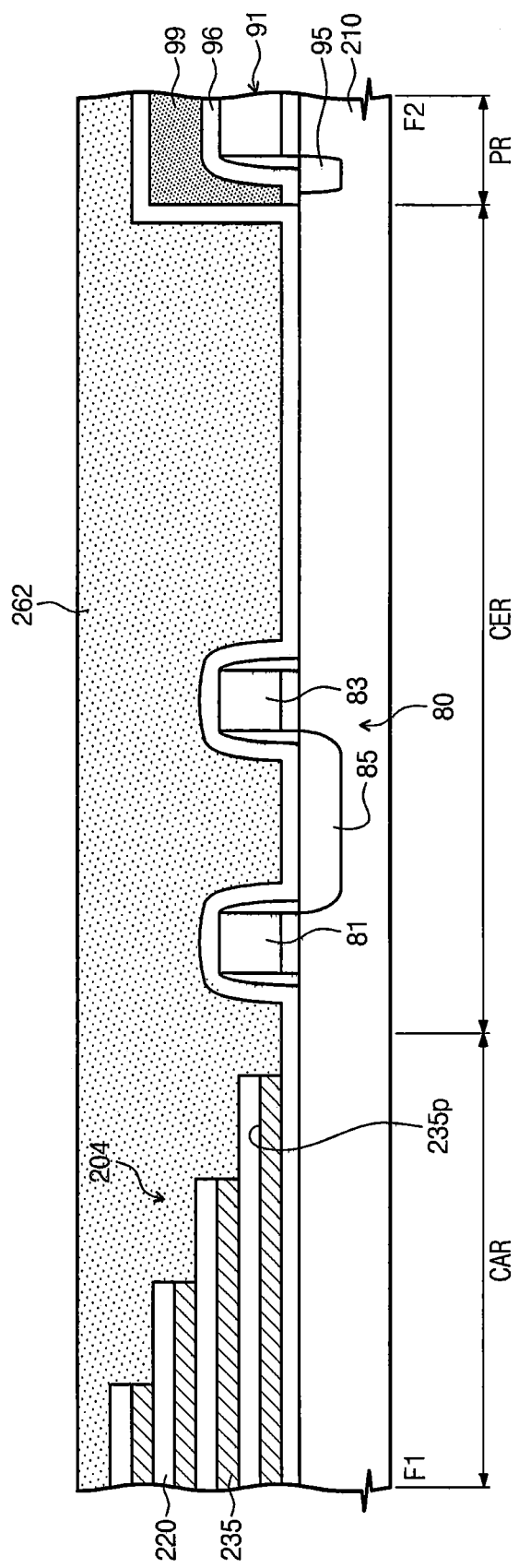

Referring to FIGS. 16A and 16B, the uppermost ones of the mold insulating layers 220 and the gates 235 may be patterned to form a slit 213, and a capping insulating layer 262 may be formed to cover the gate stack 204 and fill the slit 213. Due to the slit 213, the uppermost one of the gates 235 provided in the form of a plate may be divided into a plurality of line-shaped portions spaced apart from each other in the direction D1-D2 of FIG. 1B. The capping insulating layer 262 may be formed by depositing, for example, a silicon oxide layer. A drain 218 may be formed on or in a top portion of the vertical channel 240. For example, before or after the formation of the slit 213, the drain 218 may be formed by recessing the top portion of the vertical channel 218 and filling the recessed region with a semiconductor layer or by injecting impurities into the top portion of the vertical channel 240, and the drain 218 may be formed to have a second conductivity type (e.g., n-type). As another example, before the formation of the staircase structure 211 (for example, after the formation of the vertical channel 240 as shown in FIG. 14A), the drain 218 may be formed by recessing the top portion of the vertical channel 240 and filling the recessed region with a semiconductor layer or by injecting impurities into the top portion of the vertical channel 240.

Figure 17B:
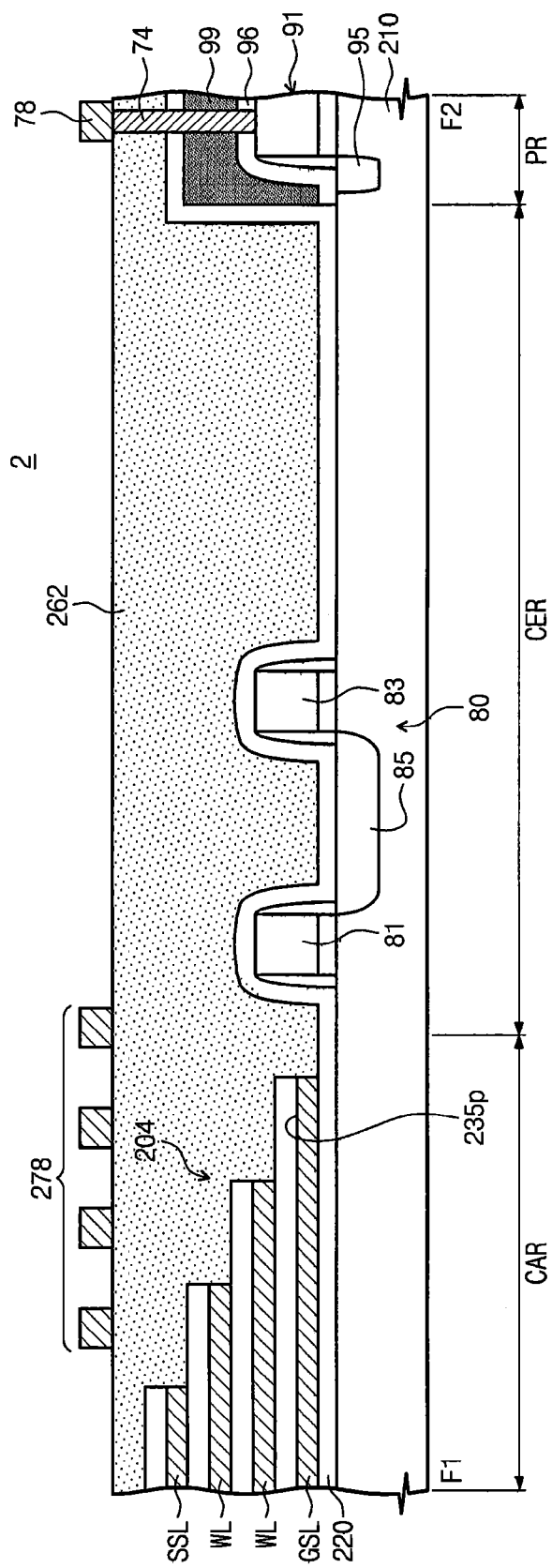

Referring to FIGS. 17A and 17B, on the cell array region CAR, bit lines 292 may be formed to be electrically connected to the vertical channels 240, and metal lines 278 may be formed to be electrically connected to the gates 235 and the substrate 210. On the peripheral region PR, metal lines 78 may be electrically connected to the peripheral transistor 91.

On the cell array region CAR, first contact plugs 274 may be electrically connected to the gates 235 and the substrate 210 through the capping insulating layer 262 and the mold insulating layers 220 and second contact plugs 276 may be electrically connected to the drains 218 through the capping insulating layer 262, and on the peripheral region PR, a lower contact plug 74 may be electrically connected to the peripheral transistor 91.

The bit lines 292 and metal lines 178 may be formed on the capping insulating layer 262. Here, on the cell array region CAR, the bit lines 292 may be electrically connected to the second contact plugs 276 and the metal lines 178 may be electrically connected to the first contact plugs 274.

On the peripheral region PR, the upper contact plug 76 may be connected to the lower contact plug 74, and the metal line 78 may be connected to the upper contact plug 76. The first contact plugs 274 and the second contact plugs 276 may be sequentially or simultaneously formed.

In the present embodiment, the uppermost one of the gates 235 may serve as a string selection line SSL, the lowermost one of the gates 235 may serve as a ground selection line GSL, and the others therebetween may serve as word lines WL. The first contact plugs 274 may be in contact with the pads 235p of the gates 235 and the common source 216, and the second contact plugs 276 may be in contact with the drain 218. The ground selection line GSL, the word lines WL, and the string selection line SSL, which are vertically stacked along each of the vertical channels 240, may constitute a memory cell string 236.

The semiconductor device 2 may be fabricated through the above series of processes. As an example, if the memory layer 250 includes the tunnel insulating layer, the trap insulating layer, and the blocking insulating layer, the semiconductor device 2 may be a NAND FLASH memory device. As another example, if the memory layer 250 includes a transition metal oxide layer, the semiconductor device 2 may be a resistance memory device (RRAM).

In the present embodiment, the semiconductor device 2 may include the cell array region CAR, on which memory cells with the word lines WL are provided, the cell end region CER, on which the key pattern 80 is provided, and the peripheral region PR, on which peripheral circuits including the peripheral transistors 91 are provided.

Fabrication Process: Example Embodiments

FIGS. 18A, 19A, 20A, 21A, 22A, 23A and 24A are sectional views taken along the lines G1-G2 and H1-H2 of FIG. 1C to illustrate a method of fabricating a semiconductor device, according to example embodiments of the inventive concept. FIGS. 18B, 19B, 20B, 21B, 22B, 23B and 24B are sectional views taken along the line I1-I2 of FIG. 1C to illustrate a method of fabricating a semiconductor device, according to example embodiments of the inventive concept.

Figure 18A:
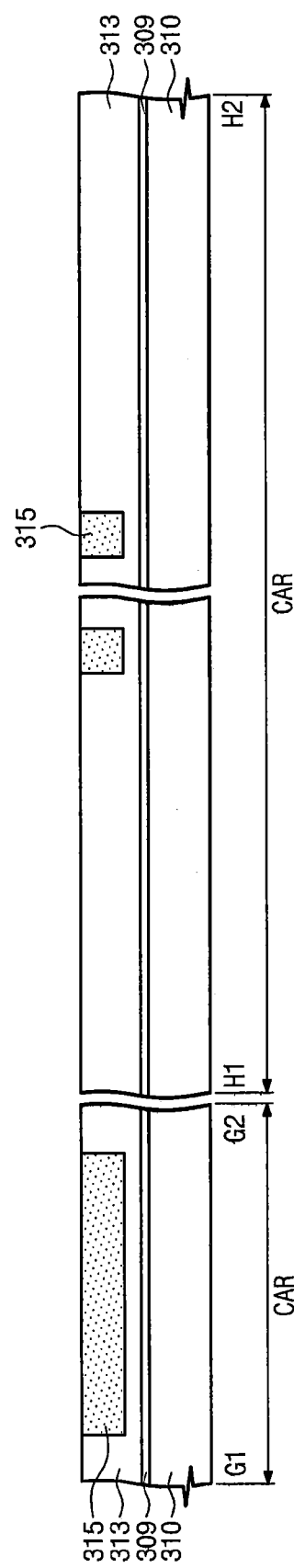
FIGS. 18A, 19A, 20A, 21A, 22A, 23A and 24A are sectional views taken along the lines G1-G2 and H1-H2 of FIG. 1C to illustrate a method of fabricating a semiconductor device according to example embodiments of the inventive concept.
Figure 18B:
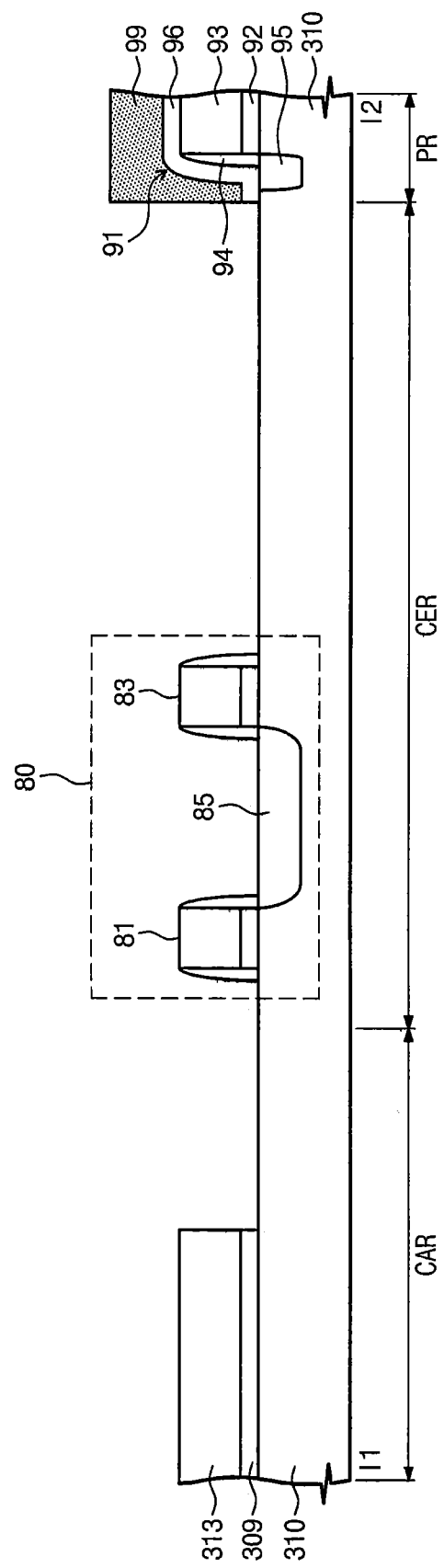
FIGS. 18B, 19B, 20B, 21B, 22B, 23B and 24B are sectional views taken along the line the I1-I2 of FIG. 1C to illustrate a method of fabricating a semiconductor device according to example embodiments of the inventive concept.

Referring to FIGS. 18A and 18B, an insulating layer 309 and a conductive layer 313, in which a buried sacrificial layer 315 is provided, may be formed on a cell array CAR of a substrate 310. A key pattern 80 may be formed on a cell end region CER of the substrate 310, and at least one peripheral transistor 91 and an insulating layer 99 covering the peripheral transistor 91 may be formed on a peripheral region PR.

As an example, an insulating layer and a polysilicon layer may be deposited on the whole region of the substrate 310 and may be patterned to form the insulating layer 309 and the conductive layer 313 on the cell array CAR of the substrate 310. The insulating layer 309 may include a silicon oxide layer, the conductive layer 313 may include a polysilicon layer, and the buried sacrificial layer 315 may include a silicon nitride layer. The key pattern 80 and the peripheral transistor 91 may be formed during the patterning process for forming the insulating layer 309 and the conductive layer 313. The insulating layer 99 may be formed by depositing an insulating material and performing a cell open photolithography and etching process thereon, and in example embodiments, the insulating layer 99 may be formed to cover the peripheral transistor 91 on the peripheral region PR of the substrate 310.

The peripheral transistor 91 may be a structure including a gate insulating layer 92, a gate 93, and a spacer 94. The key pattern 80 may include at least one pair of dummy patterns 81 and 83, which are provided to have the same or similar structure as the peripheral transistor 91, and a trench insulating layer 85 between the dummy patterns 81 and 83. The trench insulating layer 85 may be formed at the same time as a device isolation layer 95, which may be formed on the peripheral region PR.

Figure 19A:
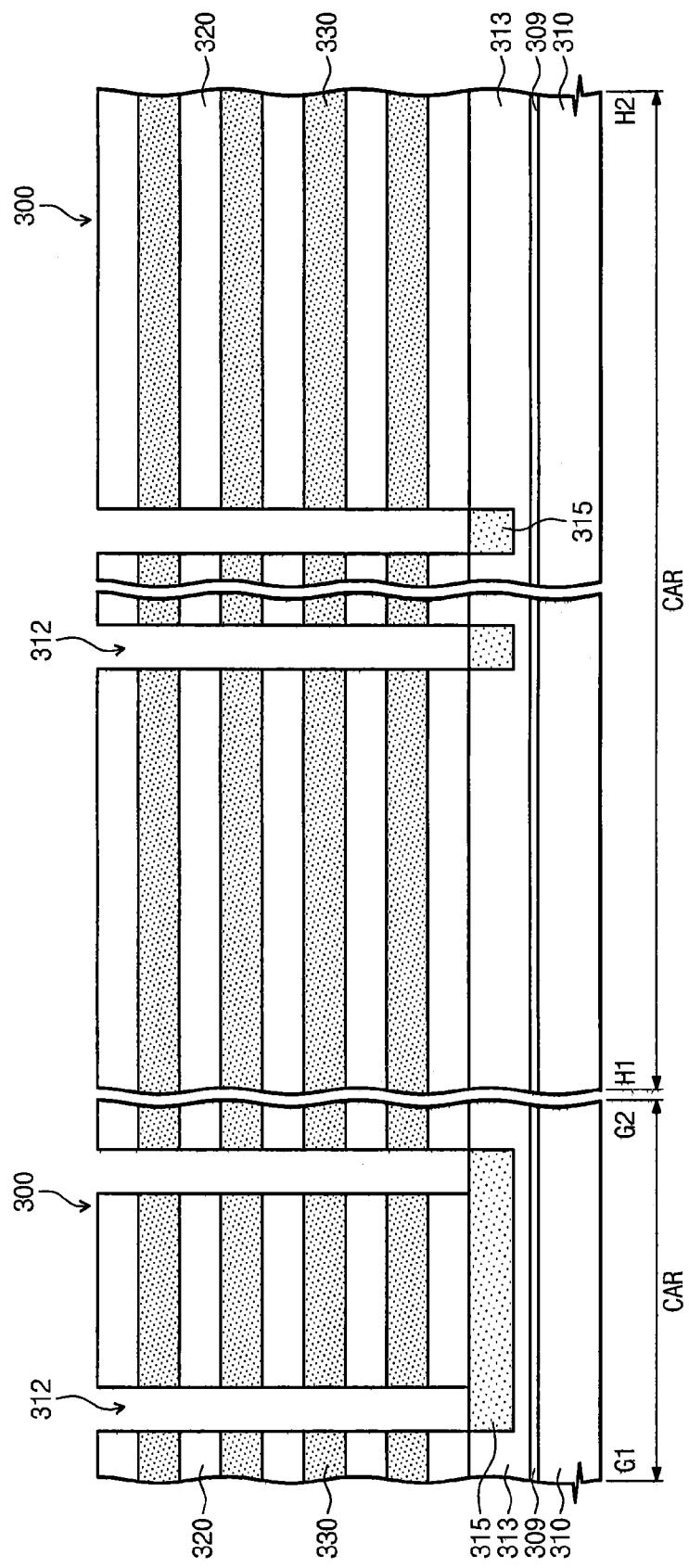
Figure 19B:
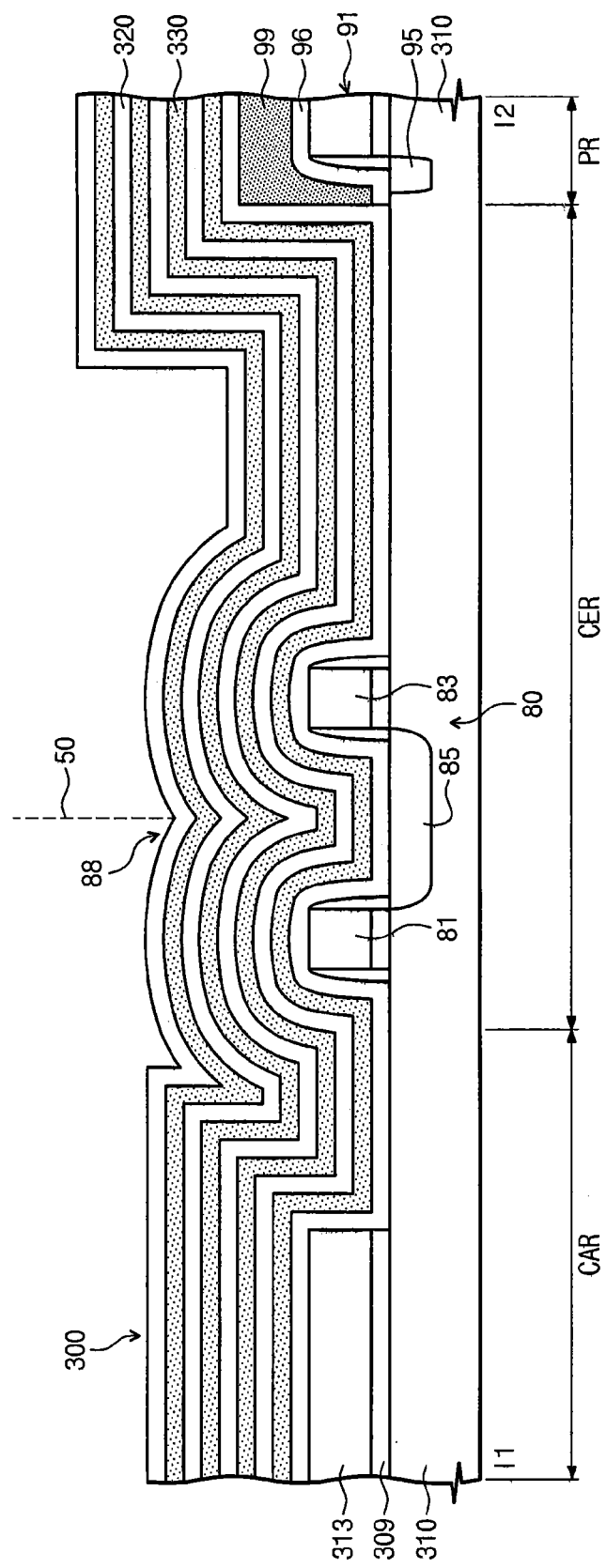

Referring to FIGS. 19A and 19B, a mold stack 300 may be formed on the substrate 310, and at least one pair of vertical holes 312 may be formed to expose the buried sacrificial layer 315 through the mold stack 300. The mold stack 300 may be formed on the whole region of the substrate 310 (for example, the cell array region CAR, the cell end region CER, and the peripheral region PR). The at least one pair of vertical holes 312 may be formed on the cell array region CAR of the substrate 310.

The mold stack 300 may be formed by alternatingly stacking a plurality of mold insulating layers 320 and a plurality of mold sacrificial layers 330. The mold insulating layers 320 may include a silicon oxide layer, and the mold sacrificial layers 330 may include a silicon nitride layer.

As shown in FIG. 19B, the mold stack 300 formed on the cell end region CER may be formed to have a pair of knolls and a recessed valley 88 therebetween, on the key pattern 80. The valley 88 may extend in a direction (for example, parallel to the line G1-G2 of FIG. 1C.

Figure 20A:
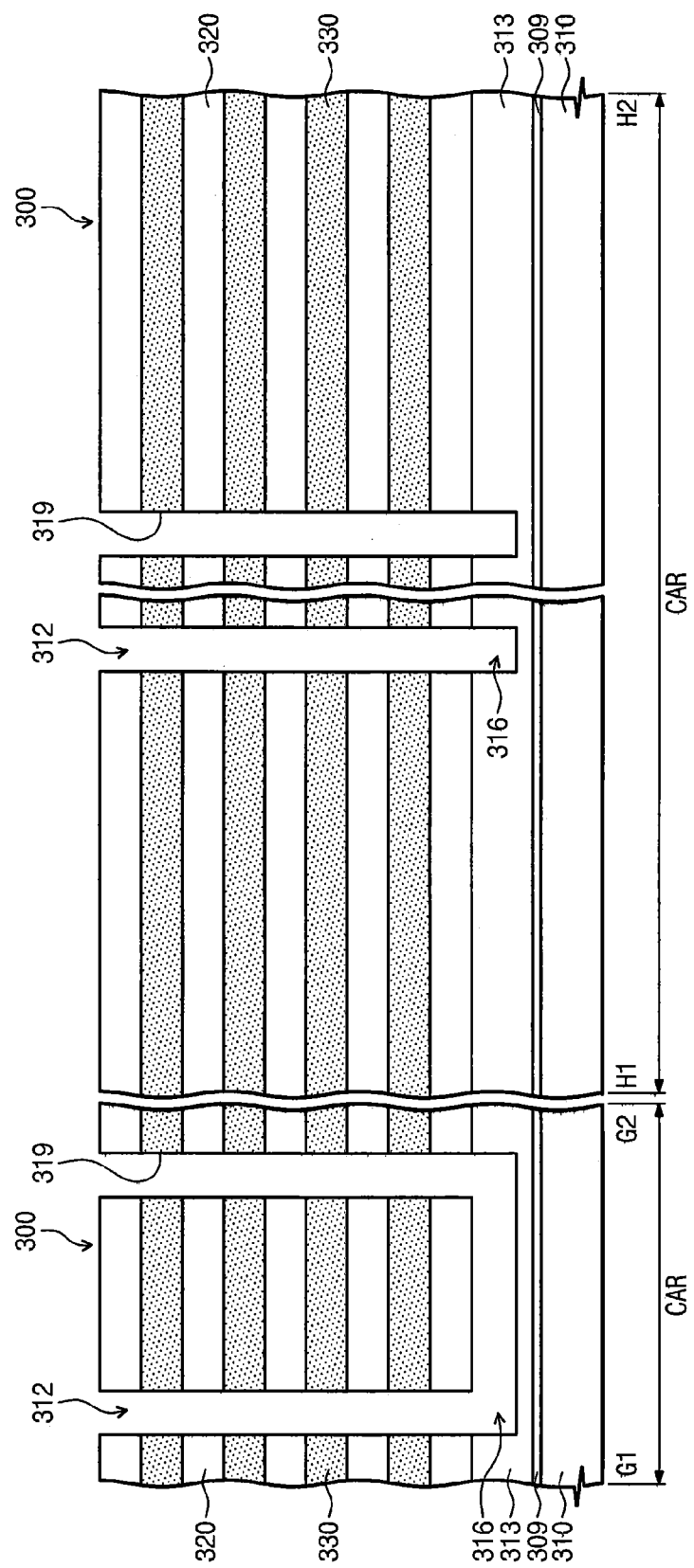
Figure 20B:
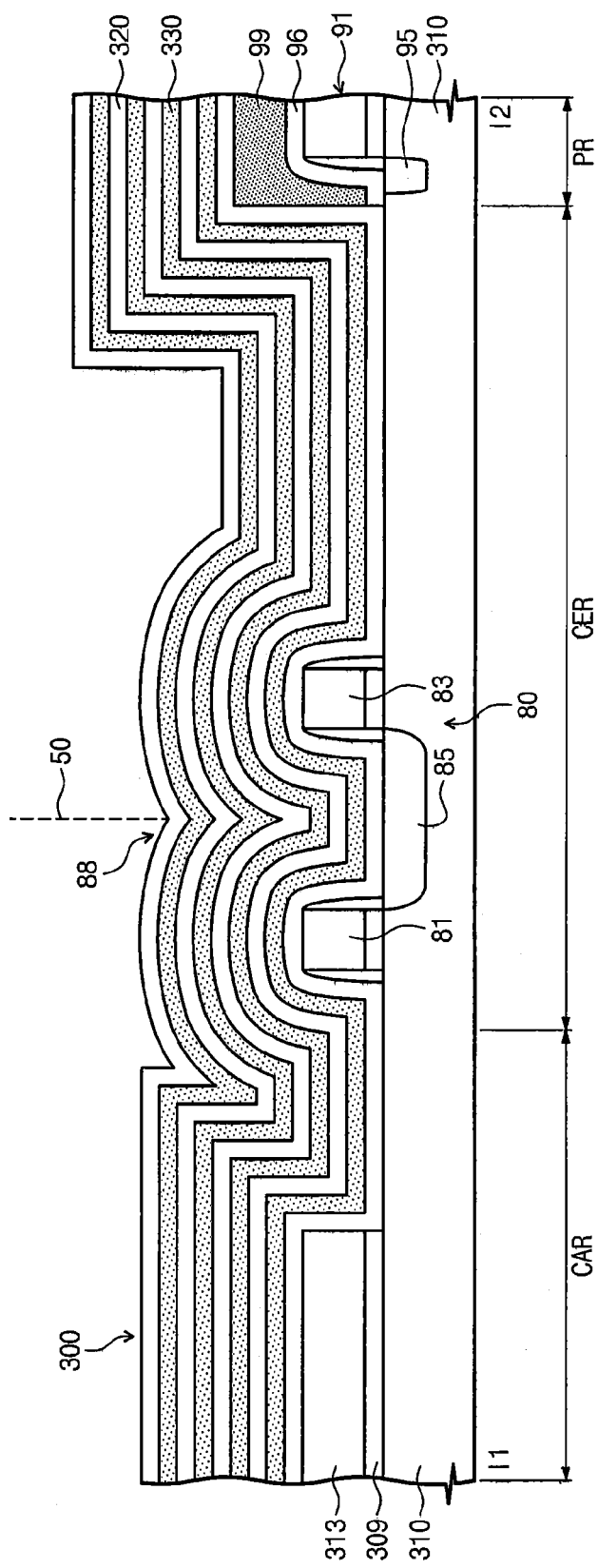

Referring to FIGS. 20A and 20B, the buried sacrificial layer 315 may be removed to form a horizontal hole 316. The horizontal hole 316 may connect the pair of vertical holes 312 to each other. Accordingly, a channel hole 319 penetrating the mold stack 300 may be formed on the cell array region CAR of the substrate 310, and as shown in FIG. 20A, the channel hole 319 may have a "U" or pipe shaped section.

Figure 21A:
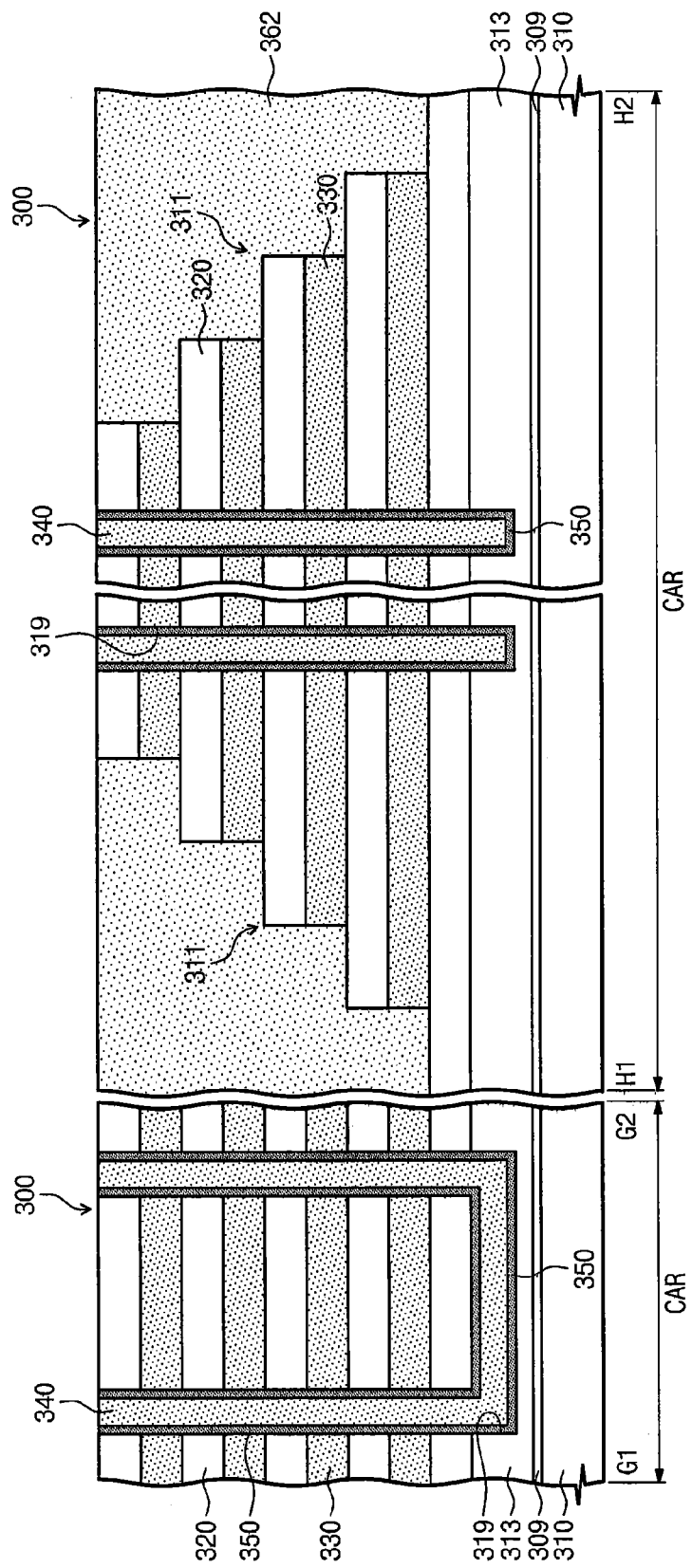
Figure 21B:
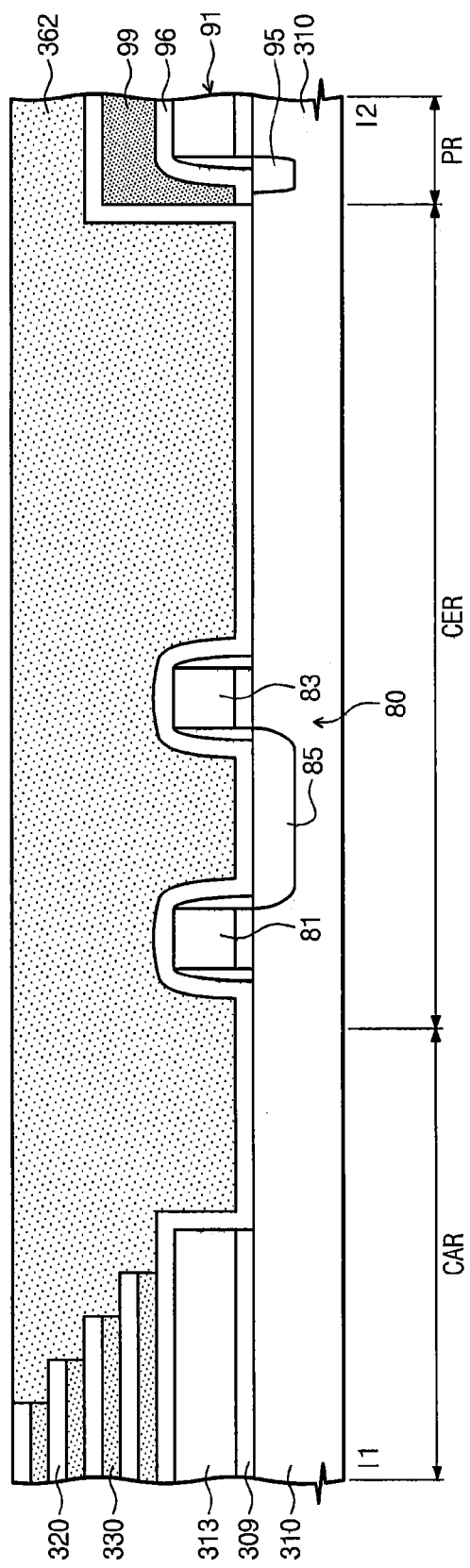

Referring to FIGS. 21A and 21B, a memory layer 350 and a channel 340 may be formed in the channel hole 319. The memory layer 350 and the channel 340 may extend along the channel hole 319 and thus have the "U" or pipe shaped section. The memory layer 350 may include a charge-trap insulating material or a variable resistance element. As an example, the memory layer 350 may include a blocking insulating layer (e.g., $SiO_2$, $Al_2O_3$, $SiO_2/Al_2O_3$) adjacent to an inner surface of the channel hole 319, a channel insulating layer (e.g., $SiO_2$), adjacent to the channel 340, and a trap insulating layer (e.g., SiN) between the blocking insulating layer and the channel insulating layer. As another example, the memory layer 350 may include a transition metal oxide layer.

After the formation of the channel 340, the mold stack 300 may be patterned to form a staircase structure 311 on the cell array region CAR. The staircase structure 311 may have a truncated pyramid shape; for example, the mold insulating layers 320 and/or the mold sacrificial layers 330 may have a length discretely decreasing in a direction away from the substrate 310, when viewed in a vertical section crossing the line H1-H2. The staircase structure 311 may be formed using one (e.g., disclosed described with reference to FIGS. 10A through 10G) of the staircase patterning processes disclosed in the present application.

After the formation of the staircase structure 311, an insulating material (e.g., a silicon oxide layer) may be deposited to form a capping insulating layer 362 covering the substrate 310. The capping insulating layer 362 may be formed to cover the staircase structure 311, the key pattern 80, and the insulating layer 99 on the peripheral transistor 91. As another example, the "U"-shaped channel 340 may be formed after the formation of the staircase structure 311.

Figure 22A:
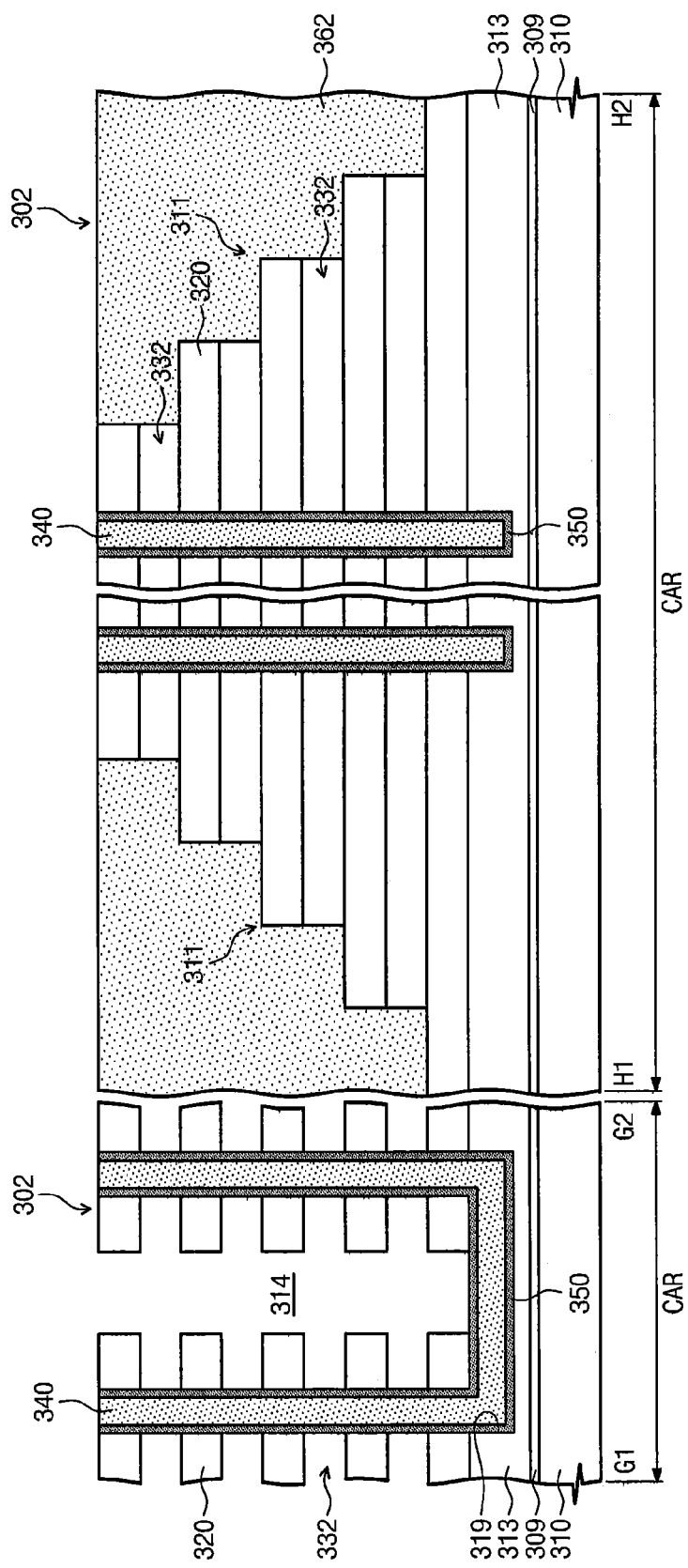
Figure 22B:
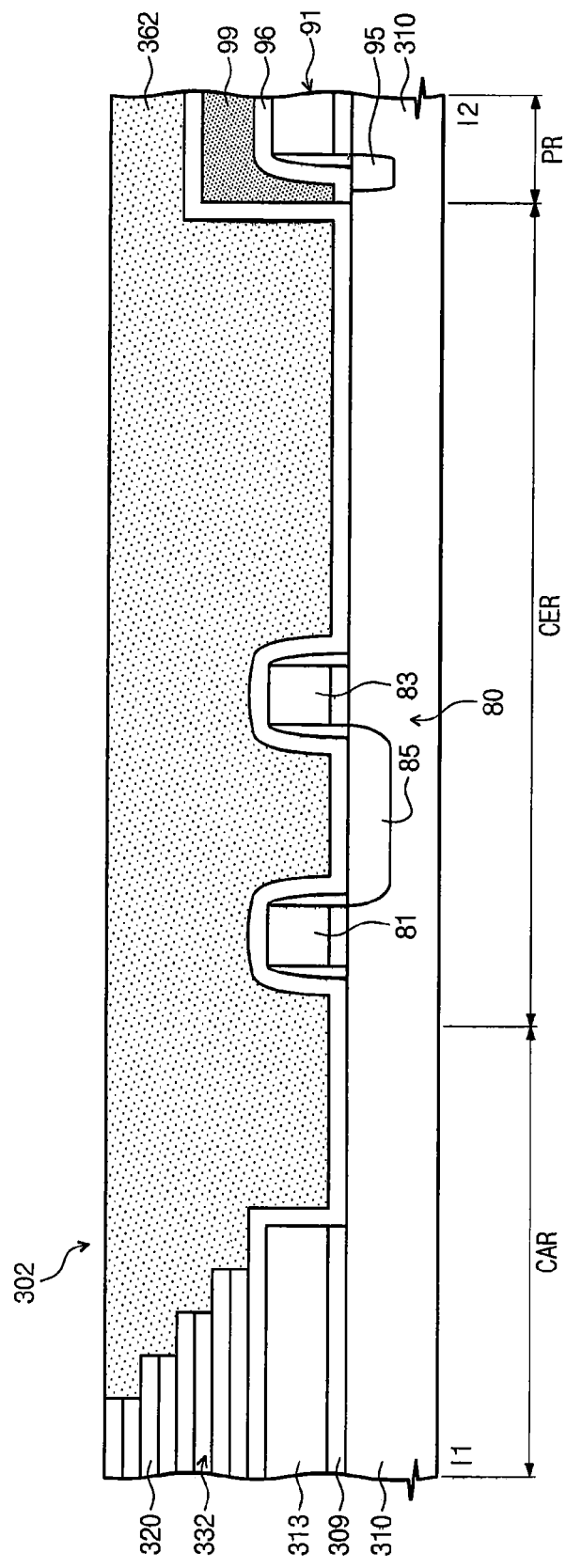

Referring to FIGS. 22A and 22B, the mold insulating layers 320 and the mold sacrificial layers 330 may be selectively etched (for example, using a dry etching process) to form a word line cut 314 on the cell array region CAR. For example, the word line cut 314 may be formed on a center of each "U"-shaped channel 340 and/or between adjacent ones of the "U"-shaped channels 340. The word line cut 314 may be formed parallel to the direction H1-H2.

When measured in the direction H1-H2, the length of the word line cut 314 may be the same as or greater than that of the lowermost ones of the mold insulating layers 320 and/or the mold sacrificial layers 330. Accordingly, the mold insulating layers 320 and the mold sacrificial layers 330 may be divided into a plurality of portions, which are separated from each other in the direction G1-G2, and each of which is shaped like a line extending parallel to the direction H1-H2.

The mold sacrificial layers 330 (e.g., of FIG. 21A) exposed by the word line cut 314 may be selectively removed to form a mold wing 302. In the case where the mold sacrificial layers 330 are of a silicon nitride layer, by supplying an etchant (e.g., phosphoric acid; $H_3PO_4$) through the word line cut 314, it is possible to selectively remove the mold sacrificial layers 330 and thereby form recess regions 332. As a result of this etching process, the mold insulating layers 320 may be vertically separated from each other along the vertical channel 340, thereby forming the mold wing 302.

Figure 23A:
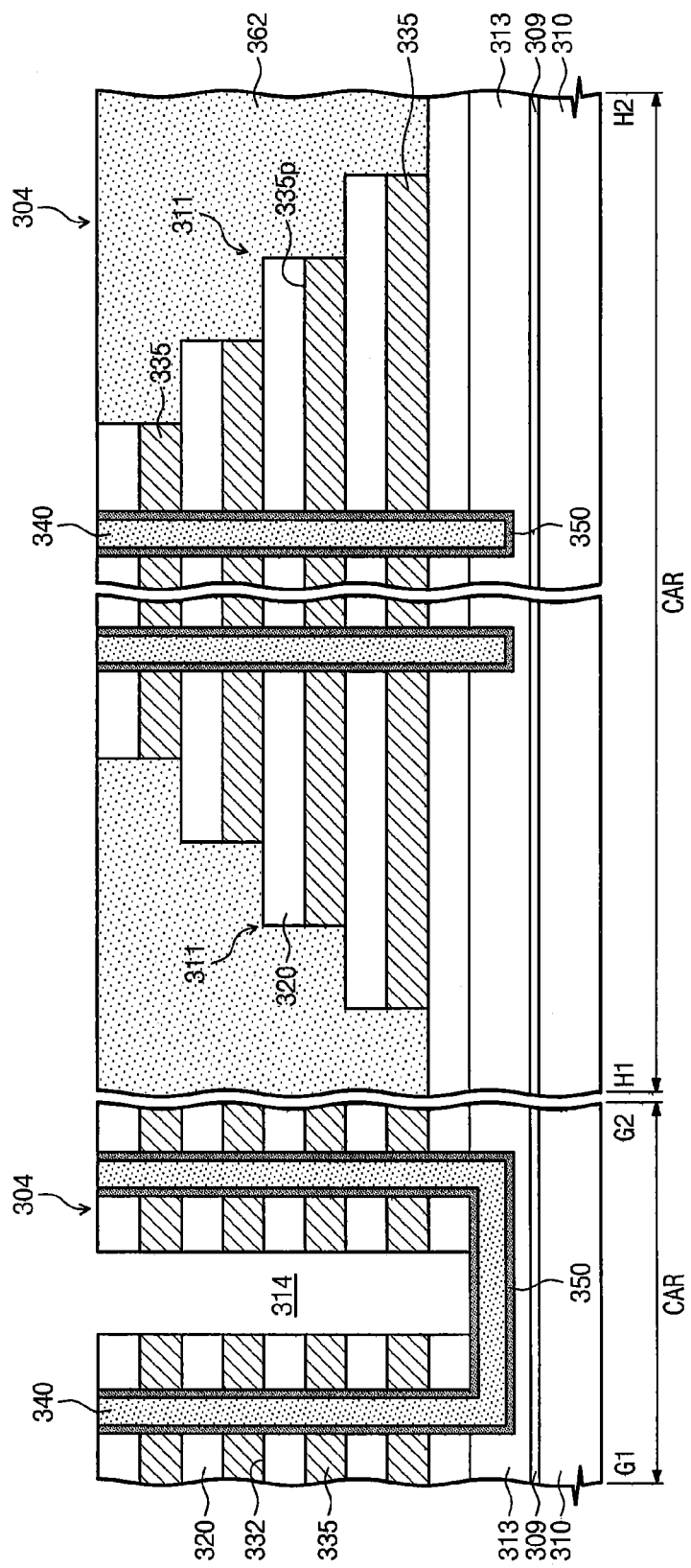
Figure 23B:
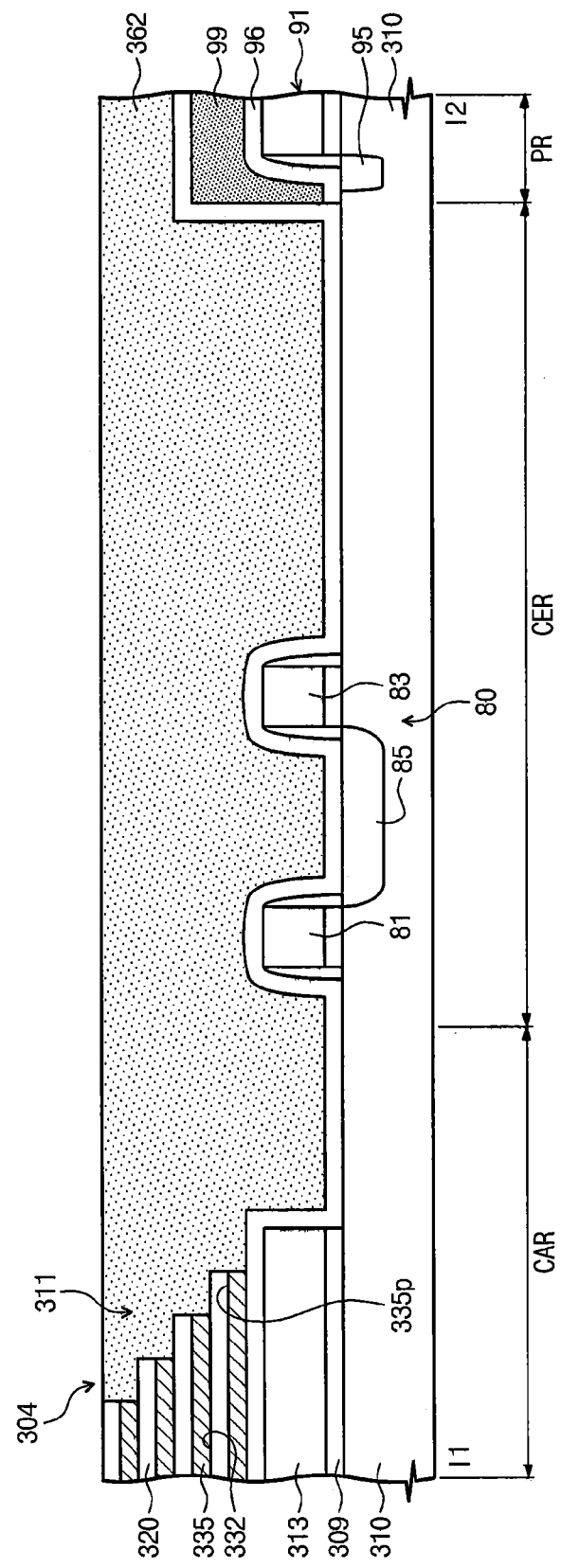

Referring to FIGS. 23A and 23B, a gate stack 304 may be formed by filling the recess regions 332 with gates 335. The gate 335 may be formed of or include a conductive material (e.g., tungsten, metal nitride, or metal silicides). Since the gates 335 are formed in the recess regions 332, the gates 335 may have the staircase structure 311. In other words, the gates 335 may be formed to have a truncated pyramid structure, whose horizontal length decreases in the direction away from the substrate 310, when viewed in sections crossing the lines G1-G2 and H1-H2. Thus, each of the gates 335 may have a portion (i.e., a pad 335p) that is uncovered by another thereon. The gates 335 may be separated from each other in the direction G1-G2 and each of them may be a line-shaped structure extending in the direction H1-H2.

Figure 24B:
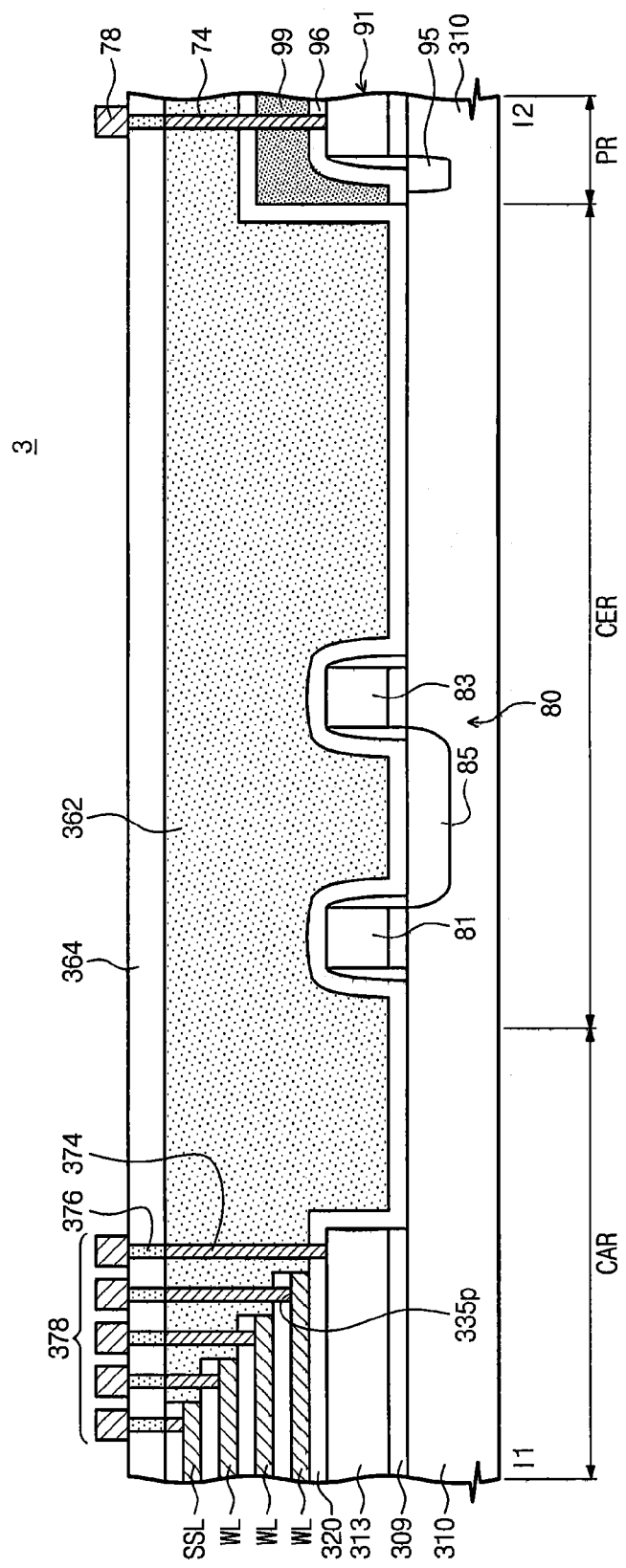

Referring to FIGS. 24A and 24B, conductive patterns 345 and bit lines 392 may be electrically connected to the channels 340, on the cell array region CAR, and a metal line 78 may be electrically connected to the peripheral transistor 91, on the peripheral region PR.

As an example, first contact plugs 374 may be electrically connected to the gates 335 and the conductive layer 313 through the capping insulating layer 362 and the mold insulating layer 320, on the cell array region CAR, and the lower contact plug 74 may be electrically connected to the peripheral transistor 91, on the peripheral region PR.

An insulating gapfill layer 363 may be formed to fill the word line cut 314, and the conductive pattern 345 may be formed to be electrically connected to an end of the "U"-shaped channel 340, and an interlayer insulating layer 364 may be formed on the gate stack 304 and the insulating gapfill layer 362. As another example, the interlayer insulating layer 364 may be formed to fill the word line cut 314.

Second contact plugs 376, bit lines 392, and metal lines 378 may be formed on the cell array region CAR. Here, the second contact plugs 376 may be electrically connected to the other end of the "U"-shaped channel 340 and the first contact plugs 374 through the interlayer insulating layer 364, and the bit lines 392 and the metal lines 378 may be electrically connected to the second contact plugs 376 on the interlayer insulating layer 364.

A contact plug 377 and a metal line 379 may be formed on the cell array region CAR. The contact plug 377 may be formed through a portion of the interlayer insulating layer 364 and may be connected to the conductive pattern 345, and the metal line 379 may be connected to the contact plug 377, on the interlayer insulating layer 364.

On the peripheral region PR, an upper contact plug 76 may be connected to the lower contact plug 74 through the interlayer insulating layer 364, and the metal line 78 may be formed on the interlayer insulating layer 364 and may be connected to the upper contact plug 76.

In the present embodiment, the gates 335 may be arranged along the "U"-shaped channel 340. The uppermost ones of the gates 335 may serve as a string selection line SSL and a ground selection line GSL, and the others may serve as word lines WL. The conductive pattern 345 may constitute a common source line CSL, and the conductive layer 313 may constitute a back gate. The ground selection line GSL, the word lines WL, and the string selection line SSL arranged along the "U"-shaped channel 340 may constitute a memory cell string 336.

The semiconductor device 3 may be fabricated through the above series of processes. As an example, if the memory layer 350 includes the tunnel insulating layer, the trap insulating layer, and the blocking insulating layer, the semiconductor device 3 may be a NAND FLASH memory device. As another example, if the memory layer 350 includes a transition metal oxide layer, the semiconductor device 3 may be a resistance memory device (RRAM).

In the present embodiment, the semiconductor device 3 may include the cell array region CAR, on which memory cells with the word lines WL are provided, the cell end region CER, on which the key pattern 80 is provided, and the peripheral region PR, on which peripheral circuits including the peripheral transistors 91 are provided.

Fabrication Process: Example Embodiments

FIGS. 25A, 26A, 27A, 28A, 29A and 30A are sectional views taken along the lines G1-G2 and H1-H2 of FIG. 1C to illustrate a method of fabricating a semiconductor device, according to example embodiments of the inventive concept. FIGS. 25B, 26B, 27B, 28B, 29B and 30B are sectional views taken along the line I1-I2 of FIG. 1C to illustrate a method of fabricating a semiconductor device, according to example embodiments of the inventive concept.

Figure 25A:
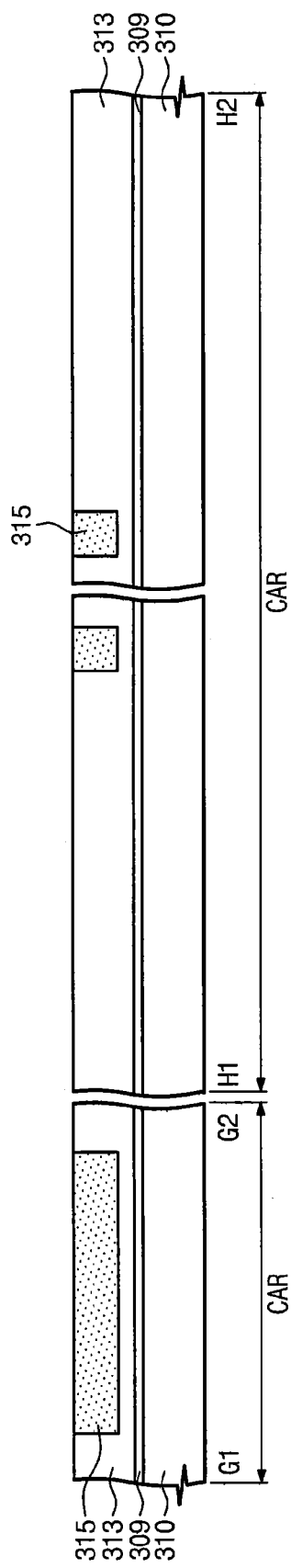
FIGS. 25A, 26A, 27A, 28A, 29A and 30A are sectional views taken along the lines G1-G2 and H1-H2 of FIG. 1C to illustrate a method of fabricating a semiconductor device according to example embodiments of the inventive concept.
Figure 25B:
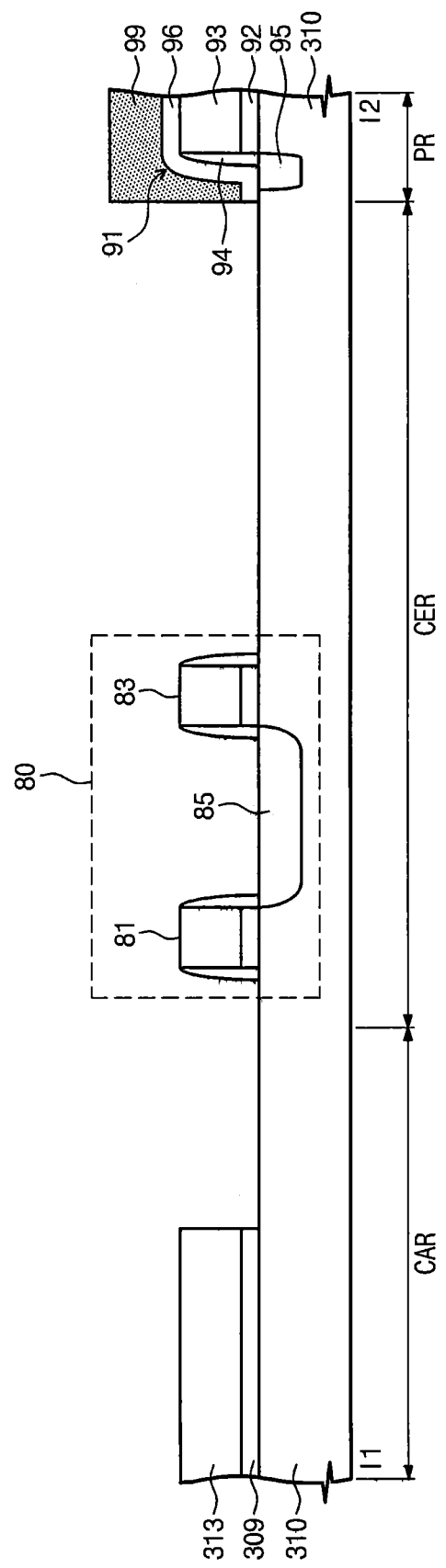
FIGS. 25B, 26B, 27B, 28B, 29B and 30B are sectional views taken along the line I1-I2 of FIG. 1C to illustrate a method of fabricating a semiconductor device according to even example embodiments of the inventive concept.

Referring to FIGS. 25A and 25B, a process may be performed in the same or similar manner described with reference to FIGS. 18A and 18B to provide a substrate 310 having a key pattern 80. For example, an insulating layer 309 and a conductive layer 313 provided with a buried sacrificial layer 315 may be formed on a cell array region CAR of the substrate 310, and at least one pair of dummy patterns 81 and 83 may be formed on a cell end region CER, and a peripheral transistor 91 may be formed on a peripheral region PR.

Figure 26A:
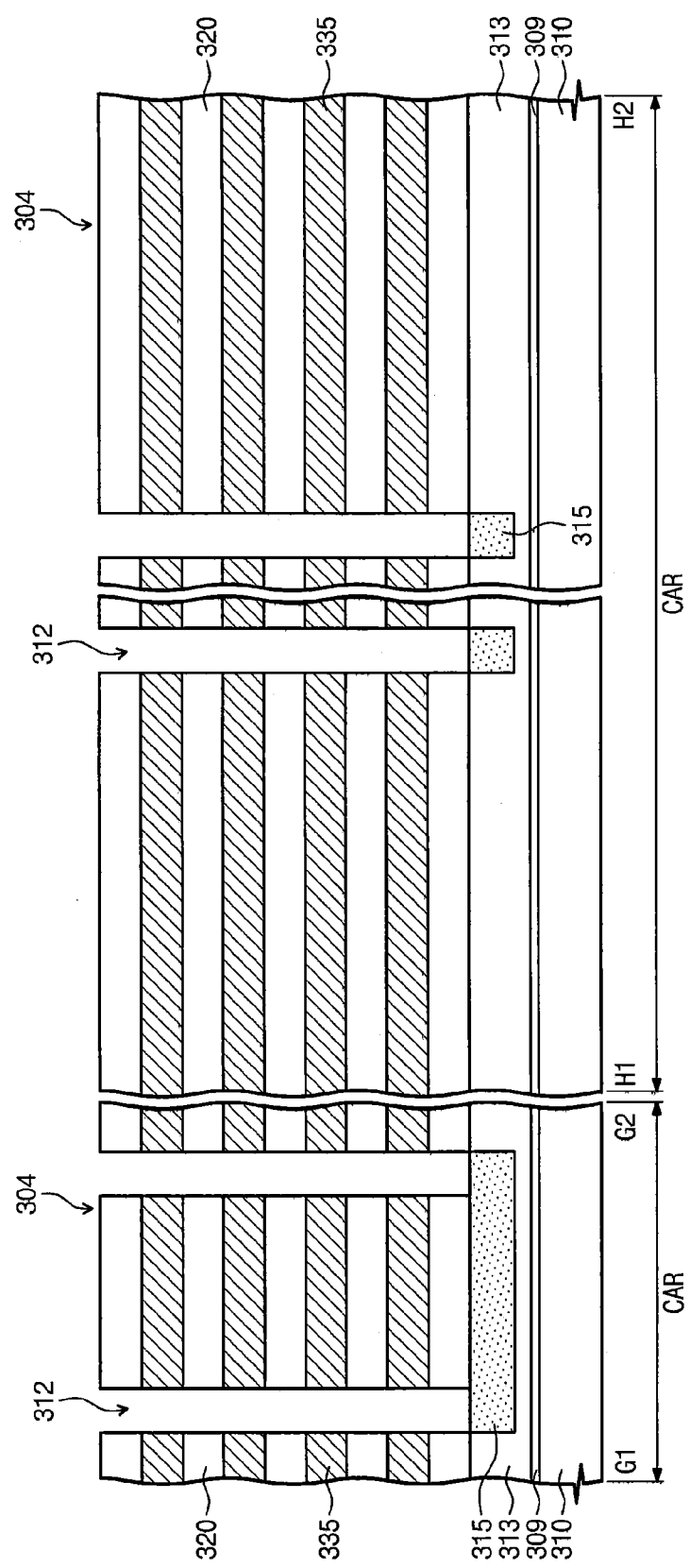
Figure 26B:
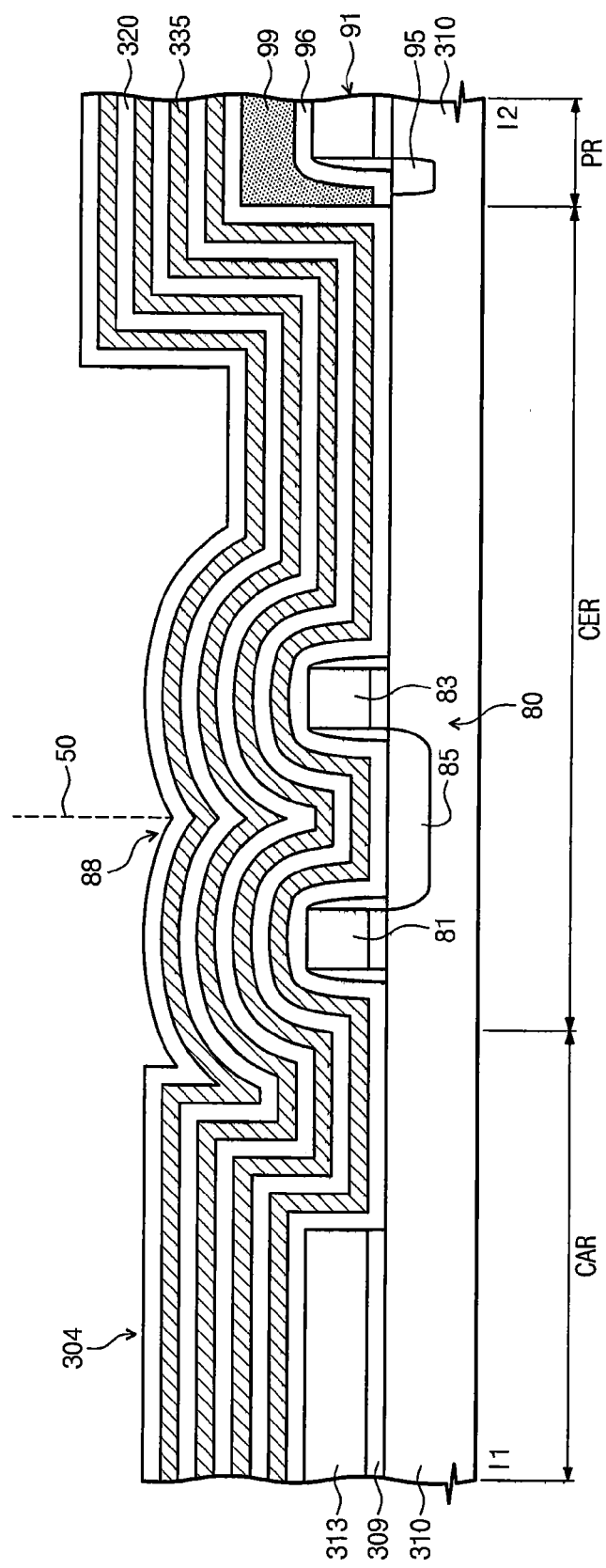

Referring to FIGS. 26A and 26B, a gate stack 304 may be formed on the whole region of the substrate 310, and at least one pair of vertical hole 312 may be formed on the cell array region CAR to penetrate the gate stack 304 and expose the buried sacrificial layer 315. As an example, mold insulating layers 320 and gates 335 may be alternatingly stacked to form the gate stack 304. Here, the mold insulating layers 320 may include an insulating material (e.g., silicon oxide or silicon nitride), and the gates 335 may include a conductive material (e.g., silicon or metals).

Figure 27A:
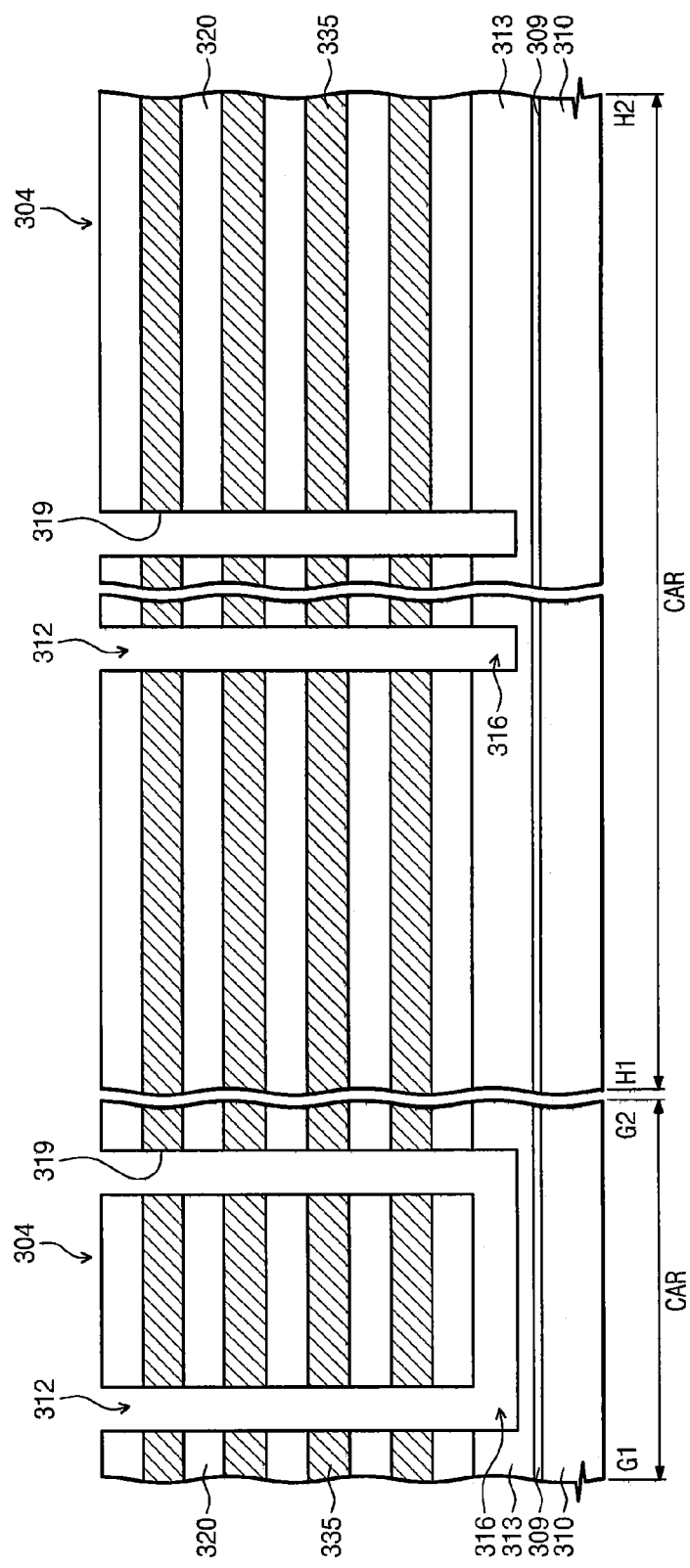
Figure 27B:
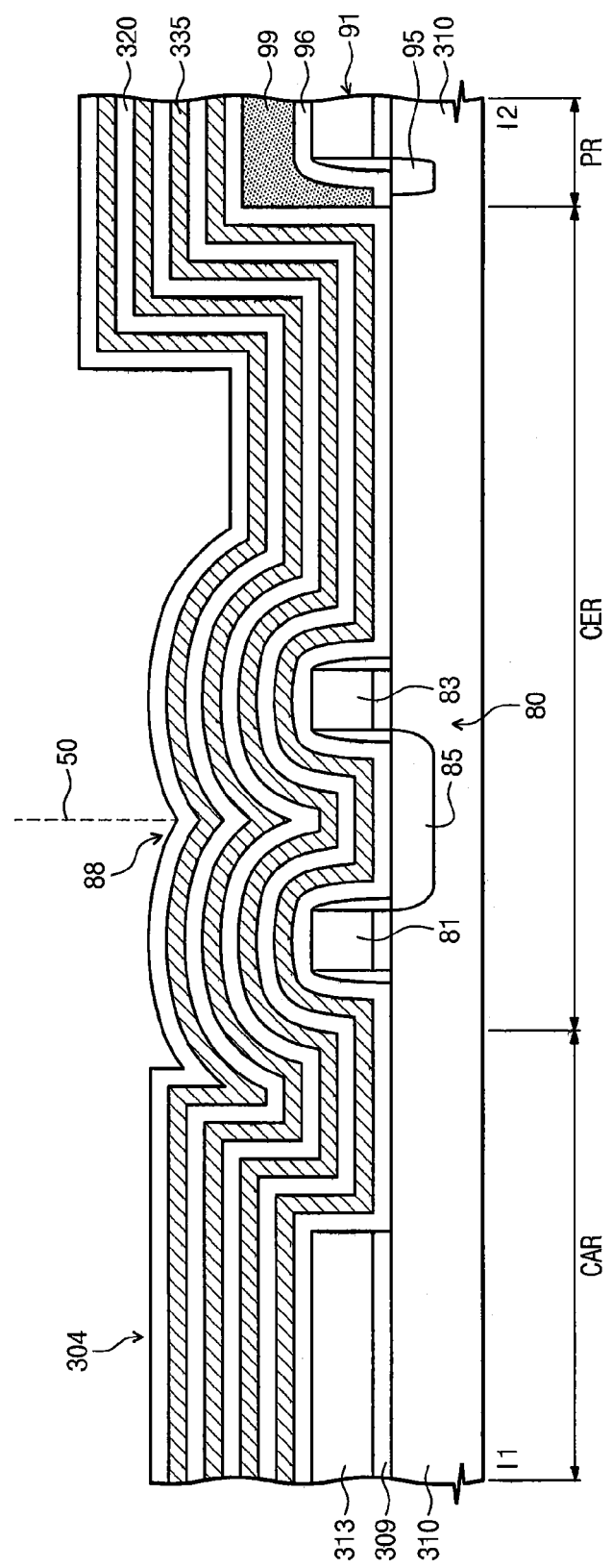

Referring to FIGS. 27A and 27B, the buried sacrificial layer 315 may be removed to form a horizontal hole 316 connecting the pair of vertical hole 312 to each other. A "U"- or pipe-shaped channel hole 319 may be formed on the cell array region CAR of the substrate 310 to penetrate the gate stack 304.

Figure 28A:
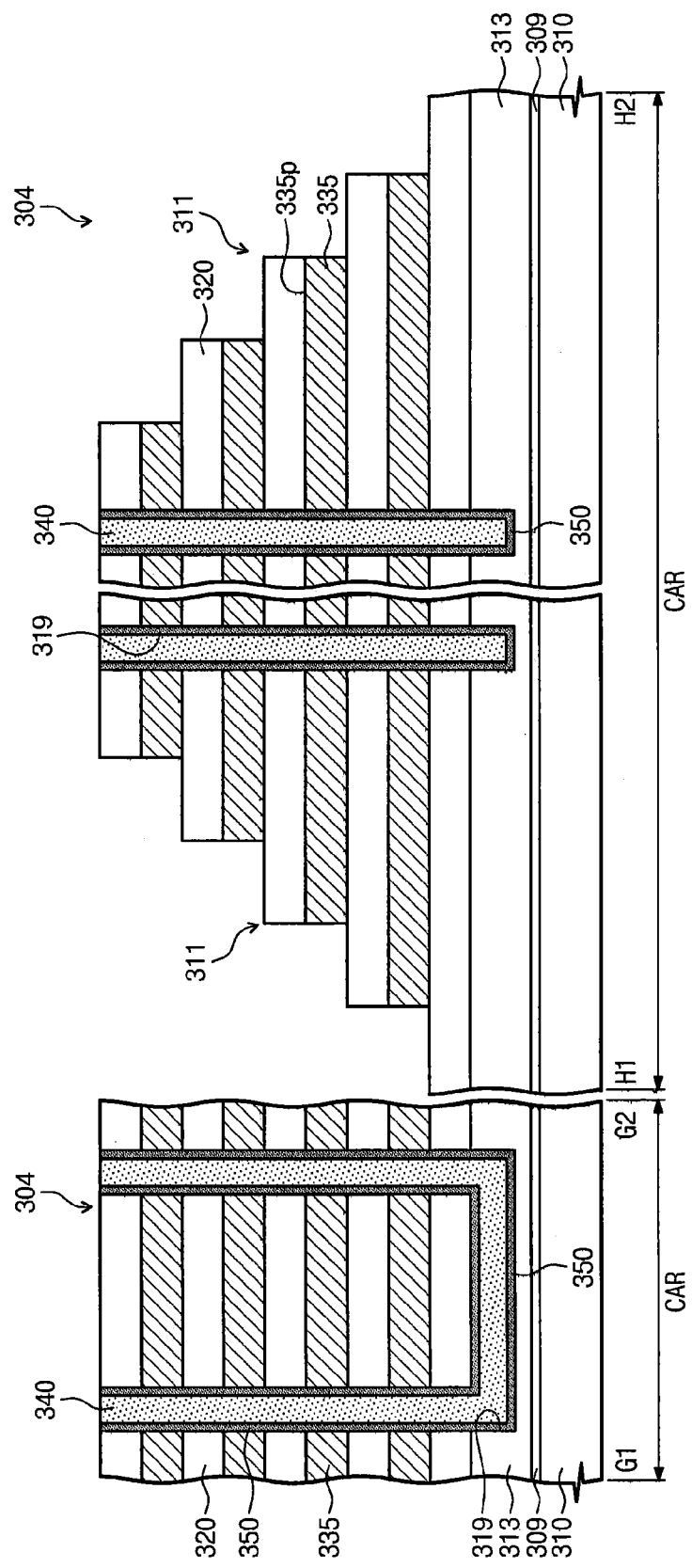
Figure 28B:
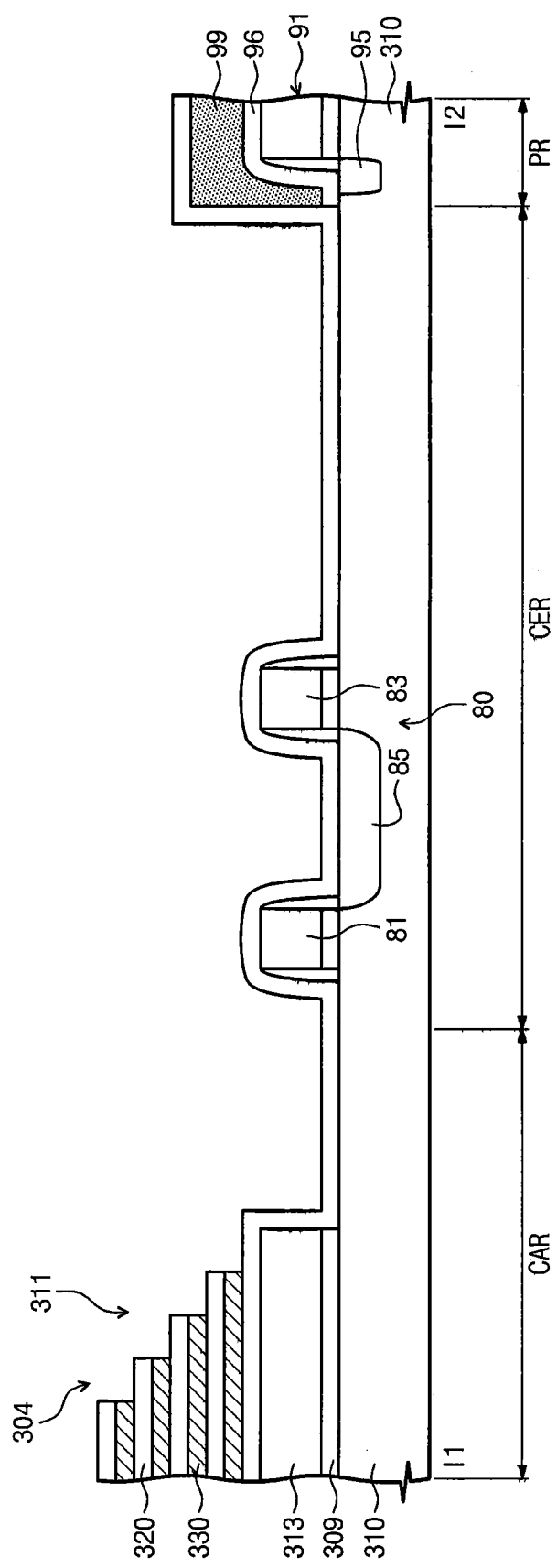

Referring to FIGS. 28A and 28B, a memory layer 350 and a channel 340 may be formed in the channel hole 319, and the gate stack 304 may be patterned to form a staircase structure 311 on the cell array region CAR. The memory layer 350 and the channel 340 may be formed along the channel hole 319, thereby having a "U"- or pipe-shape structure. The mold insulating layers 320 and/or the gates 335 may be formed to have a truncated pyramid structure, whose length discretely decreases in the direction away from the substrate 310, when viewed in section crossing a direction H1-H2. Thus, each of the gates 335 may have a portion (i.e., a pad 335p) that is uncovered by another thereon. The staircase structure 311 may be formed using one (e.g., disclosed described with reference to FIGS. 10A through 10G) of the staircase patterning processes disclosed in the present application. As another example, the "U"-shaped channel 340 may be formed after the formation of the staircase structure 311.

Figure 29A:
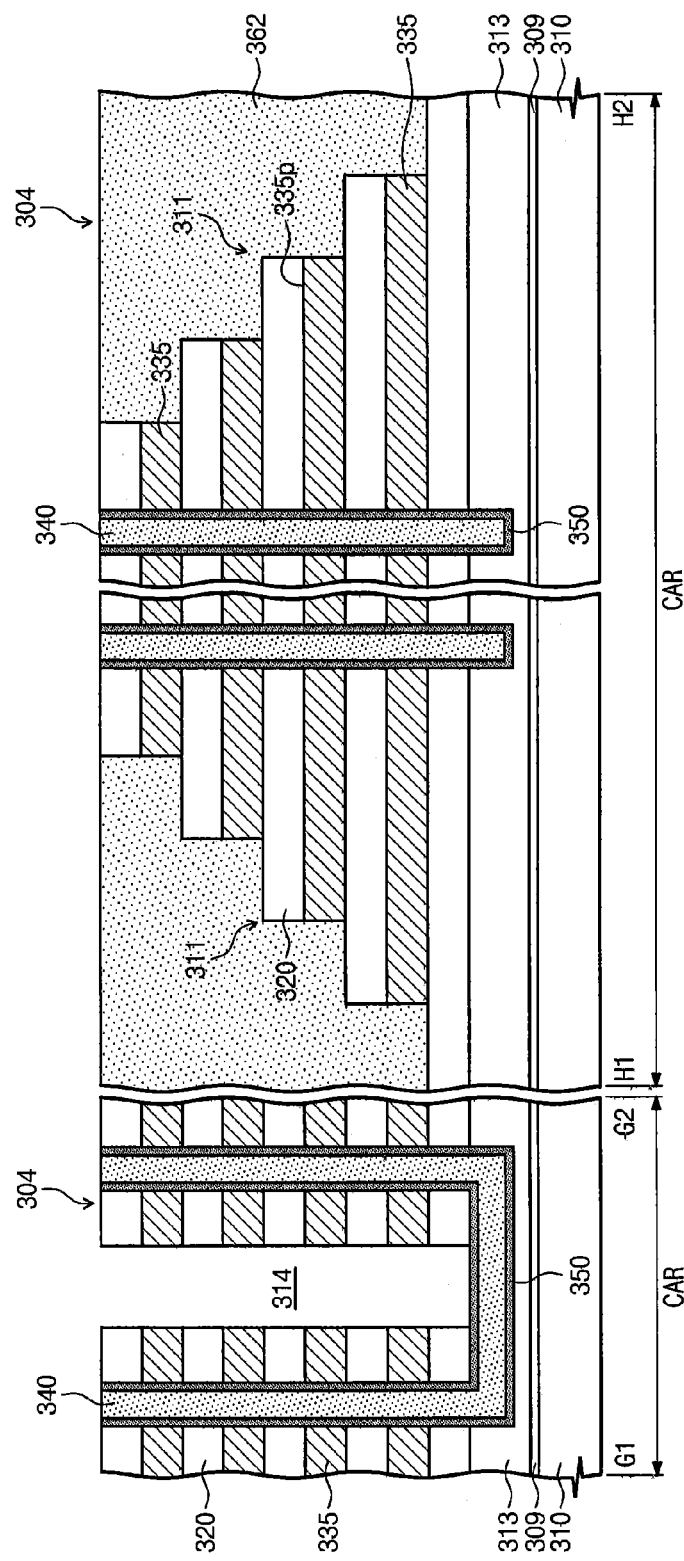
Figure 29B:
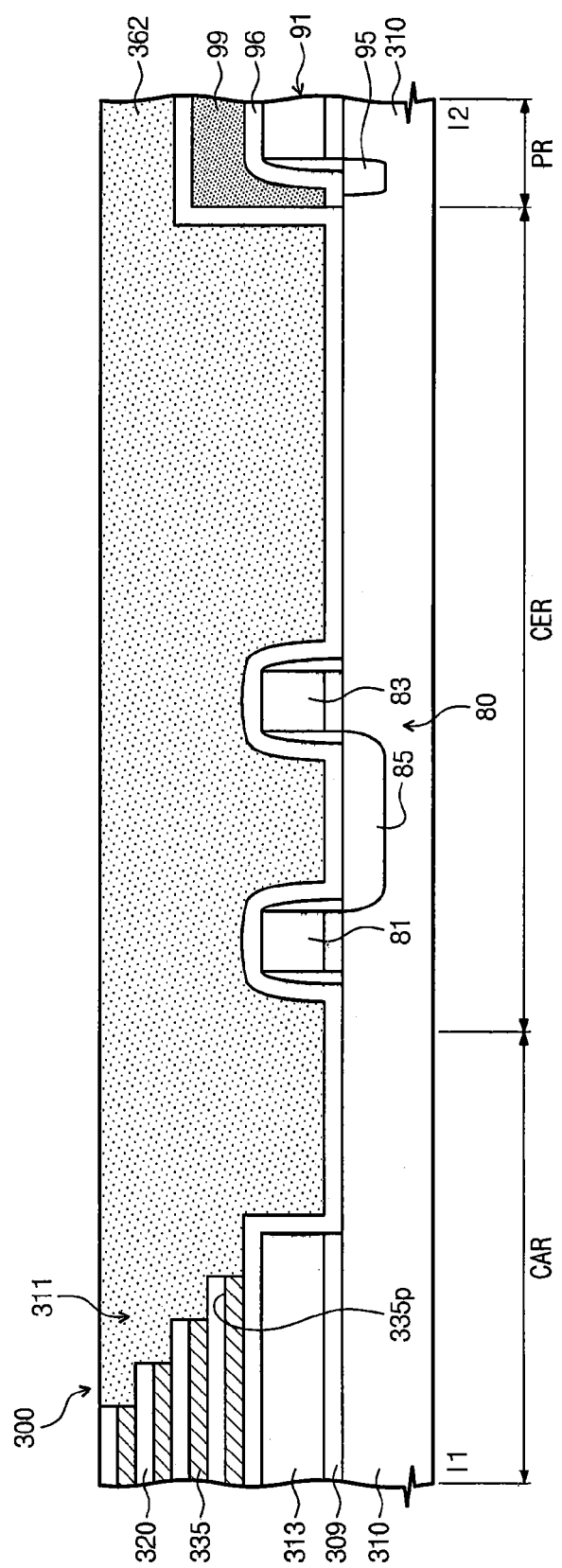

Referring to FIGS. 29A and 29B, the gate stack 304 may be patterned to form a word line cut 314. For example, the word line cut 314 may be formed on a center of each "U"-shaped channel 340 and/or between adjacent ones of the "U"-shaped channels 340. The word line cut 314 may be formed parallel to the direction H1-H2. Before or after the formation of the word line cut 314, a capping insulating layer 362 may be formed to cover the gate stack 304, the key pattern 80, and the peripheral transistor 91.

When measured in the direction H1-H2, the length of the word line cut 314 may be the same as or greater than that of the lowermost ones of the mold insulating layers 320 and/or the gates 335. Accordingly, the mold insulating layers 320 and the gates 335 may be divided into a plurality of portions, which are separated from each other in the direction G1-G2, and each of which is shaped like a line extending parallel to the direction H1-H2.

Figure 30A:
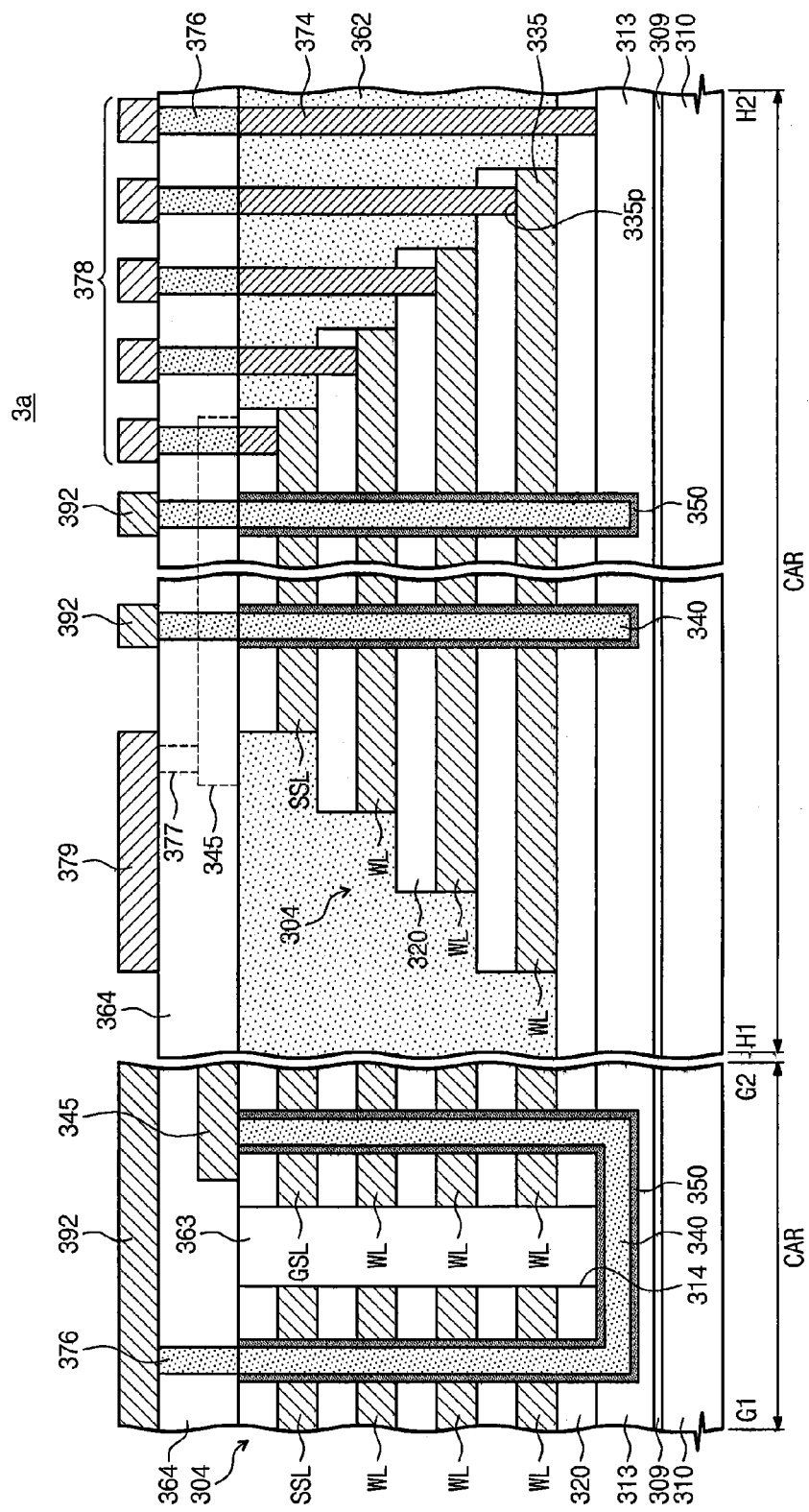
Figure 30B:
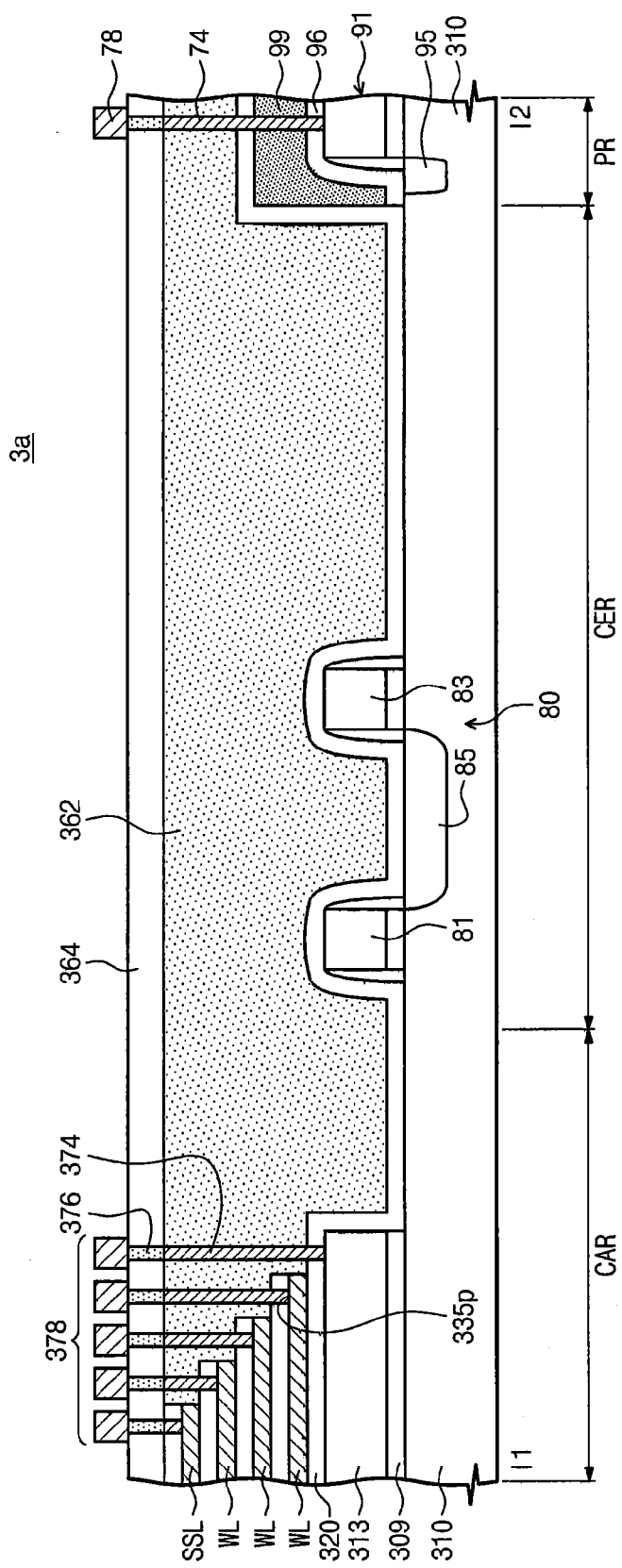

Referring to FIGS. 30A and 30B, a process may be performed in the same or similar manner described with reference to FIGS. 29A and 29B to form conductive patterns 345 and bit lines 392, which are electrically connected to the channels 340, on the cell array region CAR, and to form a metal line 78, which is electrically connected to the peripheral transistor 91, on the peripheral region PR.

As a result of the above series of processes, a semiconductor device 3a may be fabricated to include the cell array region CAR provided with memory cells, the cell end region CER provided with the key pattern 80, and the peripheral region PR provided with the peripheral circuit or the peripheral transistor 91. The semiconductor device 3a may have substantially the same structure as the semiconductor device 3 of FIGS. 29A and 29B.

[APPLICATION]

Figure 31A:
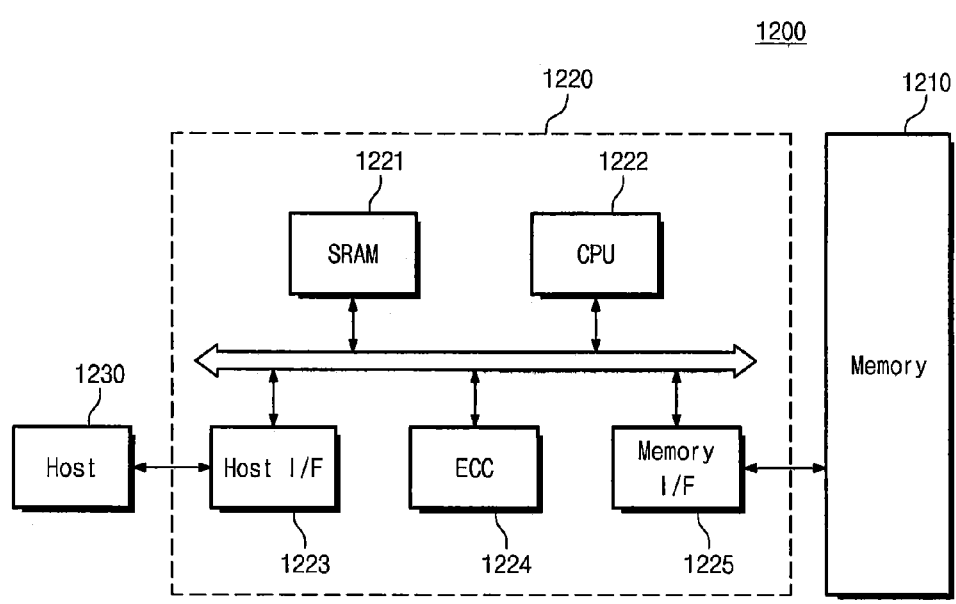
FIG. 31A is a schematic block diagram illustrating an example of memory cards including a semiconductor device according to example embodiments of the inventive concept.
Figure 31B:
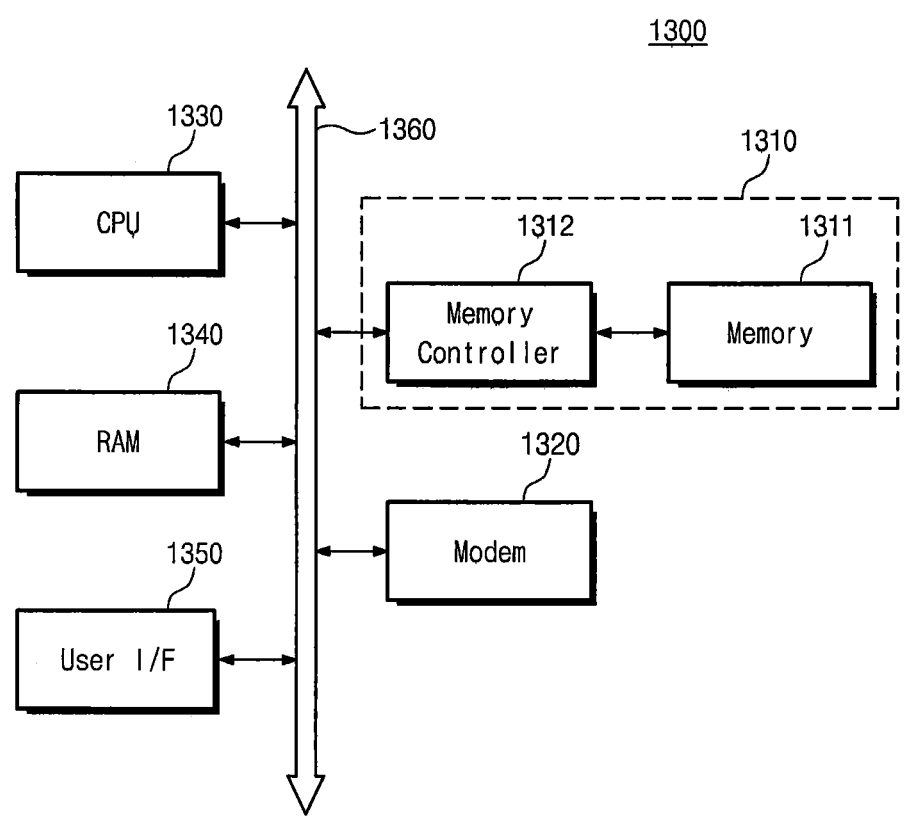
FIG. 31B is a block diagram illustrating an information processing system including a semiconductor memory device according to example embodiments of the inventive concept.

FIG. 31A is a schematic block diagram illustrating an example of memory cards including a semiconductor device according to example embodiments of the inventive concept. FIG. 31B is a block diagram illustrating an information processing system including a semiconductor memory device according to example embodiments of the inventive concept.

Referring to FIG. 31A, a memory device 1210 including at least one of the semiconductor devices 1, 1a, 1b, 2, 3, and 3a according to example embodiments of the inventive concept may be used to realize a memory card 1200. For example, the memory card 1200 may include a host 1230, the memory device 1210, and a memory controller 1220 controlling data exchanges therebetween. A static random access memory (SRAM) 1221 may be used as an operating memory of a central processing unit 1222. A host interface 1223 may include a data exchange protocol of a host 1230 connected to a memory card 1200. An error correction block 1224 may detect and correct errors included in data read from a multi-bit memory device 1210. A memory interface 1225 may be configured to interface with the memory device 1210. The central processing unit 1222 may perform general control operations for data exchange of the memory controller 1220.

Referring to FIG. 31B, an information processing system 1300 may be realized using a memory system 1310 including at least one of the semiconductor devices 1, 1a, 1b, 2, 3, and 3a according to example embodiments of the inventive concept. For instance, the information processing system 1300 may be a mobile device and/or a computer. In example embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory 1311 and a memory controller 1312, and in certain cases, it may have the same configuration as the memory card 1200 of FIG. 31A. Data processed by the CPU 1330 and/or input from the outside may be stored in the memory system 1310. The information processing system 1300 may further include or be, for example, a memory card, an application chipset, a camera image sensor, a camera image signal processor (ISP), an input/output device, and so forth. As an example, the memory system 1310 may be used as a portion of a solid state drive (SSD), and in this case, the information processing system 1300 may stably and reliably store a large amount of data in the memory system 1310.

According to example embodiments of the inventive concept, a critical dimension (e.g., width) of a word line pad can be monitored in real time, before and after each etching process of a staircase patterning process. Accordingly, it is possible to reduce or minimize an error or failure from occurring in a staircase patterning process and consequently to increase a yield of a semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including a cell region and a peripheral region;
a gate stack including a plurality of gates stacked on the cell region of the substrate, at least one edge portion of the gate stack having a staircase structure;
a channel extending through the gate stack and being enclosed by a memory layer; and
at least two dummy patterns spaced apart from the gate stack on the substrate, the at least two dummy patterns being spaced apart from each other,
wherein the peripheral region comprises at least one transistor provided on the substrate, and
wherein the at least two dummy patterns have substantially the same structure as the at least one transistor.

2. The semiconductor device of claim 1, wherein the cell region comprises:
a cell array region, on which the gate stack is provided; and
a cell end region between the cell array region and the peripheral region,
wherein the at least two dummy patterns are provided on the cell end region.

3. The semiconductor device of claim 1, further comprising a trench insulating layer in the substrate between the at least two dummy patterns.

4. The semiconductor device of claim 1, wherein the at least two dummy patterns
comprise two first dummy patterns on the substrate, the two first dummy patterns are spaced apart from the at least one edge portion of the gate stack having the staircase structure by a first distance, and the two first dummy patterns are spaced apart from each other by a first space, and
wherein the semiconductor device further comprises two second dummy patterns on the substrate, the two second dummy patterns are spaced apart from the at least one edge portion of the gate stack having the staircase structure by a second distance that is greater than the first distance, and the two second dummy patterns are spaced apart from each other by a second space.

5. The semiconductor device of claim 4, wherein the second space is less than the first space.

6. A semiconductor device, comprising:
a substrate including a cell array region and a peripheral region;
a gate stack provided on the cell array region of the substrate, the gate stack including a plurality of word lines which are arranged along a channel extending between at least two selection lines that are spaced apart from each other and at least one edge portion having a staircase structure;
a bit line provided on the gate stack and electrically connected to the channel;
at least one transistor provided on the peripheral region of the substrate and covered with an insulating layer; and
at least one pair of first dummy patterns provided between the gate stack and the at least one transistor and spaced apart from each other on the substrate,
wherein the at least one pair of first dummy patterns comprises a gate insulating layer on the substrate, a gate on the gate insulating layer, and a spacer on a side surface of the gate.

7. The semiconductor device of claim 6, wherein the substrate further comprises a cell end region comprising a portion of the cell array region and being connected to the peripheral region, and
the at least one pair of first dummy patterns are provided on the cell end region.

8. The semiconductor device of claim 6, further comprising at least one pair of second dummy patterns provided on the substrate and spaced apart from each other,
wherein a first space between the at least one pair of first dummy patterns is equal to or different from a second space between the at least one pair of second dummy patterns.

9. The semiconductor device of claim 8, wherein the at least one pair of first dummy patterns are disposed adjacent to the gate stack, the at least one pair of second dummy patterns are disposed adjacent to the at least one transistor, and the second space is less than the first space.

10. The semiconductor device of claim 6, further comprising a trench insulating layer in the substrate between the at least one pair of first dummy patterns.

11. A semiconductor device comprising:
a gate stack and a peripheral transistor on a substrate;
a first dummy pattern between the gate stack and the peripheral transistor on the substrate; and
a second dummy pattern disposed between the first dummy pattern and the peripheral transistor,
wherein the first dummy pattern is spaced apart from the gate stack and the peripheral transistor,
wherein the gate stack includes a staircase structure at one sidewall thereof adjacent to the first dummy pattern,
wherein the first dummy pattern includes at least two first key patterns spaced apart from each other by a first spacing, and
wherein the second dummy pattern includes at least two second key patterns spaced apart from each other by a second spacing that is less than the first spacing.

12. The semiconductor device of claim 11, wherein the substrate comprises:
a cell region on which the gate stack is provided;
a peripheral region on which the peripheral transistor is provided; and
a cell end region between the cell region and the peripheral region, the first dummy pattern being provided on the cell end region,
wherein the staircase structure of the gate stack has a downhill slope along a first direction toward the cell end region from the cell region.

13. The semiconductor device of claim 12, wherein the first dummy pattern extends along a second direction, the second direction crossing the first direction.

14. The semiconductor device of claim 13, wherein the cell region comprises at least one bit line electrically connected to the gate stack, and the at least one bit line extends along the second direction.

15. The semiconductor device of claim 11, wherein the at least two first key patterns comprise at least two dummy transistors, and the at least two dummy transistors extend parallel to each other.

16. The semiconductor device of claim 11, wherein the at least two first key patterns comprise at least two insulating blocks, and the at least two insulating blocks extend parallel to each other.

17. The semiconductor device of claim 11, wherein each of the at least two first key patterns comprises a gate insulating layer on the substrate, a gate on the gate insulating layer, and a spacer on a side surface of the gate.

18. The semiconductor device of claim 11, wherein each of the at least two first key patterns has substantially the same structure as the peripheral transistor.

19. The semiconductor device of claim 11, further comprising a trench insulating layer in the substrate between the at least two first key patterns.

20. The semiconductor device of claim 6, wherein each of the at least one pair of first dummy patterns has substantially the same structure as the at least one transistor provided on the peripheral region.

* * * * *